(12) United States Patent
Seger, Jr. et al.

(10) Patent No.: US 10,884,967 B2
(45) Date of Patent: Jan. 5, 2021

(54) LOW VOLTAGE DRIVE CIRCUIT WITH VARIABLE FREQUENCY CHARACTERISTICS AND METHODS FOR USE THEREWITH

(71) Applicant: SigmaSense, LLC., Wilmington, DE (US)

(72) Inventors: Richard Stuart Seger, Jr., Belton, TX (US); Daniel Keith Van Ostrand, Leander, TX (US); Gerald Dale Morrison, Redmond, WA (US); Timothy W. Markison, Mesa, AZ (US)

(73) Assignee: SigmaSense, LLC., Wilmington, DE (US)

( * ) Notice: Subject to any disclaimer, the term of this patent is extended or adjusted under 35 U.S.C. 154(b) by 0 days.

(21) Appl. No.: 16/885,675

(22) Filed: May 28, 2020

(65) Prior Publication Data

US 2020/0293482 A1    Sep. 17, 2020

Related U.S. Application Data

(63) Continuation-in-part of application No. 16/854,379, filed on Apr. 21, 2020, now Pat. No. 10,733,133, (Continued)

(51) Int. Cl.
*G06F 13/40* (2006.01)
*H04L 7/00* (2006.01)
(Continued)

(52) U.S. Cl.
CPC ............ *G06F 13/4072* (2013.01); *G05F 3/24* (2013.01); *H03M 1/12* (2013.01); *H04L 7/0008* (2013.01); *H04L 25/0282* (2013.01)

(58) Field of Classification Search
CPC .................................................. G06F 13/4072
(Continued)

(56) References Cited

U.S. PATENT DOCUMENTS 6,218,972 B1   4/2001   Groshong
6,665,013 B1   12/2003  Fossum et al.
(Continued)

OTHER PUBLICATIONS

Baker; How delta-sigma ADCs work, Part 1; Analog Applications Journal; Oct. 1, 2011; 6 pgs.
(Continued)

*Primary Examiner* — Tomi Skibinski
(74) *Attorney, Agent, or Firm* — Garlick & Markison; Bruce E. Stuckman

(57) ABSTRACT

A low voltage drive circuit includes a transmit digital to analog circuit that converts transmit digital data into analog outbound data by: generating a DC component; a first plurality of oscillations, wherein each oscillation of the first plurality of oscillations has first unique oscillation characteristics; selecting one of the first plurality of oscillations in accordance with a first portion of the transmit digital data to produce a first selected oscillation; generating a second plurality of oscillations, wherein each oscillation of the second plurality of oscillations has second unique oscillation characteristics; selecting one of the second plurality of oscillations in accordance with a second portion of the transmit digital data to produce a second selected oscillation, and outputting the first selected oscillation and the second selected oscillation on an n-bit-by-n-bit basis to produce an oscillating component, wherein the DC component is combined with the oscillating component to produce the analog outbound data. A drive sense circuit drives an analog transmit signal onto a bus, wherein the analog outbound data is represented within the analog transmit signal as variances in loading of the bus in a first frequency range and wherein
(Continued)

analog inbound data is represented within an analog receive signal as variances in loading of the bus in a second frequency range.

20 Claims, 34 Drawing Sheets

Related U.S. Application Data which is a continuation-in-part of application No. 16/246,772, filed on Jan. 14, 2019, now Pat. No. 10,684,977.

(51) Int. Cl.
*G05F 3/24* (2006.01)
*H04L 25/02* (2006.01)
*H03M 1/12* (2006.01)

(58) Field of Classification Search
USPC .................................. 327/108–112
See application file for complete search history.

(56) References Cited

U.S. PATENT DOCUMENTS

| | | | |
|---|---|---|---|
| 7,340,662 B1 * | 3/2008 | McElwee | G01R 31/3167 |
| | | | 714/733 |
| 7,528,755 B2 | 5/2009 | Hammerschmidt | |
| 8,031,094 B2 | 10/2011 | Hotelling | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,625,726 B2 | 1/2014 | Kuan et al. | |
| 9,201,547 B2 | 12/2015 | Elias | |
| 2004/0120405 A1 * | 6/2004 | Jaussi | H04L 25/0292 |
| | | | 375/257 |
| 2013/0278447 A1 | 10/2013 | Kremin | |
| 2016/0188049 A1 | 6/2016 | Yang et al. | |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

\* cited by examiner data communication system 10 data communication system 10

FIG. 3 computing device 12

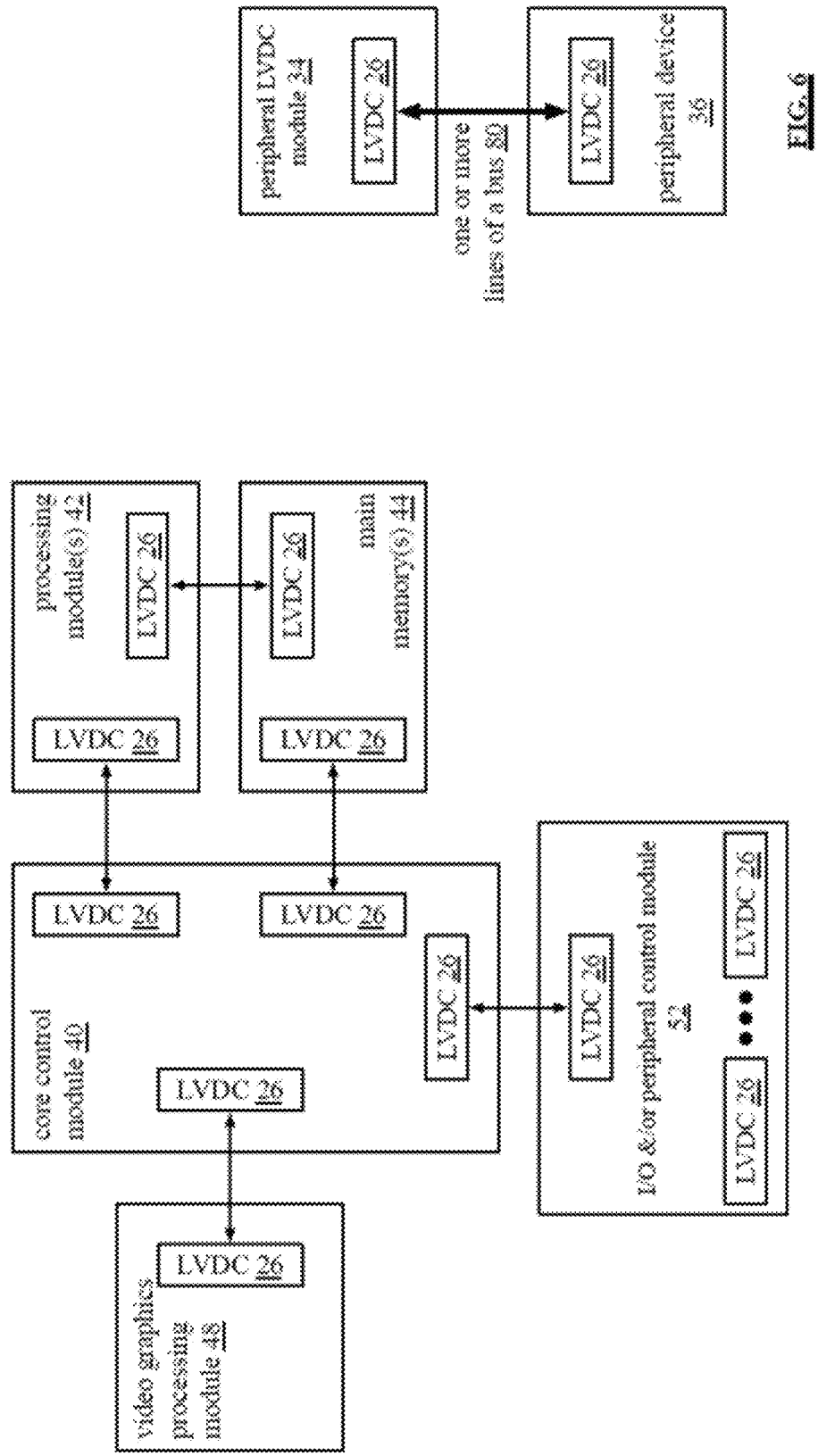

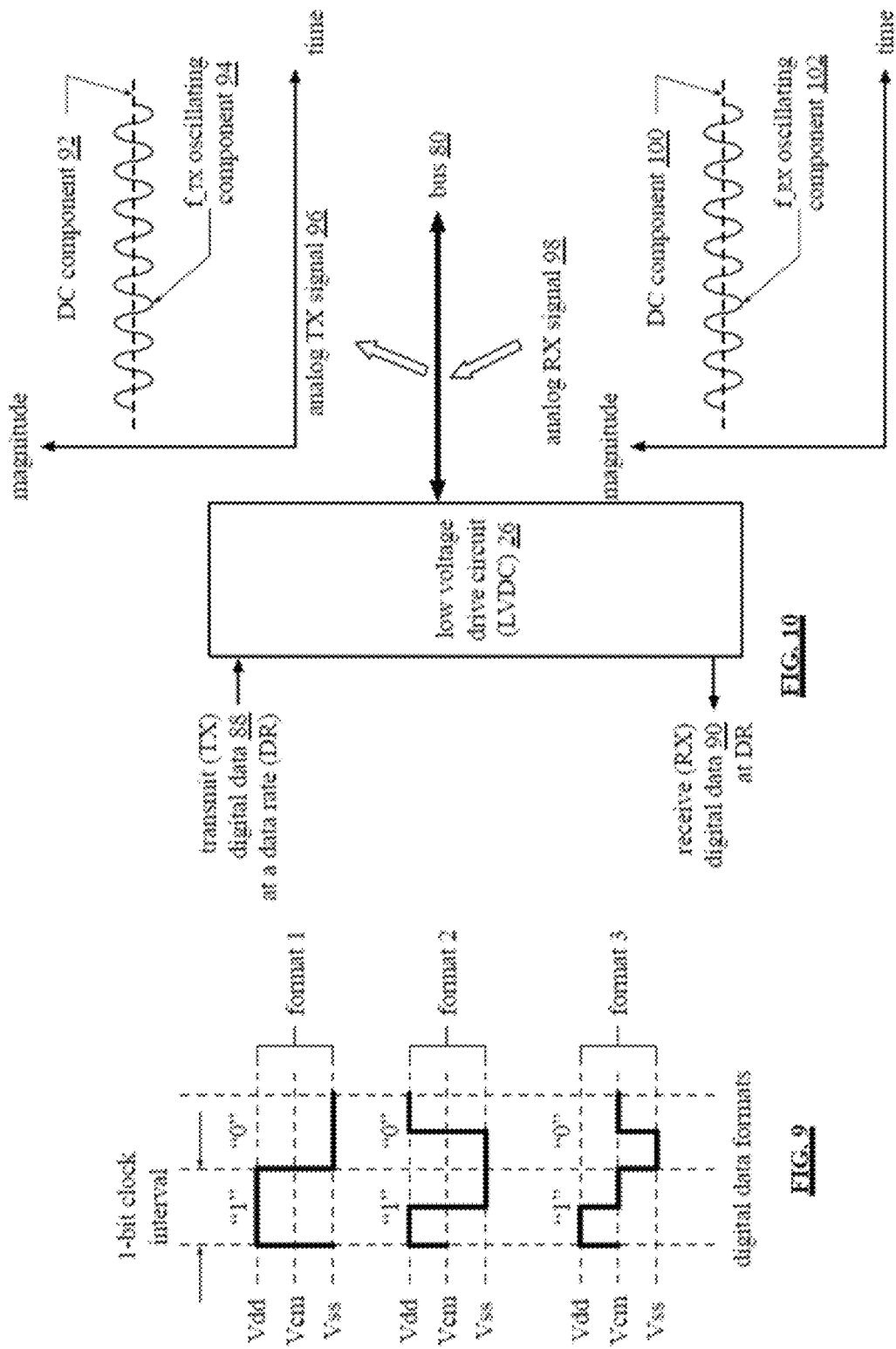

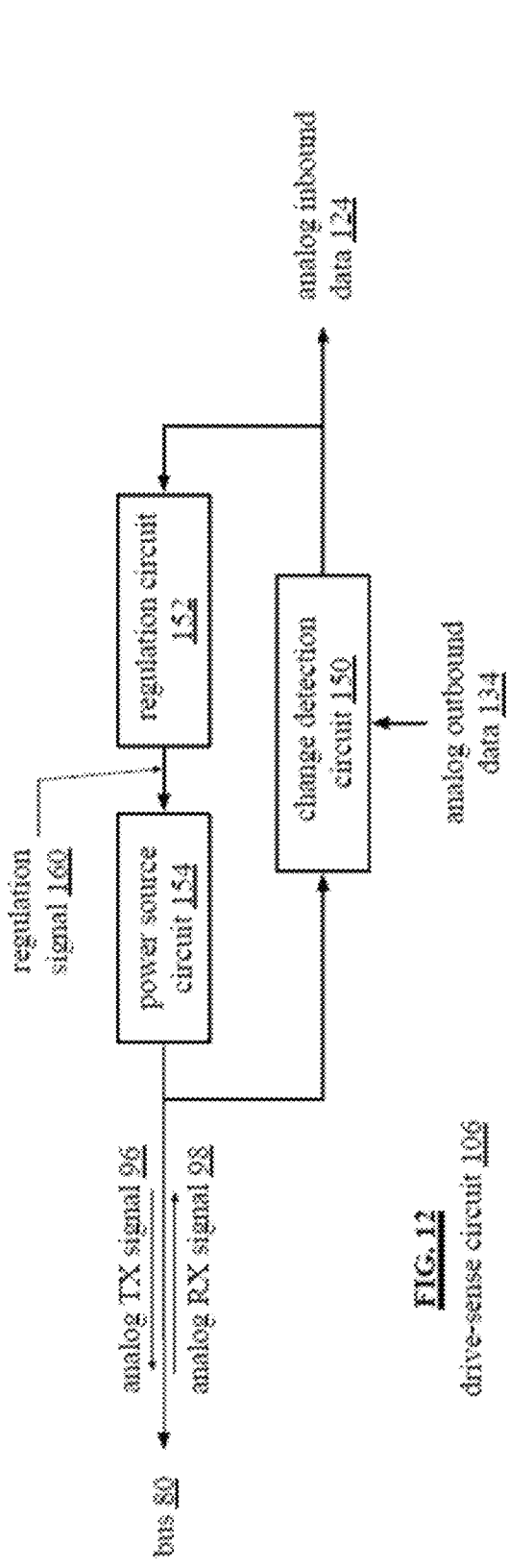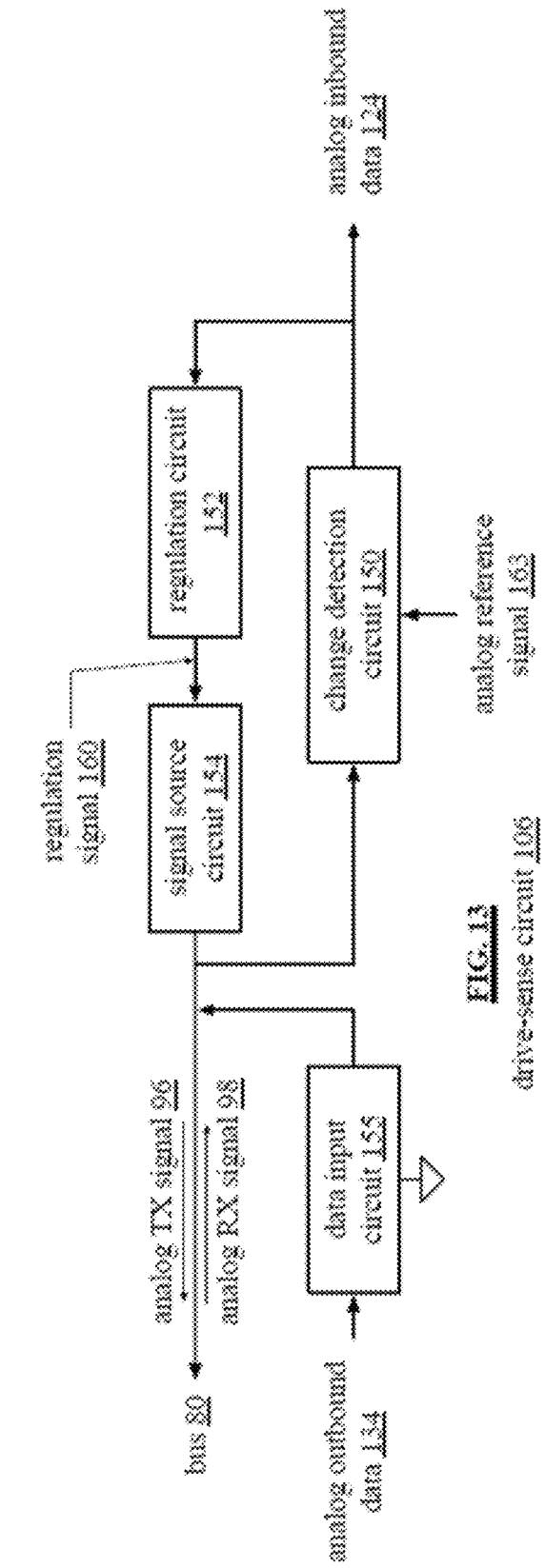

LVDC 26

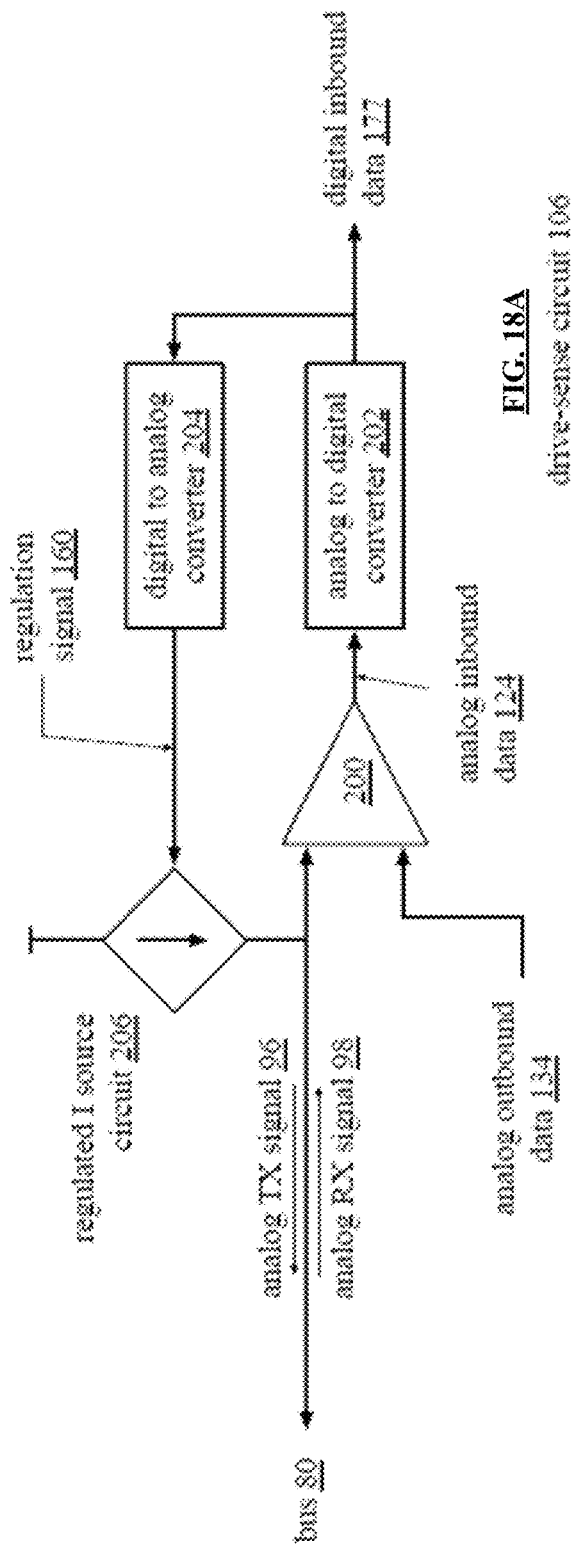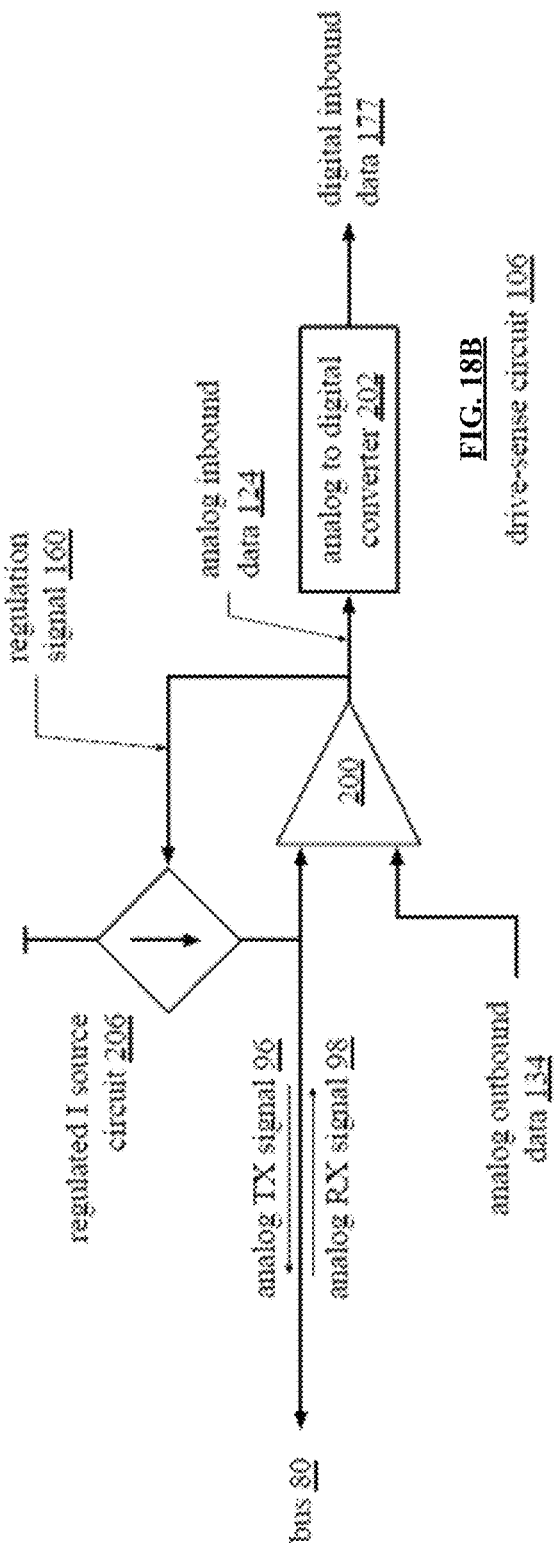

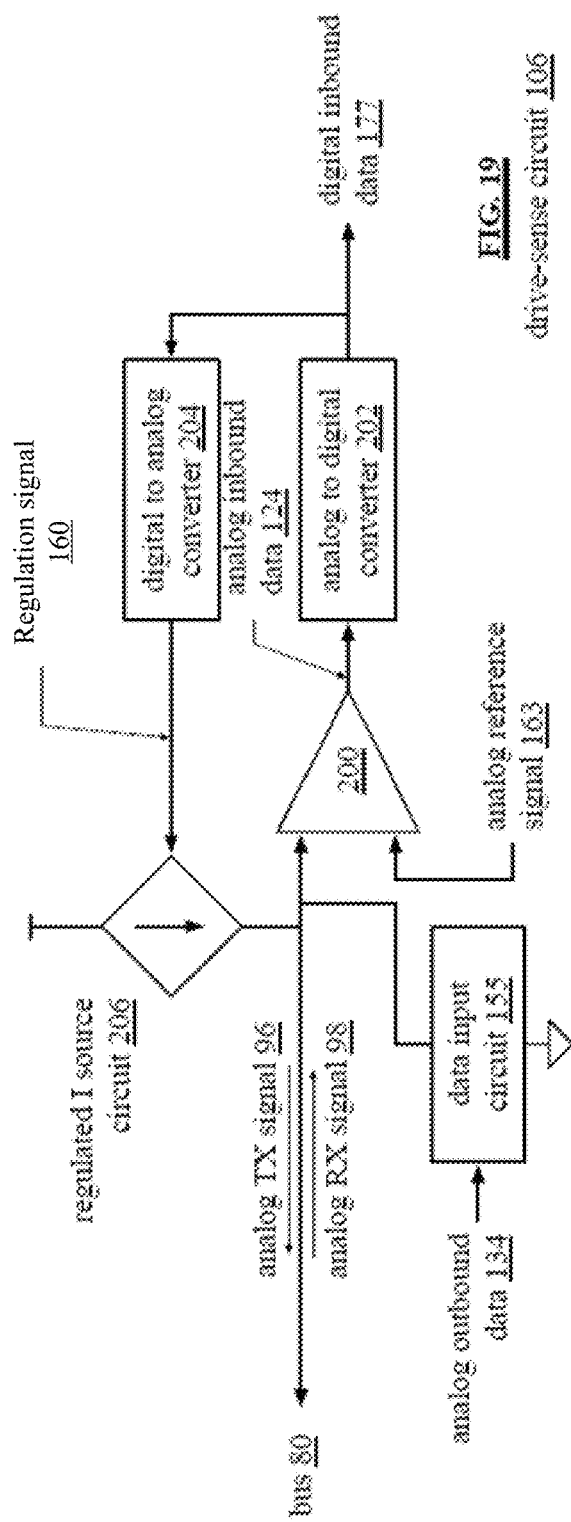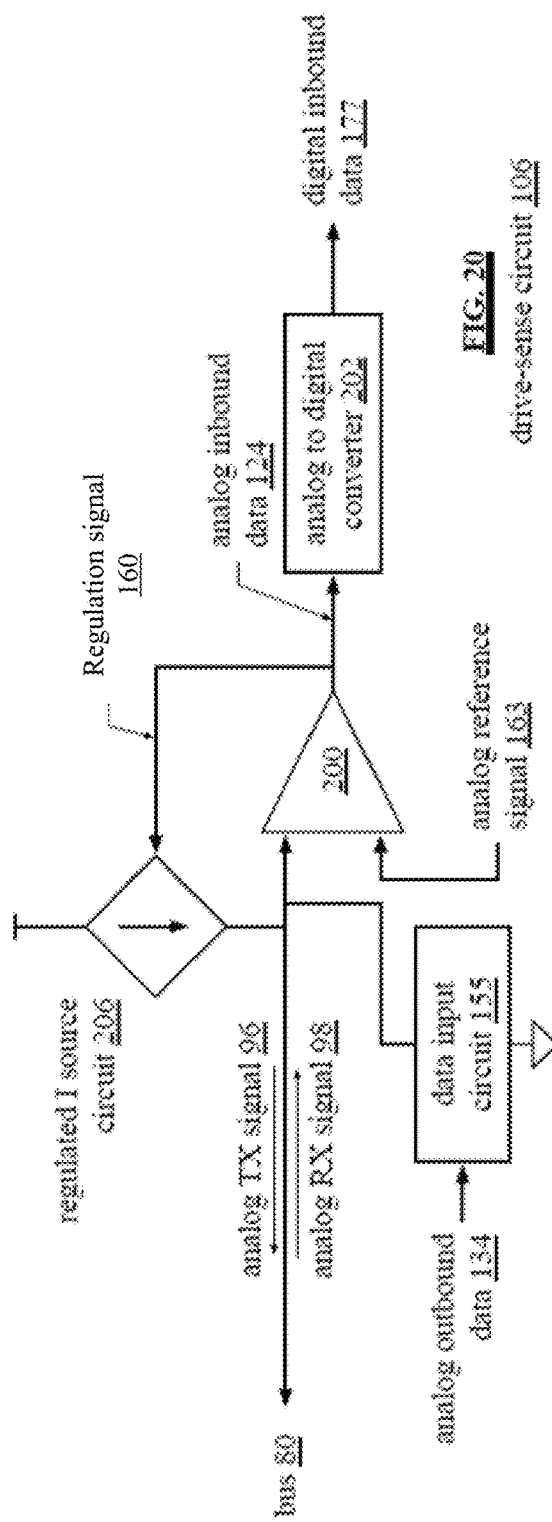

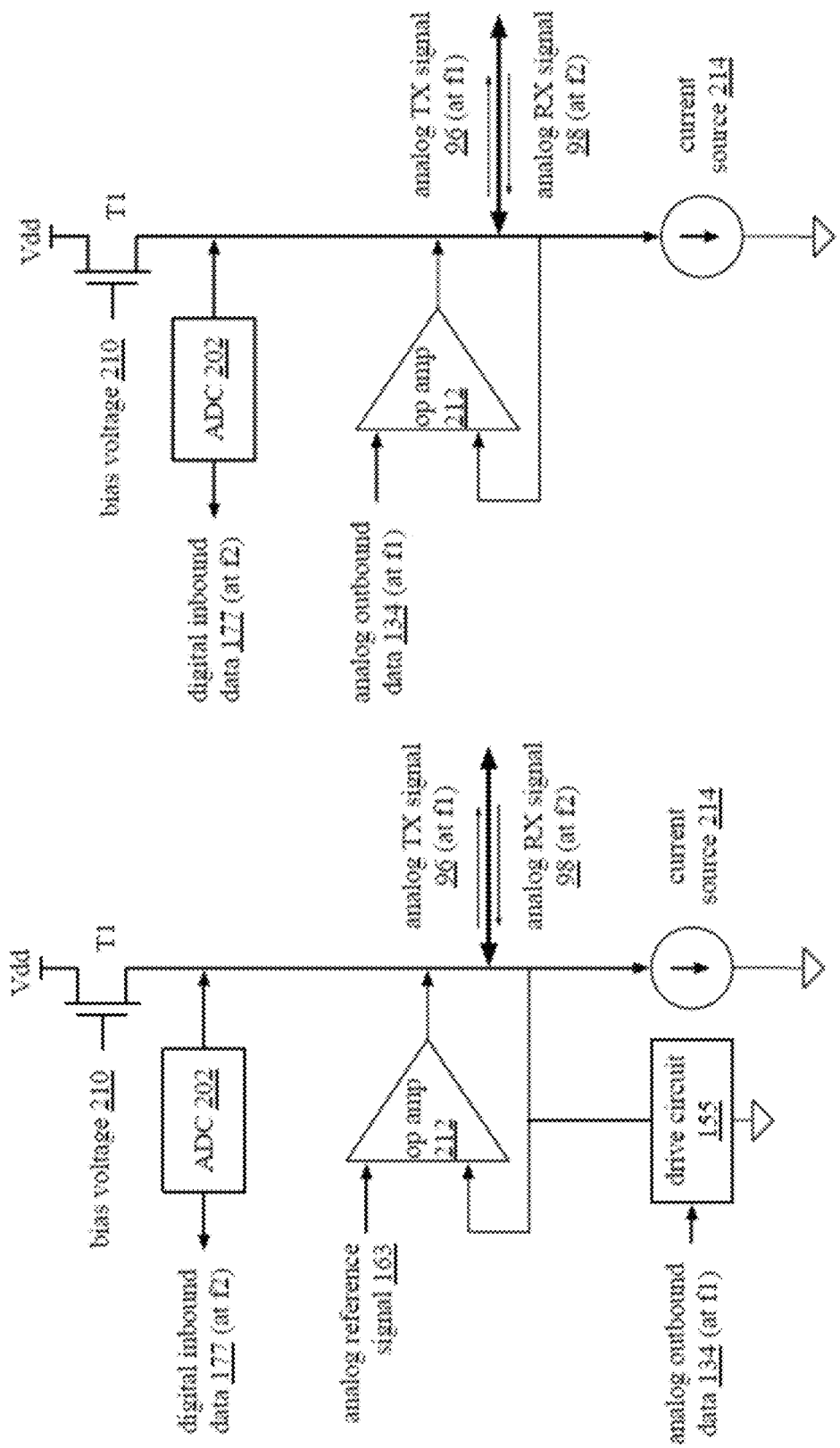

transmit side of LVDC 20 output limited DAC 232-2

US 10,884,967 B2

LOW VOLTAGE DRIVE CIRCUIT WITH VARIABLE FREQUENCY CHARACTERISTICS AND METHODS FOR USE THEREWITH

CROSS-REFERENCE TO RELATED APPLICATIONS

The present U.S. Utility Patent Application claims priority pursuant to 35 U.S.C. § 120 as a continuation-in-part of U.S. Utility application Ser. No. 16/854,379, entitled "LOW VOLTAGE DRIVE CIRCUIT WITH RANGE LIMITS AND METHODS FOR USE THEREWITH", filed Apr. 21, 2020, which is a continuation-in-part of U.S. Utility application Ser. No. 16/246,772, entitled "LOW VOLTAGE DRIVE CIRCUIT WITH BUS ISOLATION AND METHODS FOR USE THEREWITH", filed Jan. 14, 2019, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sending and receive data via a common bus.

Description of Related Art

Data communication involves sending data from one device to another device via a communication medium (e.g., a wire, a trace, a twisted pair, a coaxial cable, air). The devices range from dies within an integrated circuit (IC), to ICs on a printed circuit board (PCB), to PCBs within a computer, to computers, to networks of computers, and so on.

Data is communicated via a wired and/or a wireless connection and is done so in accordance with a data communication protocol. Data communication protocols dictate how the data is to be formatted, encoded/decoded, transmitted, and received. For example, a wireless data communication protocol such as IEEE 802.11 dictates how wireless communications are to be done via a wireless local area network. As another example, SPDIF dictates how digital audio signals are transmitted and received. As yet another example, I²C is a two-wire serial protocol to connect devices such as microcontrollers, digital to analog converters, analog to digital converters, peripheral devices to a computer, and so on.

In addition, data communication protocols dictate how transmission errors are to be handled. For example, wireless communications often experience data errors so the protocol dictates a form of forward error correction (e.g., Reed Solomon encoding, Turbo encoded, etc.) be used. As another example, wired communication experience much less data errors than wireless communications so the protocol dictates a form of feedback error correction (e.g., resend request, etc.) be used.

For some data communications, digital data is modulated with an analog carrier signal and transmitted/received via a modulated radio frequency (RF) signal. For other data communications, the digital data is transmitted "as is" via a wire or metal trace on a PCB. In a typical data communication protocol, digital data is in binary form where a logic "1" value is represented by a voltage that is at least 90% of the positive rail voltage and a logic "0" is represented by a voltage it is at most 10% of the negative rail voltage.

BRIEF DESCRIPTION OF THE SEVERAL VIEWS OF THE DRAWING(S)

FIG. 5 is a schematic block diagram of an embodiment of a computing core of a computing device in accordance with the present invention;

FIG. 6 is a schematic block diagram of an embodiment of a peripheral Low Voltage Drive Circuit (LVDC) module of a computing device coupled to a peripheral device in accordance with the present invention;

FIG. 9 is a schematic block diagram of examples of digital data formats;

FIG. 10 is a functional diagram of an embodiment of an LVDC in accordance with the present invention;

FIG. 12 is a schematic block diagram of an embodiment of a drive sense circuit of an LVDC coupled to a host device in accordance with the present invention;

FIG. 13 is a schematic block diagram of another embodiment of a drive sense circuit of an LVDC coupled to a host device in accordance with the present invention;

FIG. 18A is a schematic block diagram of an embodiment of a drive sense circuit of an LVDC in accordance with the present invention;

FIG. 18B is a schematic block diagram of an embodiment of a drive sense circuit of an LVDC in accordance with the present invention;

FIG. 19 is a schematic block diagram of an embodiment of a drive sense circuit of an LVDC in accordance with the present invention;

FIG. 20 is a schematic block diagram of an embodiment of a drive sense circuit of an LVDC in accordance with the present invention;

FIG. 21 is a schematic block diagram of an embodiment of a drive sense circuit of an LVDC in accordance with the present invention;

FIG. 22 is a schematic block diagram of an embodiment of a drive sense circuit of an LVDC in accordance with the present invention;

DETAILED DESCRIPTION OF THE INVENTION

Figure 1:
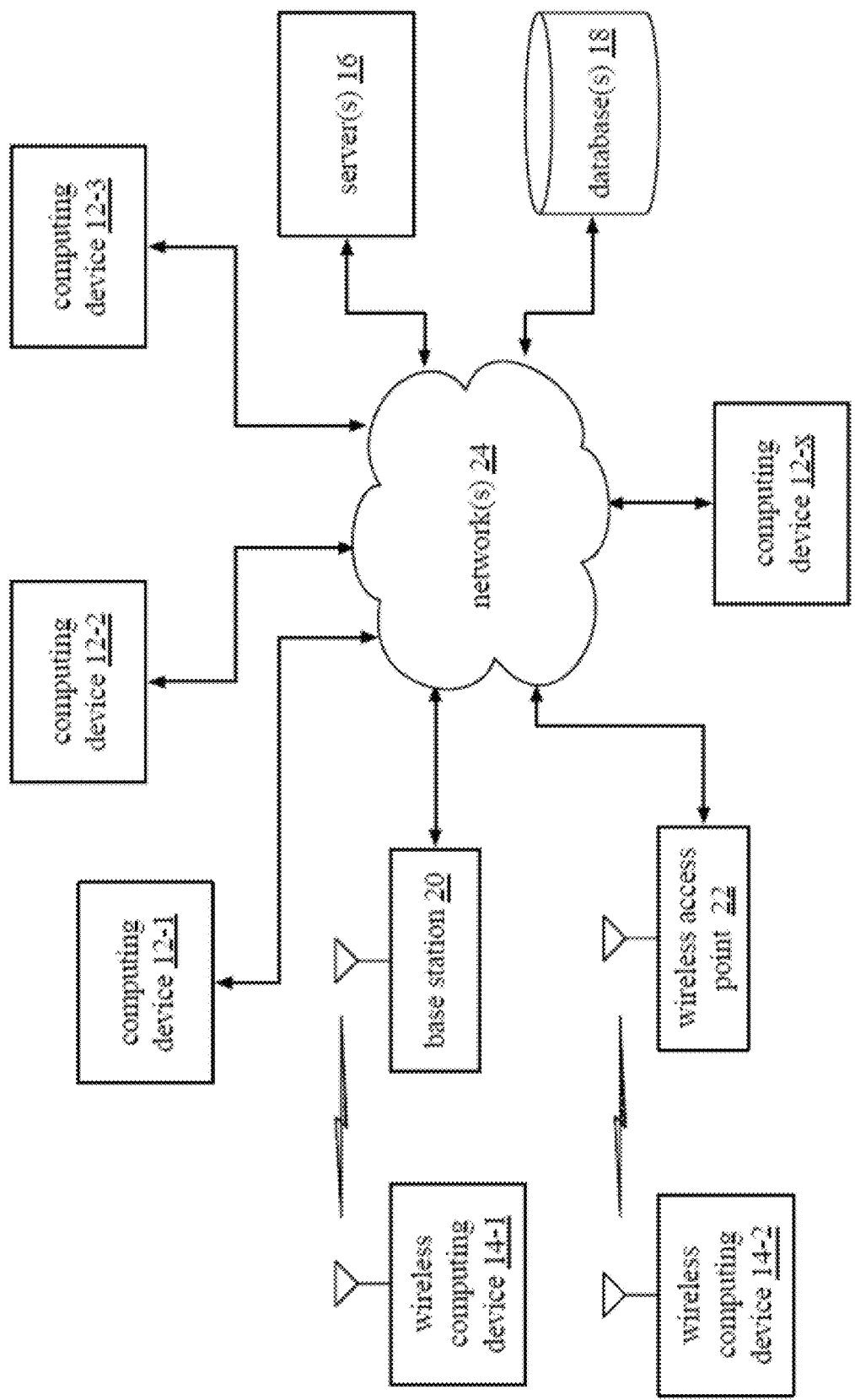
FIG. 1 is a schematic block diagram of an embodiment of a data communication system in accordance with the present invention.

FIG. 1 is a schematic block diagram of an embodiment of a data communication system 10 that includes a plurality of computing devices 12, a plurality of wireless computing devices 14, one or more servers 16, one or more databases 18, one or more networks 24, one or more base stations 20, and/or one or more wireless access points 22. Embodiments of computing devices 12 and 14 are similar in construct and/or functionality with a difference being the computing devices 12 couple to the network(s) 24 via a wired networked card and the wireless communication devices 14 coupled to the network(s) via a wireless connection. In an embodiment, a computing device can have both a wired network card and a wireless network card such that it is both computing devices 12 and 14.

A computing device 12 and/or 14 may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12 and 14 will be discussed in greater detail with reference to one or more of FIGS. 3-4.

A server 16 is a special type of computing device that is optimized for processing large amounts of data requests in parallel. A server 16 includes similar components to that of the computing devices 12 and/or 14 with more robust processing modules, more main memory, and/or more hard drive memory (e.g., solid state, hard drives, etc.). Further, a server 16 is typically accessed remotely; as such it does not generally include user input devices and/or user output devices. In addition, an embodiment of a server is a stand-alone separate computing device and/or may be a cloud computing device.

A database 18 is a special type of computing device that is optimized for large scale data storage and retrieval. A database 18 includes similar components to that of the computing devices 12 and/or 14 with more hard drive memory (e.g., solid state, hard drives, etc.) and potentially with more processing modules and/or main memory. Further, a database 18 is typically accessed remotely; as such it does not generally include user input devices and/or user output devices. In addition, an embodiment of a database 18 is a standalone separate computing device and/or may be a cloud computing device.

The network(s) 24 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN is a personal home or business's wireless network and a WAN is the Internet, cellular telephone infrastructure, and/or satellite communication infrastructure.

The computing devices 12, the wireless communication devices 14, the server 16, the database 18, the base station 20, and/or the wireless access point 22 include one or more low voltage drive circuits (LVDC) for communicating data via a line of a bus (e.g., a bus includes one or more lines, each line is a wired connection, a wire, a trace on a PCB, etc.). The data communication is between devices and/or is within a device. For example, two computing devices communicate with each other via their respective LVDCs. As another example, components within a computing device have associated LVDCs and the components communicate data via the LVDCs.

Figure 2:
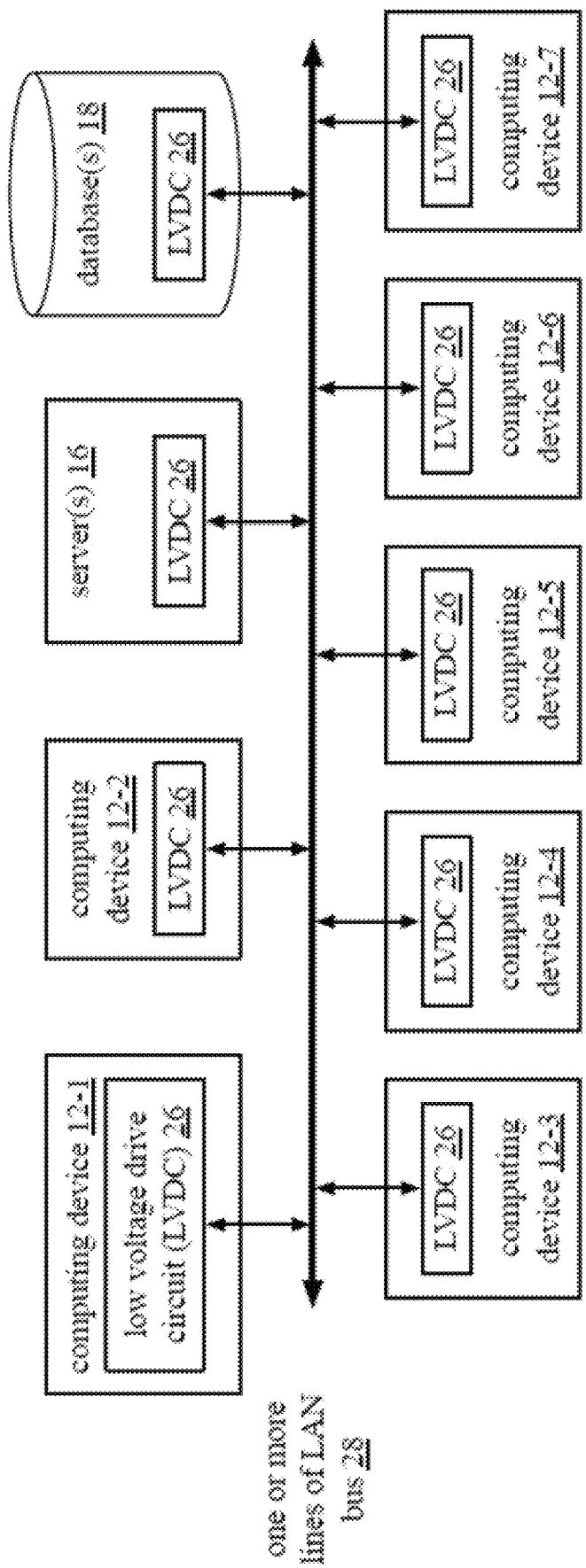
FIG. 2 is a schematic block diagram of another embodiment of a data communication system in accordance with the present invention.

FIG. 2 is a schematic block diagram of another embodiment of a data communication system 10 that includes the computing devices 12, the server 16, and the database 18 coupled to one or more lines of a LAN bus. Each device 12, 16, and 18 includes one or more LVDCs 26 for communicating data via the line of the LAN bus 28.

An LVDC 26 functions to convert transmit digital data from its host device into an analog transmit signal. As an example, a host device is a computing device, a server, or a database. As another example, a host device is an interface of one the computing device, the server, or the database. As yet another example, a host device is an integrated circuit of the computing device, the server, or the database. As further example, a host device is a die of an integrated circuit.

The LVDC 26 produces the analog transmit signal to have an oscillating component at a given frequency that represents the transmit digital data and to have a very low magnitude. For example, the magnitude of the oscillating component is between five percent and 75 percent of the rail to rail voltage (or current) of the LVDC (e.g., Vdd-Vss of the LVDC). By keeping the magnitude of the oscillating component very low with respect to the rail to rail voltage (or current), data is transmitted with very low power and very good noise immunity. As a specific example, if the voltage magnitude of the oscillating component is 25 mV (millivolts) and the current is 0.1 mA (milli-amps), then the power is 2.5 µW (micro-watts).

The LVDC 26 also functions to convert an analog receive signal into received digital data that is provided to its host. The analog receive signal is an analog transmit signal from another LVDC of the same host or a different host and is received from the same line of the bus as which the LVDC transmits its analog transmit signal. For an LVDC, the analog receive signal is at the same frequency as its analog transmit signal for half duplex communication and is at a different frequency of full duplex communication.

An LVDC 26 is capable of communicating data with one or more other LVDCs using a plurality of frequencies. Each frequency supports a conveyance of data. For example, the transmit digital data can be divided up into data streams, where each data stream is transmitted on a different frequency of the analog transmit signal. This increases the data rate per line of the bus with very little increase in power. One or more other LVDCs can receive the multiple frequencies of the analog transmit signal, recover the data streams, and recover the transmitted digital data.

Figure 3:
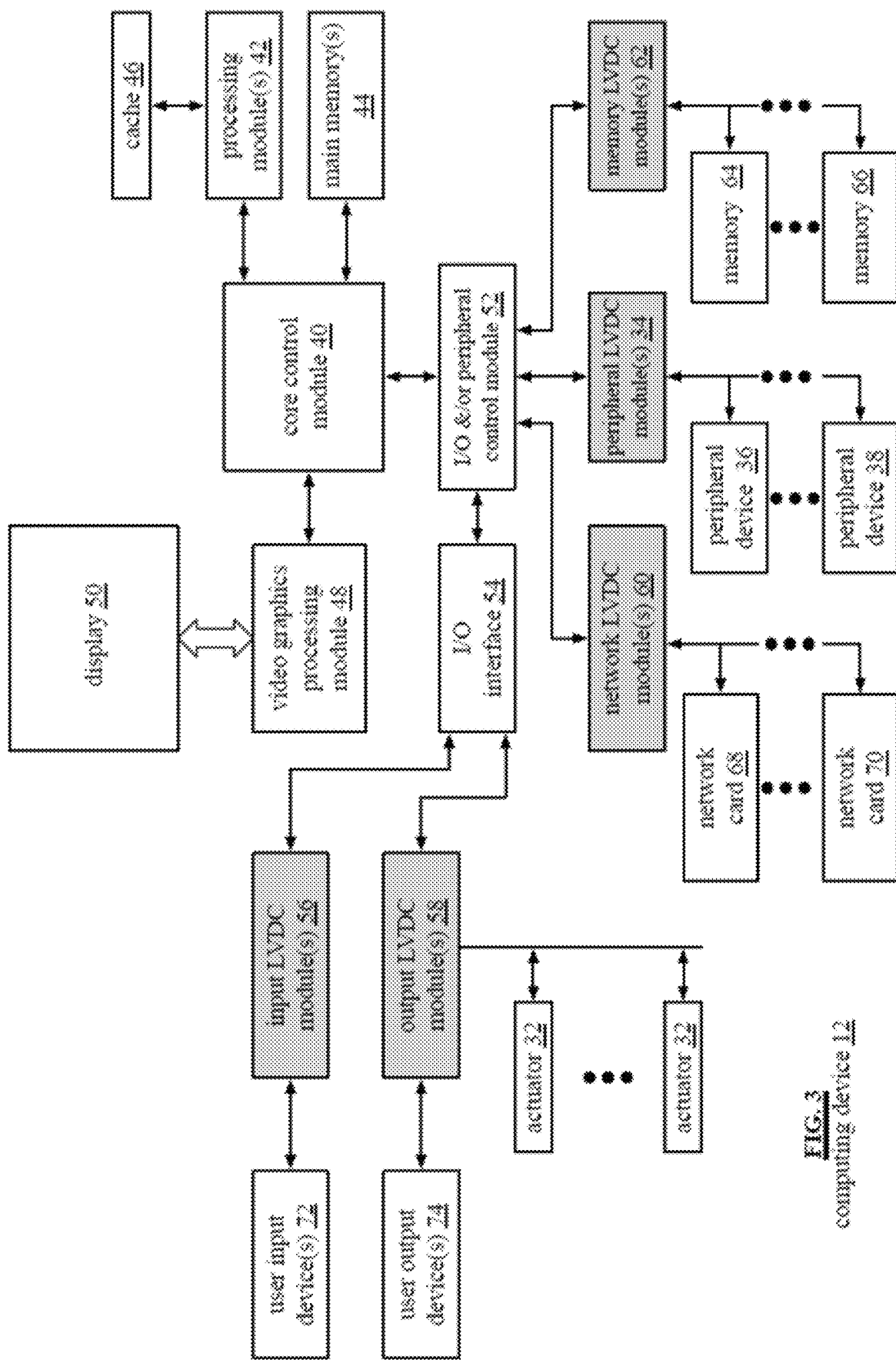
FIG. 3 is a schematic block diagram of an embodiment of a computing device in accordance with the present invention.

FIG. 3 is a schematic block diagram of an embodiment of a computing device 12 that includes a core control module 40, one or more processing modules 42, one or more main memories 44 (e.g., volatile memory), cache memory 46, a video graphics processing module 48, a display 50, an Input-Output (I/O) peripheral control module 52, one or more input LVDC modules 56, one or more output LVDC modules 58, one or more network LVDC modules 60, one or more peripheral LVDC modules 34, and one or more memory LVDC modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 (i.e., non-volatile memory) includes one or more hard drives, one or more solid state memory chips, and/or one or more other large capacity storage devices that, in comparison to cache memory and main memory devices, is/are relatively inexpensive with respect to cost per amount of data stored. The memory 64-66, which includes an LVDC, is coupled to the core control module 40 via the I/O and/or peripheral control module 52 and via one or more memory LVDC modules 62. In an embodiment, the I/O and/or peripheral control module 52 includes one or more Peripheral Component Interface (PCI) buses to which peripheral components connect to the core control module 40. A memory LVDC module 62 includes a software driver and hardware as discussed in one or more subsequent figures.

The core control module 40 coordinates data communications between the processing module(s) 42 and the network(s) 24 via the I/O and/or peripheral control module 52, the network LVDC module(s) 60, and a network card 68 or 70. A network card 68 or 70 includes an LVDC and a wired communication unit. A wired communication unit includes a Gigabit LAN connection, a Firewire connection, and/or a proprietary computer wired connection. A network LVDC module 60 includes a software driver and hardware as discussed in one or more subsequent figures.

The core control module 40 coordinates data communications between the processing module(s) 42 and input device(s) 72 via the input LVDC module(s) 56 and the I/O and/or peripheral control module 52. An input device 72 includes an LVDC and further includes one or more of a keypad, a keyboard, control switches, a touchpad, a microphone, a camera, etc. An input LVDC module 56 includes a software driver and hardware as discussed in one or more subsequent figures.

The core control module 40 coordinates data communications between the processing module(s) 42 and output device(s) 74 via the output LVDC module(s) 58 and the I/O and/or peripheral control module 52. An output device 74 includes an LVDC and a speaker, a tactile actuator, etc. An output LVDC module 58 includes a software driver and hardware as discussed in one or more subsequent figures.

The core control module 40 coordinates data communications between the processing module(s) 42 and peripheral devices 36 and 38 via the I/O and/or peripheral control module 52 and the peripheral LVDC module(s) 34. A peripheral device 36 or 38 includes an external hard drive, a headset, a speaker, a microphone, a thumb drive, a camera, etc. A peripheral LVDC module 34 includes a software driver and hardware as discussed in one or more subsequent figures.

The core control module 40 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50. While not shown, the computing device 12 further includes a BIOS (Basic Input Output System) memory coupled to the core control module 40.

Figure 4:
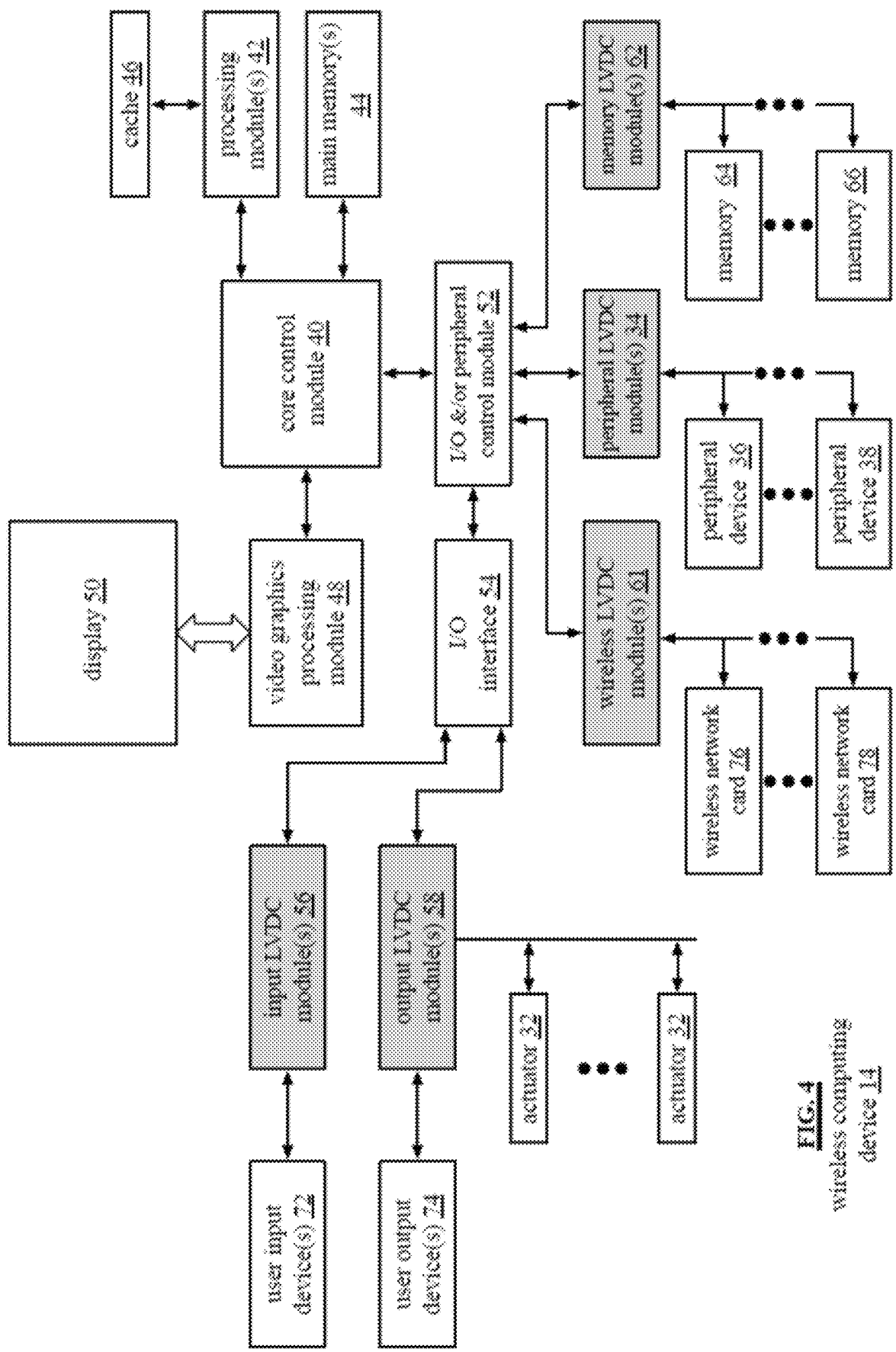
FIG. 4 is a schematic block diagram of an embodiment of a wireless computing device in accordance with the present invention.

FIG. 4 is a schematic block diagram of an embodiment of a wireless computing device 14 that includes a core control module 40, one or more processing modules 42, one or more main memories 44 (e.g., volatile memory), cache memory 46, a video graphics processing module 48, a display 50, an Input-Output (I/O) peripheral control module 52, one or more input LVDC modules 56, one or more output LVDC modules 58, one or more wireless network LVDC modules 61, and one or more memory LVDC modules 62. The common components of the wireless computing device 14 and the computing device 12 function as discussed with reference to FIG. 3. In this embodiment, communication with the network 24 is done wirelessly.

In particular, the core control module 40 coordinates data communications between the processing module(s) 42 and network(s) 24 wirelessly via the I/O and/or peripheral control module 52, the wireless network LVDC module(s) 61, and a wireless network card 76 or 78. A wireless network card 76 or 78 includes an LVDC and a wireless communication unit. A wireless communication unit includes a wireless local area network (WLAN) communication device, a cellular communication device, a Bluetooth device, and/or a ZigBee communication device. A wireless network interface module 61 includes a software driver and hardware as discussed in one or more subsequent figures.

FIG. 5 is a schematic block diagram of an embodiment of a computing core of a computing device 12 or 14. The computing core includes the core control module 40, the processing module(s) 42, the main memory 44, the video graphics processing module 48, and the IO and/or peripheral control module 52. These components are generally implemented as integrated circuits (ICs) and mounted on a mother board. The mother board includes traces that form buses for data to be communicated between the components.

In this embodiment, the data communication between components 40-52 is done via Low Voltage Drive Circuits (LVDCs). Each component 40-52 includes one or more LVDCs for communicating with one or more other components. For example, the core control module 40 includes four LVDC: A first for one-to-one communication with the processing module 42; a second for one-to-one communication with the main memory 44; a third for one-to-one communication with the video graphics processing module 48; and a fourth for one-to-one communication with the IO and peripheral control module 52.

In this embodiment, the core control module 40 is coupled to the processing module 42 via a single trace for data communication there-between. The core control module 40 is also coupled, via a single trace, to the main memory 44, the video graphics processing module 48, and to the IO and peripheral control module 52. Similarly, the processing module 42 is coupled to the main memory via a single trace. In this manner, the number of traces on the mother board is substantially reduced in comparison to mother boards that use conventional data communication between the components. In addition, the power to convey data is substantially reduced in the present embodiment in comparison to a mother boards that use conventional data communication.

In an alternate embodiment, each of the core control module 40, the processing module(s) 42, the main memory 44, the video graphics processing module 48, and the IO and/or peripheral control module 52 includes one LVDC that is coupled to one or more lines of a bus. In an example, the control controller 40 communicates with the processing module 42 using a first set of channels of a frequency band; communicates with main memory 44 using a second set of channels of the frequency band; communicates with the video graphics processing module 48 using a third set of channels of the frequency band; and communicates with the IO and peripheral control module 52 using a fourth set of channels of the frequency band. As an example, the frequency band ranges from 1.000 GHz to 1.100 GHz with channels at frequencies every 10 MHz. As such, there are 11 channels: the first at 1.000 GHz, the second at 1.010 GHz, and so on through the eleventh at 1.100 GHz. A specific channel includes at least one sinusoidal signal at a particular frequency within the frequency band that conveys data via amplitude shift keying, phase shift keying, frequency shift keying, quadrature amplitude modulation, quadrature phase shift keying, another modulation technique and/or a combination thereof.

In another example of alternative embodiment, the channels are allocated to the components on an as needed basis. For example, when the main memory has data to write to memory device(s) via the IO and/or peripheral control module 52, one or more channels are allocated for this communication. When the data has been conveyed, the allocated channels are released for reallocation to another communication.

FIG. 6 is a schematic block diagram of an embodiment of a peripheral Low Voltage Drive Circuit (LVDC) module 34 of a computing device 12 coupled to a peripheral device 36 via LVDCs 26. The LVDCs are coupled together via one or more lines of a bus 80. The devices communicate data in a full duplex mode per line using multiple channels or in a half duplex mode per line using a single channel. For example, the LVDC of peripheral LVDC module 34 uses channels 1-3 (e.g., frequencies 1-3 of the frequency band) to transmit data to the LVDC of the peripheral device 36. In addition, the LVDC of the peripheral device 36 uses channels 4-6 (e.g., frequencies 4-6 of the frequency band) to transmit data to the LVDC of peripheral LVDC module 34.

Figure 7:
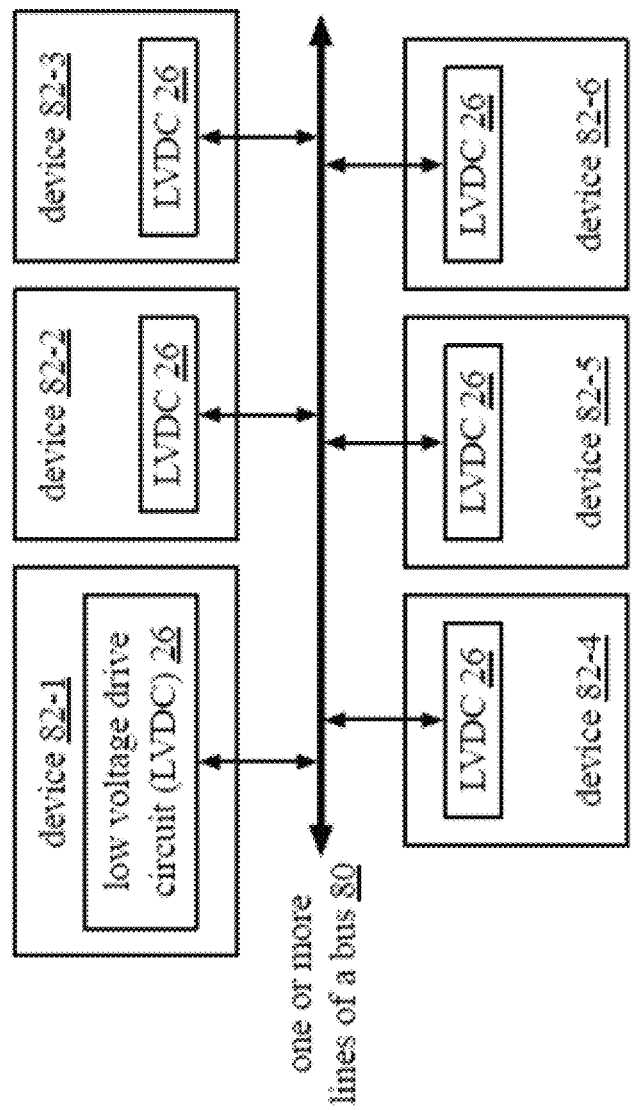
FIG. 7 is a schematic block diagram of another embodiment of a data communication system in accordance with the present invention.

FIG. 7 is a schematic block diagram of another embodiment of a data communication system that includes a plurality of devices 82-1 through 82-6. Each of the devices includes a Low Voltage Drive Circuit (LVDC) 26 coupled to one or more lines of a bus 80. The devices are one or more devices from a list that includes a die of an integrated circuit (IC), an integrated circuit (IC), a printed circuit board with components mounted thereon, a sub-system of a plurality of printed circuit boards.

The devices communicate with each other via their respective LVDCs and the one or more lines of the bus. For each line of the bus, the LVCDs are assigned (e.g., permanently, on an as needed basis, etc.) channels to transmit data to one or more other devices. An LVCD of a device is tuned to the channel(s) of another device to receive the data transmissions from the other device.

Figure 8:
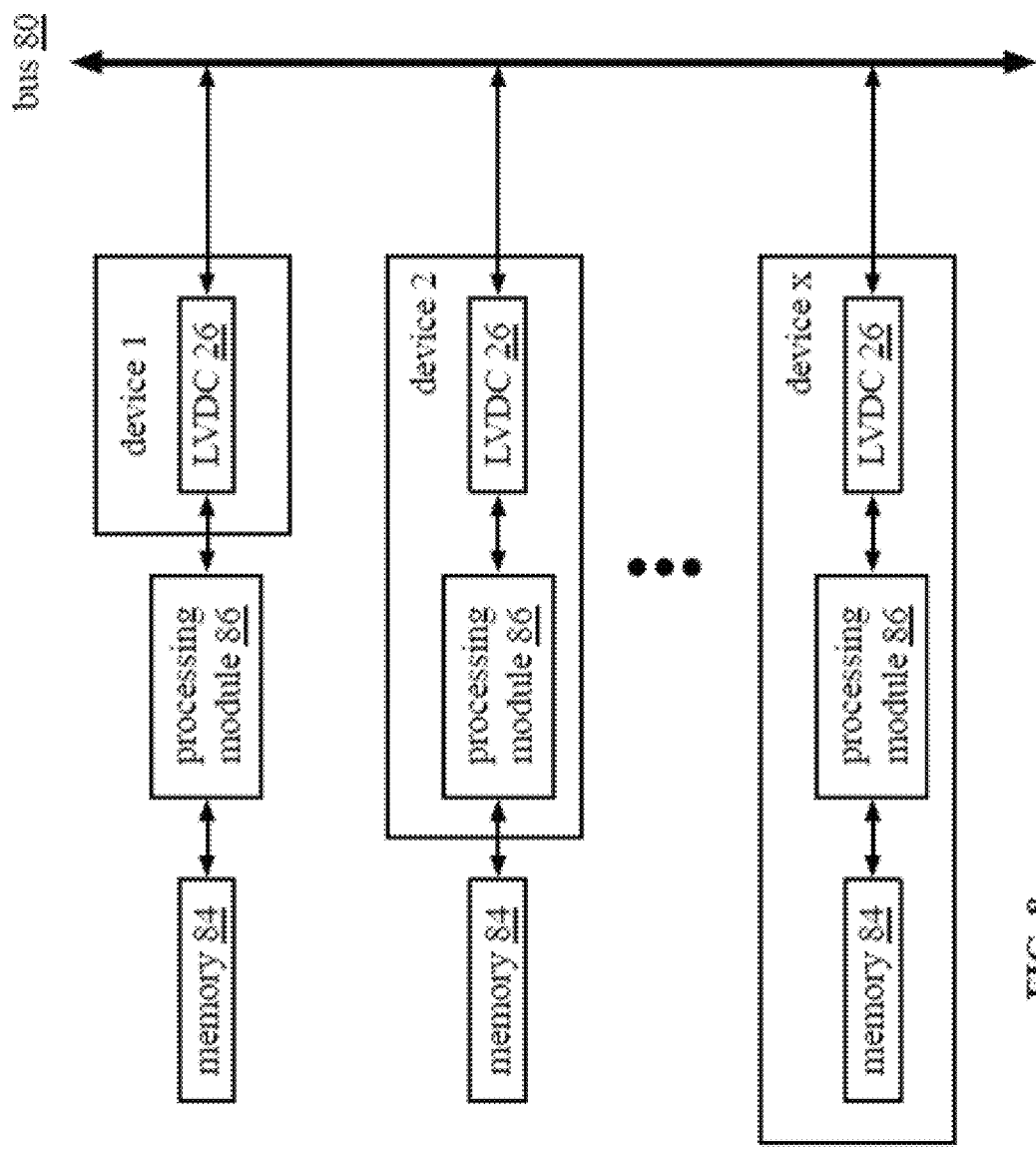
FIG. 8 is a schematic block diagram of another embodiment of a data communication system in accordance with the present invention.

FIG. 8 is a schematic block diagram of another embodiment of a data communication system that includes a plurality of devices 1-x. Each of the devices includes a Low Voltage Drive Circuit (LVDC) 26 coupled to one or more lines of a bus 80. The types of devices vary. For example, device 1 is an interface device that includes a limited amount of additional circuitry beyond the LVDC 26. In particular, device 1 does not include a processing module 86 or memory 84 (e.g., volatile or non-volatile memory). Device 1 is coupled to the processing module 86 of a next level higher component of a computing device. The processing module 86 coupled to device 1 is also coupled to memory 84.

Device 2 includes the LVDC and the processing module 86. The memory 84, however, is associated with the next higher component of the computing device. Device x includes the LVDC, the processing module 86, and the memory 84. As an example, the bus 84 is a backplane of server; device 1 is an interface for a thumb drive; device 2 is a video graphics card, and device x is a mother board. Regardless of the specific implementation of a device including an LVDC, a driver for the LVDC is stored in the memory 84.

FIG. 9 is a schematic block diagram of examples of digital data formats. As known, digital data is a string of binary values. A binary value is either a logic "1" or a logic "0". One binary value corresponds to a bit of the digital data. How the bits are organized into data words establishing the meaning for of the data words. For example, American Standard Code for Information Interchange (ASCII) defines characters using 8-bits of data. For example, a capital "A" is represented as the binary value of 0100 0001 and a lower case "a" is represented as the binary value of 0110 0001.

A binary value can be expressed in a variety of forms. In a first example format, a logic "1" is expressed as a positive rail voltage for the duration of a 1-bit clock interval and logic "0" is expressed as a negative rail voltage for the duration of the 1-bit clock interval; or vice versa. The positive rail voltage refers to a positive supply voltage (e.g., Vdd) that is provided a digital circuit (e.g., a circuit that processes and/or communicates digital data as binary values), the negative rail voltage refers to a negative supply voltage or ground (e.g., Vss) that is provided to the digital circuit, and the common mode voltage (e.g., Vcm) is half way between Vdd and Vss. The 1-bit clock interval corresponds to the inverse of a 1-bit data rate. For example, if the 1-bit data rate is 1 Giga-bit per second (Gbps), then the 1-bit clock interval is 1 nano-second).

In a second example format, a logic "1" is expressed as a non-return to zero waveform that, for the first half of the 1-bit interval, is at the positive rail voltage (Vdd) and for the second half of the 1-bit interval is at the negative rail voltage (Vss). A logic "0" is expressed as a non-return to zero waveform that, for the first half of the 1-bit interval, is at the negative rail voltage (Vss) and for the second half of the 1-bit interval is at the positive rail voltage (Vdd). Alternatively, a logic "0" is expressed as a non-return to zero waveform that, for the first half of the 1-bit interval, is at the positive rail voltage (Vdd) and for the second half of the 1-bit interval is at the negative rail voltage (Vss). A logic "1" is expressed as a non-return to zero waveform that, for the first half of the 1-bit interval, is at the negative rail voltage (Vss) and for the second half of the 1-bit interval is at the positive rail voltage (Vdd).

In a third example format, a logic "1" is expressed as a return to zero waveform that, for the first half of the 1-bit interval, is at the positive rail voltage (Vdd) and for the second half of the 1-bit interval is at the common mode voltage (Vcm). A logic "0" is expressed as a return to zero waveform that, for the first half of the 1-bit interval, is at the negative rail voltage (Vss) and for the second half of the 1-bit interval is at the common mode voltage (Vcm). Alternatively, a logic "0" is expressed as a return to zero waveform that, for the first half of the 1-bit interval, is at the positive rail voltage (Vdd) and for the second half of the 1-bit interval is at the common mode voltage (Vcm). A logic "1" is expressed as a return to zero waveform that, for the first half of the 1-bit interval, is at the negative rail voltage (Vss) and for the second half of the 1-bit interval is at the common mode voltage (Vcm).

With any of the digital data formats, a logic value needs to be within 10% of a respective rail voltage to be considered in a steady data binary condition. For example, for format 1, a logic 1 is not assured until the voltage is at least 90% of the positive rail voltage (Vdd). As another example, for format 1, a logic 0 is not assured until the voltage is at most 10% of the negative rail voltage (Vss).

FIG. 10 is a functional diagram of an embodiment of a Low Voltage Drive Circuit (LVDC) 26. In general, the LVDC 26 functions to convert transmit (TX) digital data 88 into an analog transmit signal 96 and to convert an analog receive signal 98 into receive (RX) digital data 90. The LVDC 26 receives the transmit digital data 88 from its host device and transmits the analog TX signal 96 to another LVDC coupled to the line of the bus 80. The analog transmit signal 96 includes a DC component 92 and an oscillating component 94. The oscillating component 94 includes data encoded into one or more channels of a frequency band and has a very low magnitude (e.g., 5% to 75% of the rail to rail voltage and/or current powering the LVDC and/or the host device). This allows for low power high data rate communications in comparison to conventional low voltage signaling protocols.

As an example, the transmit digital data is encoded into one channel, as such the oscillating component include one frequency: the one corresponding to the channel. As another example, the transmit digital data is divided into x number of data streams. The LVDC encoded the x number of data streams on to x number of channels. Thus, the oscillating component 94 includes x number of frequencies corresponding to the x number of channels in transmit range of frequencies. Furthermore, while shown as a simple sinusoid for the purposes of illustration, the oscillating component 94 conveys data via amplitude shift keying, phase shift keying, frequency shift keying, quadrature amplitude modulation, quadrature phase shift keying, another modulation technique and/or a combination thereof.

The LVDC 26 receives the analog receive signal 98 from another LVDC (e.g., the one it sent its analog TX signal to and/or another LVDC coupled to the line of the bus 80). The analog receive signal 98 includes a DC component 100 and a receive oscillating component 102. The receive oscillating component 102 includes data encoded into one or more channels of a frequency band by the other LVDC and has a very low magnitude. The LVDC converts the analog receive signal 98 into the receive digital data 90, which its provides to its host device. Furthermore, while shown as a simple sinusoid for the purposes of illustration, the oscillating component 104 conveys data via amplitude shift keying, phase shift keying, frequency shift keying, quadrature amplitude modulation, quadrature phase shift keying, another modulation technique and/or a combination thereof.

Figure 11:
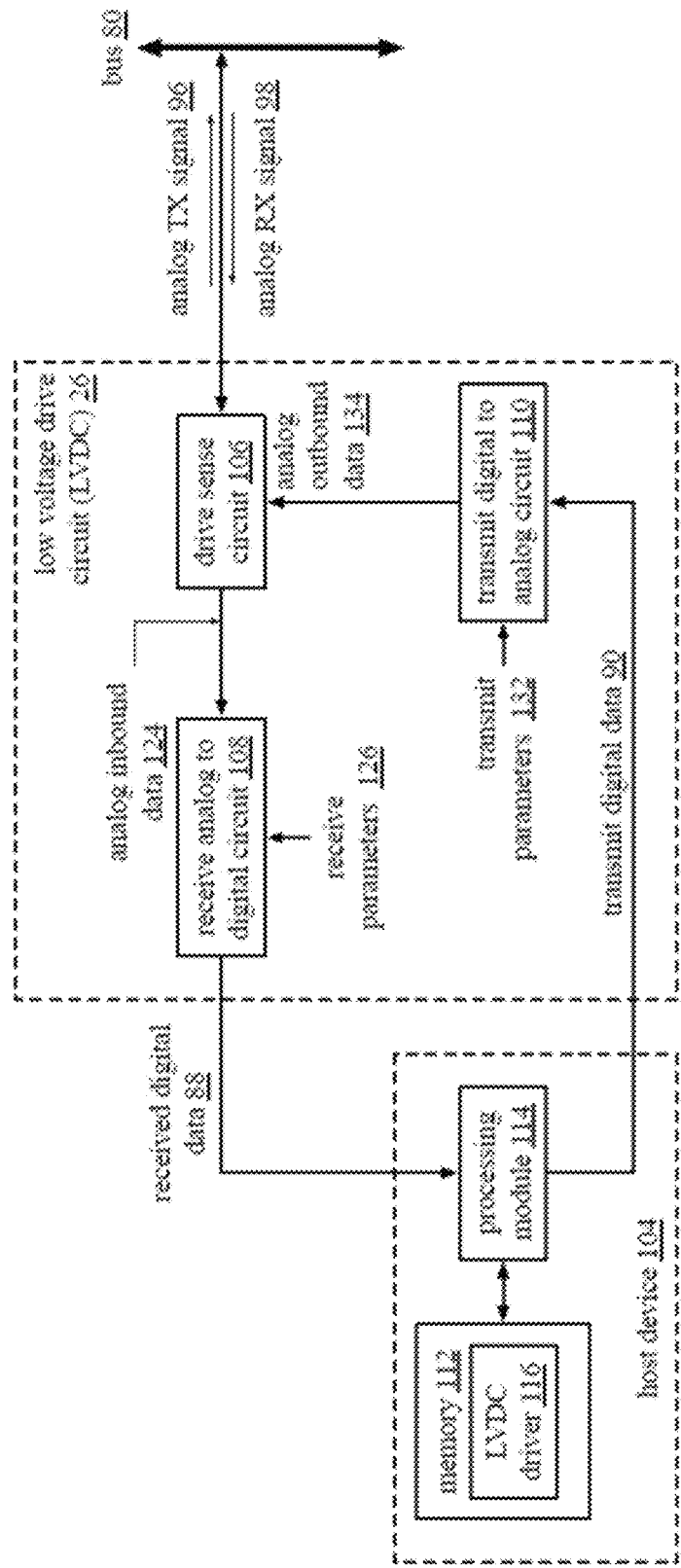
FIG. 11 is a schematic block diagram of an embodiment of an LVDC coupled to a host device in accordance with the present invention.

FIG. 11 is a schematic block diagram of an embodiment of a Low Voltage Drive Circuit (LVDC) 26 coupled to a host device 104 and to one or more lines of a bus 80. The host device 104 includes a processing module 114 and memory 112 (e.g., volatile memory and/or non-volatile memory). The memory 116 stores at least part of an LVDC driver 116 application. The LVDC 26 includes a drive sense circuit 106, a receive analog to digital converter (ADC) circuit 108, and a transmit digital to analog converter (DAC) circuit 110.

In an example of operation, the processing module 104 of the host device 104 accesses the LVDC driver 116 to set up the LVDC 26 for operation. For example, the LVDC driver 116 includes operational instructions and parameters that enable the host device 104 to effectively use the LVDC for data communications. For example, the parameters include two or more of: one or more communication scheme parameters; one or more data conveyance scheme parameters, one or more receive parameters, and one or more transmit parameters. A communication scheme parameter is one of: independent communication (e.g., push data to other device without prompting from other device); dependent communication (e.g., push or pull data to or from other device with coordination between the devices); one to one communication; one to many communication; many to one communication; many to many communication; half duplex communication; and full duplex communication.

A data conveyance scheme parameter is one of: a data rate per line; a number of bits per data rate interval; data coding scheme per line and per number of bits per data rate interval; direct data communication; modulated data communication; power level of signaling per line of the bus; voltage/current level for a data coding scheme per line (e.g., function of signal to noise ratio, power level, and data rate); number of lines in the bus; and a number of lines of the bus to use.

A receive parameter can include one of: a digital data format for the received digital data; a packet format for the received digital data; analog to digital conversion scheme in accordance with parameter(s) of the communication scheme and of the data conveyance scheme of transmitted data by other LVDCs; and digital filtering parameters (e.g., bandwidth, slew rate, center frequency, digital filter coefficients, number of taps of digital filtering, stages of digital filtering, etc.).

A transmit parameter can include one of: a digital data format for the transmit digital data; a packet format for the transmit digital data; and digital to analog conversion in accordance with parameter(s) of the communication scheme and of the data conveyance scheme.

Once the LVDC 26 is set up for a particular data communication, the transmit DAC circuit 110 receives the transmit digital data 90 from its host device 104 in one of the formats of FIG. 9, or another format, and at a data rate of the host device (e.g., 100 Mbps, 1 Gbps, etc.) If necessary, the transmit DAC circuit 110 converts the format of the transmit digital data 90 in accordance with one or more transmit parameters 132. In addition, the transmit DAC circuit 110 synchronizes the transmit digital data with a bus data rate (e.g., the data rate at which data is transmitted via a line of the bus 80) to produce a digital input of n-bits per interval of the bus data rate, where "n" is an integer greater than or equal to one.

The transmit DAC circuit 110 converts the digital input into analog outbound data 134 via a range limited digital to analog converter (DAC) and a DC reference source. The drive sense circuit 106 converts the analog outbound data 134 into the analog transmit signal 96 and drives it on to a line of the bus 80.

The drive sense circuit 106 receives the analog receive signal 98 from the bus 80 and converts it into analog inbound data 124. The receive ADC circuit 108 converts the analog inbound data 124 into digital inbound data. The receive ADC circuit 108 filters the digital inbound data in accordance with one or more receive parameters 126 to produce the filtered data. The receive ADC circuit 108 formats and packetizes the filtered data in accordance with one or more receive parameters 126 to produce the received digital data 88. The receive ADC circuit 108 provides the received digital data 128 to the host device 104.

In various embodiments, the transmit digital to analog circuit 110 is configured to convert transmit digital data 90 into analog outbound data 134. The receive analog to digital circuit 108 is configured to convert analog inbound data 124 into received digital data 88. The drive sense circuit 106 is configured to perform operations that, for example, include:
a) converting the analog outbound data 134 into an analog transmit signal 96;
b) driving the analog transmit signal 96 onto the bus 80, wherein the analog outbound data 134 is represented within the analog transmit signal 96 as variances in loading of the bus 80 at a first frequency;
c) receiving an analog receive signal 98 from the bus 80; and
d) isolating the analog receive signal 98 from the analog transmit signal 96 to recover the analog inbound data 124, wherein the analog inbound data 124 is represented within the analog receive signal 98 as variances in loading of the bus 80 at a second frequency that differs from the first frequency.

FIG. 12 is a schematic block diagram of an embodiment of a drive sense circuit 106 of a Low Voltage Drive Circuit (LVDC) 26 coupled to one or more lines of a bus 80. The line(s) of the bus are coupled to one or more other LVDCs. The drive sense circuit 106 includes a change detection circuit 150, a regulation circuit 152, and a power source circuit 154.

In various embodiments, the change detection circuit 150 is configured to generate the analog inbound data 124 in response to the analog receive signal 98 and the analog outbound data 134. The regulation circuit is configured to generate the regulation signal 160 in response to the analog inbound data 124. The power source circuit 154 is configured to generate the analog transmit signal 96 in response to the regulation signal 160. The change detection circuit 150 can include an operational amplifier or a comparator. The power source circuit 154 can include a regulated current source or voltage source configured to generate the analog transmit signal 96 in response to the regulation signal 160.

The change detection circuit 150, the regulation circuit 152, and the power source circuit 154 operate in concert to keep the inputs of the change detection circuit 150 to substantially match (e.g., voltage to substantially match, current to substantially match, impedance to substantially match). The inputs to the change detection circuit 150 include the analog outbound data 134 and the signals on the line(s) of the bus 80 (e.g., the analog RX signal 98 and the analog TX signal 96).

When there is no analog RX signal, the only signal on the bus is the analog transmit signal 96. The analog transmit signal is created by adjusting the operation of the change detection circuit 150, the regulation circuit 152, and the power source circuit 154 to match the analog outbound data 134. Since the analog transmit signal 96 tracks the analog outbound data 134 within the drive sense circuit 106, when there is no analog RX signal 98, the analog inbound data 124 is a DC value.

When an analog RX signal 98 is being received, the change detection circuit 150, the regulation circuit 152, and the power source circuit 154 continue to operate in concert to keep the inputs of the change detection circuit 150 to substantially match. With the presence of the analog RX signal 98, the output of the change detection circuit 150 will vary based on the analog RX signal 98, which produces the analog inbound data 124. The regulation circuit 152 converts the analog inbound data 124 into a regulation signal 160. The power source circuit 154 adjusts the generation of its output (e.g., a regulated voltage or a regulated current) based on the regulation signal 160 to keep the inputs of the change detection circuit 150 substantially matching.

FIG. 13 is a schematic block diagram of another embodiment of a drive sense circuit 106 of an LVDC 26 coupled to one or more lines of a bus 80. The drive sense circuit 106 includes the change detection circuit 150, the regulation circuit 152, the power source circuit 154, and a data input circuit 155. The change detection circuit 150, the regulation circuit 152, and the power source circuit 154 function as discussed with reference to FIG. 14 to keep the inputs of the change detection circuit 150 substantially matching. In this embodiment, however, the inputs to the change detection circuit 150 are the signals on the bus (e.g., the analog transmit signal 96 and the analog receive signal 98) and an analog reference signal 163 (e.g., a DC voltage reference signal or DC current reference signal). The analog outbound data 134 is inputted to the data input circuit 155.

In the example shown, the change detection circuit 150 is configured to generate the analog inbound data 124 in response to the analog receive signal 98, an analog reference signal 163 and the analog outbound data 134. The data input circuit 155 creates the analog transmit signals 96 from the analog outbound data 134 and drives it on to the bus 80. In an example, the data input circuit 155 changes the loading on the bus in accordance with the analog inbound data 134 to produce the analog transmit signal 96.

Since the analog transmit signal 156 is being created outside of the feedback loop of the change detection circuit 150, the regulation circuit 152, and the power source circuit 154, the analog inbound data 124 will include a component corresponding to the analog receive signal 98 and another component corresponding to the analog transmit signal 96.

Figure 14:
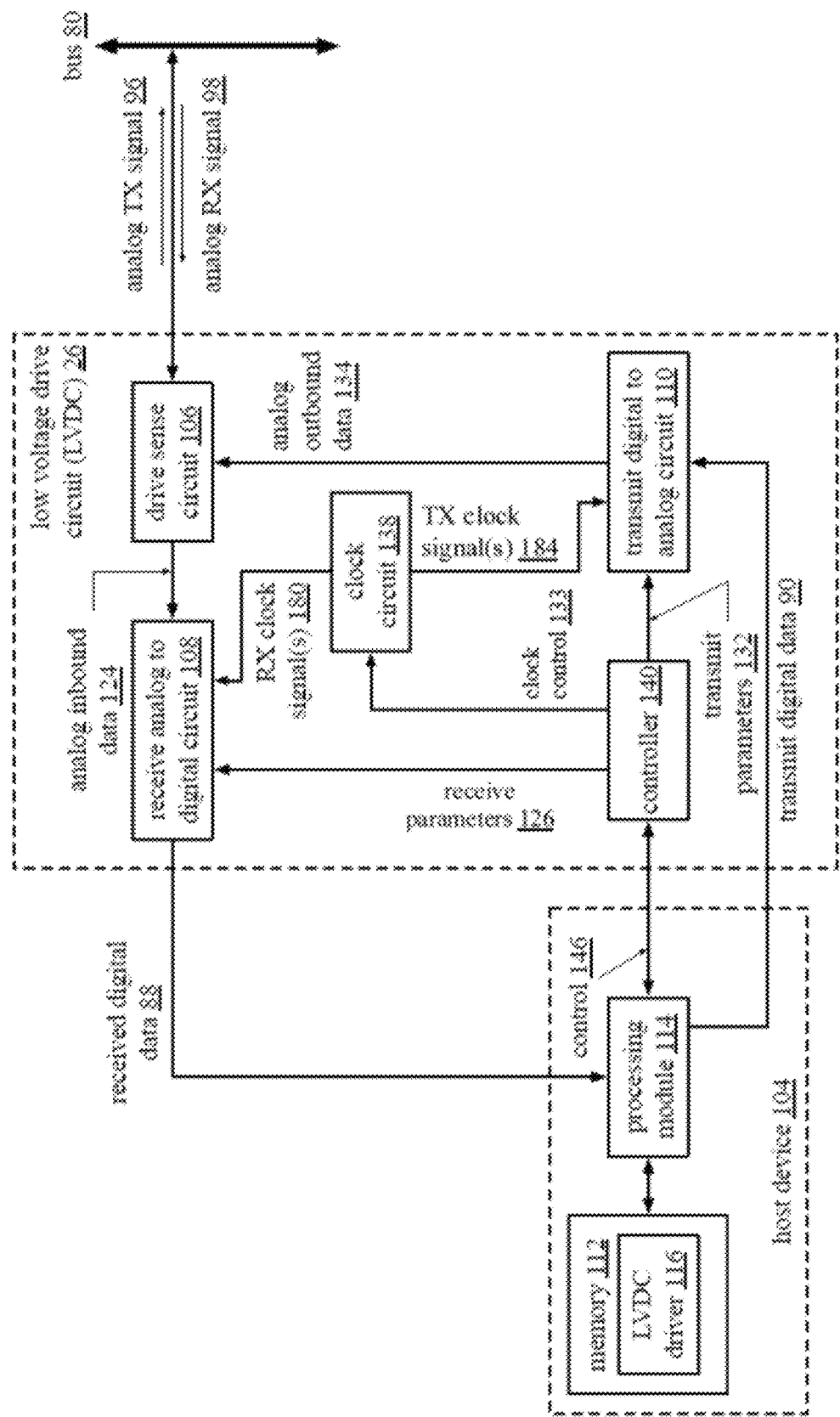
FIG. 14 is a schematic block diagram of another embodiment of an LVDC coupled to a host device in accordance with the present invention.

FIG. 14 is a schematic block diagram of another embodiment of a Low Voltage Drive Circuit (LVDC) 26 coupled to a host device 104 and to one or more lines of a bus 80. The host device 104 includes a processing module 114 and memory 112 (e.g., volatile memory and/or non-volatile memory). The memory 116 stores at least part of an LVDC driver 116 application. The LVDC 26 includes a drive sense circuit 106, a receive analog to digital converter (ADC) circuit 108, a transmit digital to analog converter (DAC) circuit 110, a clock circuit 138, and a controller 140. The drive sense circuit 106, the receive ADC circuit 108, and the transmit DAC circuit 110 function as previously discussed with reference to FIG. 11.

The controller 140 is configured to set transmit parameters of the transmit digital to analog circuit 110 and the transmit digital to analog circuit 110 converts the transmit digital data 90 into the analog outbound data 134 in accordance with the transmit parameters 132. The controller 140 is further configured to set receive parameters 126 of the receive analog to digital circuit 108 and the receive analog to digital circuit 108 converts the analog inbound data 124 into the received digital data 88 in accordance with the receive parameters 126. The clock circuit is configured to generate one or more receive clock signals 180 and one or more transmit clock signals 184. The transmit digital to analog circuit 110 converts the transmit digital data 90 into the analog outbound data 134 in accordance with timing set by the transmit clock signal(s) 184. The receive analog to digital circuit 108 converts the analog inbound data 124 into the received digital data 88 in accordance with timing set by the receive clock signal(s) 180. Furthermore, the controller 140 is configured to generate a clock control signal 133. The clock circuit 138 generates the receive clock signal(s) 180 and the transmit clock signal(s) 184 in accordance with and under control by the clock control signal 133.

For example, the processing module 104 of the host device 104 accesses the LVDC driver 116 to determine control information 146 to set up the LVDC 26 for operation. The processing module provides the control information 146 to the controller 140, which generates the receive parameters 126, the transmit parameters 132, and clock control signals 133 from the control information 146. In addition, the controller 140 determine one or more communication scheme parameters and/or one or more data conveyance scheme parameters based on the control information 140.

In an embodiment, the controller 140 is a processing module with associated memory. The memory (e.g., volatile and/or non-volatile) stores a plurality of look up tables: one for the communication parameters; a second for the data conveyance scheme parameters; a third for the transmit parameters 132; a fourth for the receive parameters 126; and a fifth for clock control parameters 133 (e.g., clock rate settings, duty cycle settings, etc.).

The clock circuit 138 is operable to create one or more transmit clock signals 184 and to create one or more receive clock signals 180 based on the clock control parameters, or information, 133. For example, the clock circuit 138 generates a first receive clock signal for outputting the receive digital data 88 to the host device 104 and a second receive clock for converting the analog inbound data 124 into digital inbound data. As another example, the clock circuit 138 generates a first transmit clock for receiving the transmit digital data 90 from the host device and a second transmit clock for converting the transmit digital data 90 into the analog outbound data 134.

Figure 15:
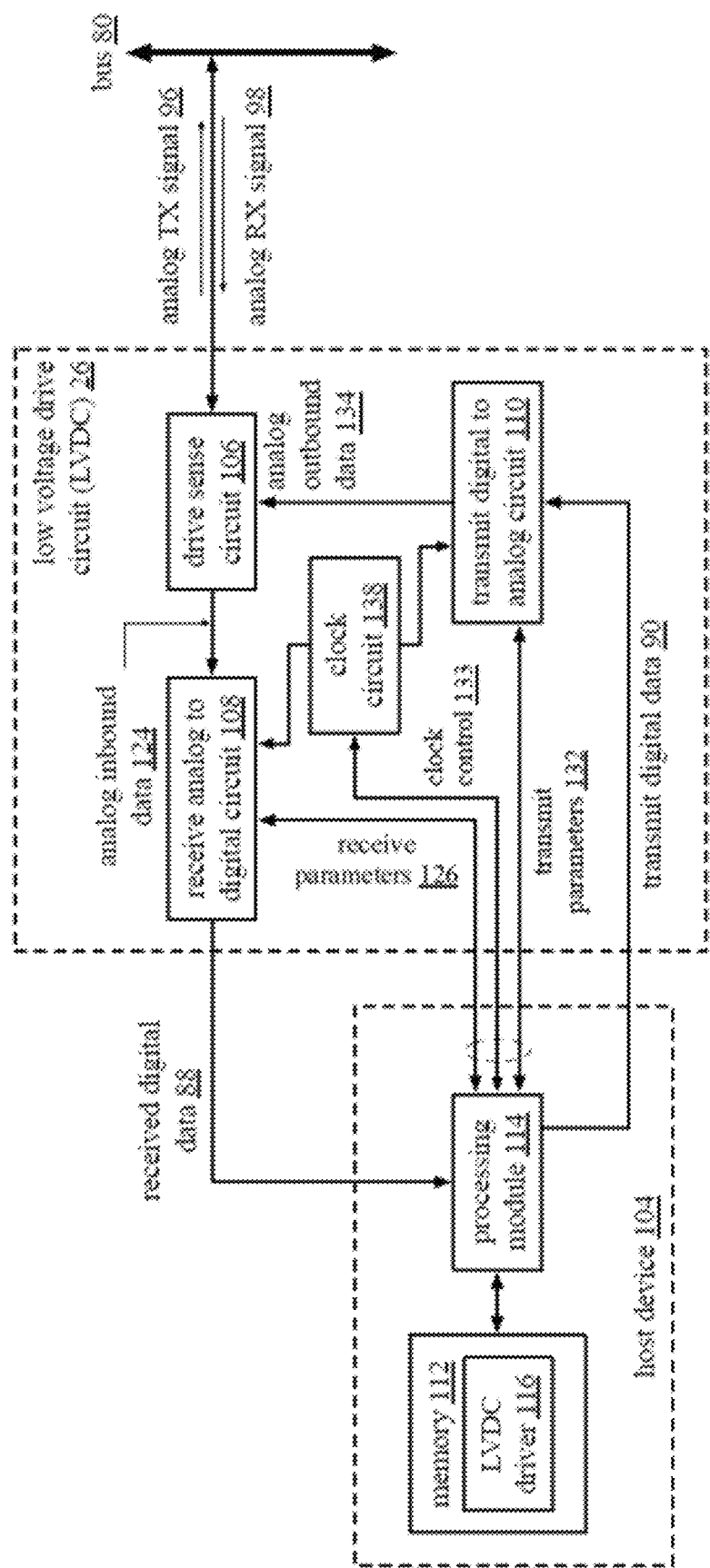
FIG. 15 is a schematic block diagram of another embodiment of an LVDC coupled to a host device in accordance with the present invention.

FIG. 15 is a schematic block diagram of another embodiment of a Low Voltage Drive Circuit (LVDC) 26 coupled to a host device 104 and to one or more lines of a bus 80. This embodiment of the LVDC 26 is similar to that of FIG. 12 with the exception that this embodiment does not include the controller 140. As such, the processing module 114 generates the receive parameters 126, the clock control information 133, and the transmit parameters 132. The processing module 114 also generates the one or more communication scheme parameters and the one or more data conveyance scheme parameters.

Figure 16:
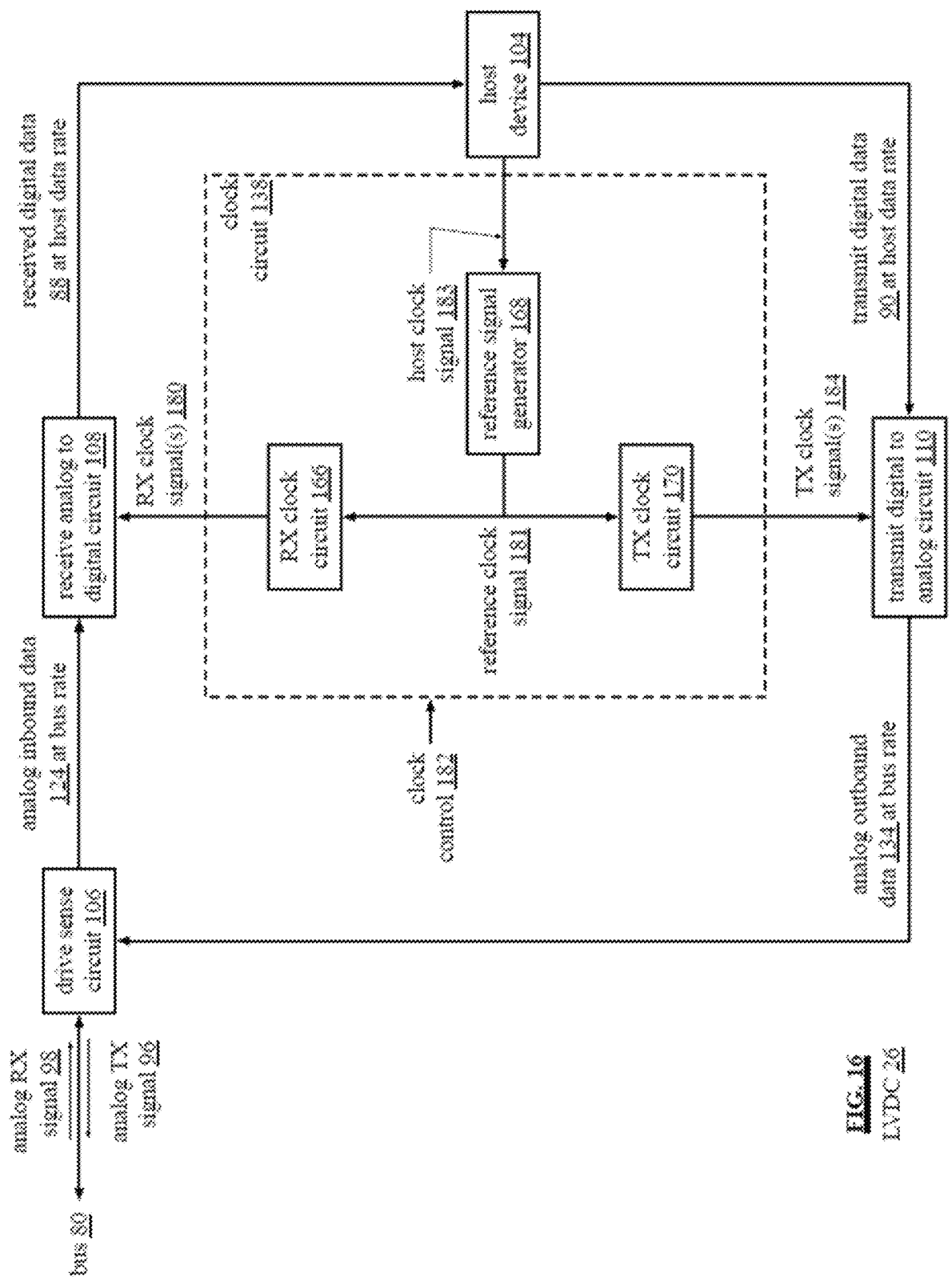
FIG. 16 is a schematic block diagram of another embodiment of an LVDC coupled in accordance with the present invention.

FIG. 16 is a schematic block diagram of another embodiment of a Low Voltage Drive Circuit (LVDC) 26 coupled to a host device 104 and to one or more lines of a bus 80. The LVDC 26 includes a drive sense circuit 106, a receive analog to digital circuit 108, a transmit digital to analog circuit 110, and a clock circuit 138. The clock circuit 138 includes a reference signal generator 168, a receive (RX) clock circuit 166, and a transmit (TX) clock circuit 170. The reference signal generator 168 may be implemented in a variety of ways to produce a reference clock signal 181. For example, the reference signal generator 168 is a phase locked loop (PLL) with an input clock from the host device or from a crystal oscillator. As another example, the reference signal generator 168 is a digital frequency synthesizer. As yet another example, the reference signal generator 168 is an oscillator.

The transmit clock circuit 170 includes one or more of: one or more frequency dividers, one or more frequency multipliers, one or more phase shift circuits, and one or more PLLs to generate transmit clock signals 184 from the reference clock signal 181. For example, the host clock signal 183 is a 2.000 GHz clock. The reference signal generator 168 creates a reference clock signal 181 of 2.100 GHz from the host clock signal. The transmit clock circuit 170 generates a 2.000 GHz clock used by the signal generator 144 to receive the transmit digital data 90 from the host device 104 in sync with the host clock signal 183. The transmit clock circuit 170 also generates a 2.010 GHz clock signal for a transmit channel having a 2.010 GHz frequency. The transmit digital to analog circuit 110 uses the 2.010 GHz clock signal to generate the analog outbound data 134 to be in sync with a bus clock.

The receive clock circuit 166 also includes one or more of: one or more frequency dividers, one or more frequency multipliers, one or more phase shift circuits, and one or more PLLs to generate receive clock signals 180 from the reference clock signal 181. For example, the host clock signal 183 is a 2.000 GHz clock. The reference signal generator 168 creates a reference clock signal 181 of 2.100 GHz from the host clock signal. The receive clock circuit 166 generates a 2.020 GHz clock signal for a receive channel having a 2.020 GHz frequency. The digital output circuit 136 uses the 2.020 GHz clock signal to receive the analog inbound data 124 in sync with the bus clock. The receive clock circuit 166 also generates a 2.000 GHz clock used by the receive analog to digital circuit 108 to provide the received digital data 88 to the host device 104 in sync with the host clock signal 183.

Figure 17:
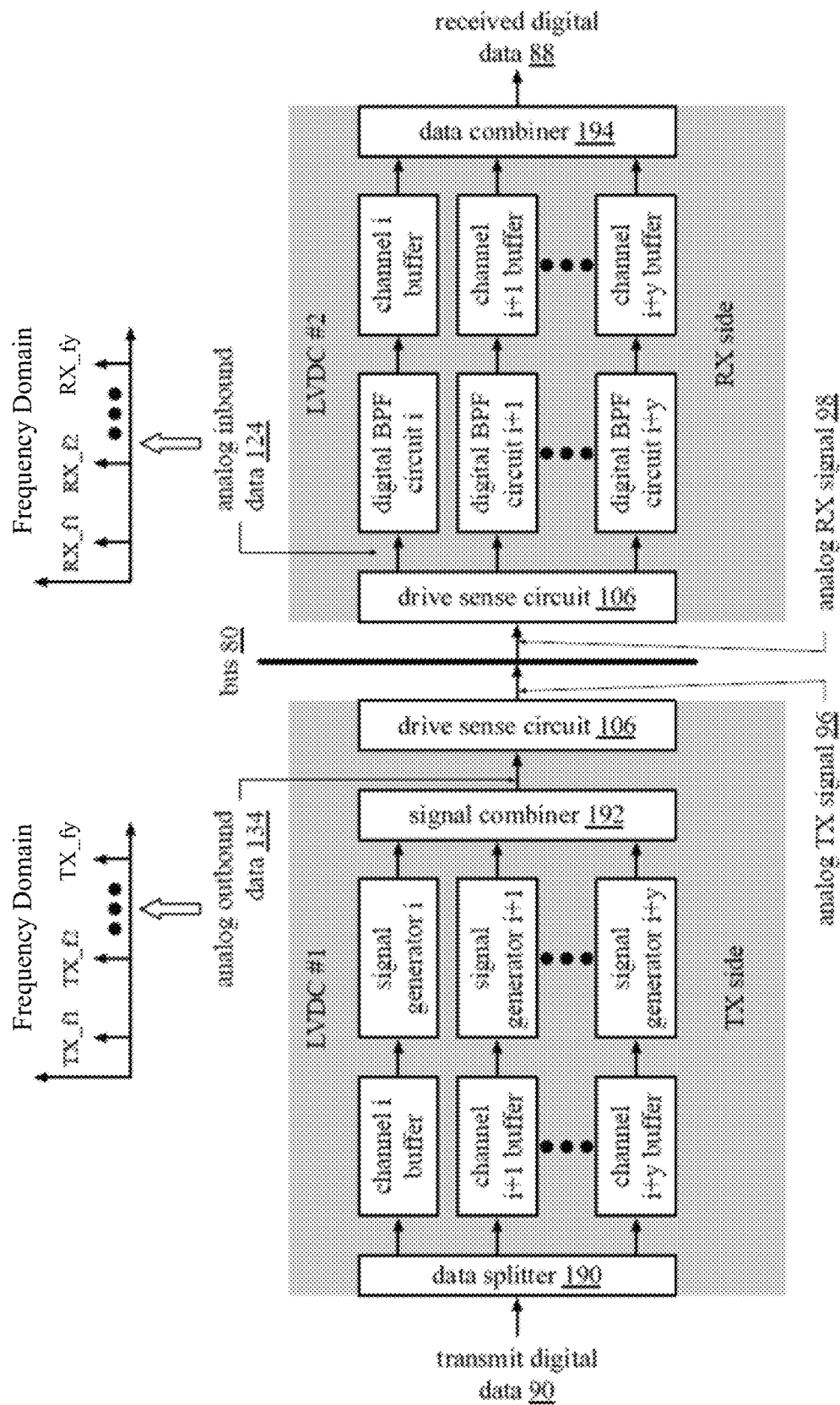
FIG. 17 is a schematic block diagram of an embodiment of a transmit side of one LVDC and a received side of another LVDC in accordance with the present invention.

FIG. 17 is a schematic block diagram of an embodiment of a transmit side of a first Low Voltage Drive Circuit (LVDC) coupled to a received side of a second LVDC via one or more lines of a bus 80. The transmit side of the LVDC #1 includes a data splitter 190, a plurality of channel buffers (i through i+y), a plurality of signal generators (i through i+y), a signal combiner 192, and a drive sense circuit 106. With reference to FIGS. 11, and 14-16, the data splitter 190, the channel buffers (i through i+y), the signal generators (i through i+y), and the signal combiner 192 are included in the transmit digital to analog circuit 110.

The receive side of LVDC #2 includes a drive sense circuit 106, a plurality of digital bandpass filter circuits (BPF i through I+y), a plurality of channel buffers (i through i+y), and a data combiner 194. With reference to FIGS. 11, and 14-16, the digital bandpass filter circuits (BPF i through I+y), the channel buffers (i through i+y), and the data combiner 194 are included in the receive analog to digital circuit 108.

In an example, the data splitter 190 receives the transmit digital data 90 and divides it into a plurality of data streams. A corresponding channel buffer stores a data stream. For instance, channel buffer i stores data stream i; channel buffer i+1 stores data stream i+1, and so on. The data streams are written into the channel buffers in accordance with the host data rate. The data, however, is read out of the channel buffers in accordance with transmit clock rates for each of the signal generators. The transmit clocks corresponds to the frequency of the channel being used by a signal generator.

Each enabled signal generator uses a different channel to convert bits of its respective data stream into respective portions of the analog outbound data 134. For example, signal generator i uses channel 1, which has a first frequency (f1), signal generator i+1 uses channel 2, which has a second frequency (f2), and so on, up to the yth frequency (fy). Note that, one or more of the signal generators is activated to convert the transmit digital data 90 into the analog outbound data 134.

As a specific example, signal generator i converts n-bits of its data stream at a time into an analog signal component of the analog outbound data 134, where n is an integer greater than or equal to one. For an n-bit sample of its data stream, the signal generator encodes the n-bit sample into a sinusoidal signal having a frequency at f1 using amplitude shift keying (ASK) signal, a phase shift keying (PSK) signal, a frequency shift keying (FSK) signal (e.g. using two or more subcarriers), a quadrature amplitude modulation (QAM) signal, quadrature phase shift keying (QPSK) signal, another modulation technique and/or a combination thereof. Signal generator i+1 functions similarly by encoding an n-bit sample of its data stream into a sinusoidal signal having a frequency at f2 using ASK, PSK , FSK, QPSK, QAM, etc. The analog outbound data 134 can be represented by the frequency domain graph 199-1 that shows frequency components of the transmit signal at frequencies f1, f2 . . . fy.

The drive sense circuit 106 of the first LVDC converts the analog outbound data 134 into an analog transmit signal 96, which it transmits on to a line of the bus 80. The drive sense circuit 106 of the second LVDC receives it as an analog receive signal 98 and converts it into analog inbound data 124. The analog inbound data 124 can be represented by the frequency domain graph 199-2 that shows frequency components of the received signal at frequencies f1, f2 . . . fy. As such, without conversion, transmission, or reception errors, the analog inbound data 124 is substantially identical to the analog outbound data 134.

It should be noted that, while the frequency components of the analog outbound data 134 and analog inbound data 124 are shown as simple sinusoids for the purposes of illustration, the frequency components include data modulation to conveys data via amplitude shift keying, phase shift keying, frequency shift keying, quadrature amplitude modulation, quadrature phase shift keying, another modulation technique and/or a combination thereof.

Each digital bandpass filter (BPF) circuit includes an analog to digital converter and a digital bandpass filter. Each active digital BPF circuit receives the analog inbound data 124. In addition, each active digital BPF circuit is tuned for a different channel. For example, digital BPF circuit i is tuned for frequency 1, digital BPF circuit i+1 is tuned for frequency 2, and so on. As such, digital BPF circuit i converts the analog inbound data into digital inbound data, filters it, and outputs the n-bit digital values corresponding to the data stream processed by signal generator i. Similarly, digital BPF circuit i+1 converts the analog inbound data into digital inbound data, filters it, and outputs the n-bit digital values corresponding to the data stream processed by signal generator i+1; and so on.

The channel buffers of the receive side of LVDC store the n-bit digital values outputted by their respective digital BPF circuits. The data combiner 194 retrieves data from the channel buffers and periodically outputs the received digital data 88. For example, a block of data is inputted into the data splitter 190 in accordance with a data rate of the host device (host 1) coupled to the first LVDC. As a specific simplified example, assume the data block includes 24-bits and is clocked into the data splitter serially over 24 intervals of a data clock of host 1. Further assume that the 24-bits are divided into three data streams (y=3), each 8-bits (n=8). As such, three paths will be activated between the data splitter 190 of LVDC #1 and the data combiner 194 of LVDC #2.

Each activated path operates independent of the other paths and at different rates to process their respective data streams of the data block. For example, the first path (e.g., signal generator i through digital BPF circuit i) operates in accordance with frequency f1, which is at slightly higher frequency than that of the data rate of host 1; the second path (e.g., signal generator i+1 through digital BPF circuit i+1) operates in accordance with frequency f2, which is at slightly higher frequency than that of frequency f1; and the third path (e.g., signal generator i+2 through digital BPF circuit i+2) operates in accordance with frequency f3, which is at slightly higher frequency than that of frequency f2.

Continuing with the simplified example, further assume that the data clock of host 1 is 1.000 GHz for a 125 Mega Byte per second (MBps) data rate, which corresponds to a 1 Gbps data rate; data is provided to the data splitter a byte at a time; frequency f1 is at 1.010 GHz, frequency f2 is at 1.020 GHz, and frequency f2 is at 1.030 GHz. There are a variety of ways the data splitter 190 can divide the data and put it into the channel buffers. For example, the data splitter 190 uses a bit-by-bit round robin distribution.

As data is put into the channel buffers on the transmit side, the signal generators begin to process them. In this example, a bit at a time. Since signal generator i+2 is operating at a rate that is faster than the other two signal generates, it will finish processes its 8-bits slightly before the others. As such, digital BPF circuit i+2 will finish recovering the 8-bits of data slightly before the other digital BPF circuits. The timing difference is compensated for by the buffers on each end such that, as 24-bits goes into the transmitting LVDC at the rate of the first host device, the same 24-bits will come out of the receiving LVDC at the rate of the host device of the second LVDC.

FIG. 18A is a schematic block diagram of an embodiment of a drive sense circuit of an LVDC in accordance with the present invention. In particular, an implementation of drive sense circuit 106 is shown along with analog to digital converter (ADC) 202 and digital to analog converter (DAC) 204. In particular, the ADC 202 generates digital inbound data 177 from the analog inbound data 124 for use, for example, in the first stage of a digital output operation, such as the remaining components of digital BPF circuits i, i+1 . . . i+y of LVDC #2 of FIG. 17.

As discussed in conjunction with FIG. 11, the drive sense circuit 106 is configured to perform operations that, for example, include:

a) converting the analog outbound data 134 into an analog transmit signal 96;
b) driving the analog transmit signal 96 onto the bus 80, wherein the analog outbound data 134 is represented within the analog transmit signal 96 as variances in loading of the bus 80 at a first frequency;
c) receiving an analog receive signal 98 from the bus 80; and
d) isolating the analog receive signal 98 from the analog transmit signal 96 to recover the analog inbound data 124, wherein the analog inbound data 124 is represented within the analog receive signal 98 as variances in loading of the bus 80 at a second frequency that differs from the first frequency.

Using the reference numerals of FIG. 12, the power source circuit 154 is implemented via the regulated I (current) source 206, the change detection circuit 150 is implemented via the comparator or operational amplifier 200. The regulation circuit is implemented via the feedback path through the ADC 202 and DAC 204.

In various embodiments, the comparator or operational amplifier 200 generates the analog inbound data 124 in response to the analog receive signal 98 and the analog outbound data 134. The feedback path through the ADC 202 and DAC 204 generates the regulation signal 160 in response to the analog inbound data 124. The regulated current source 206 is configured to generate the analog transmit signal 96 in response to the regulation signal 160.

The regulated I (current) source 206, the comparator or operational amplifier 200 and the feedback path through the ADC 202 and DAC 204 operate in concert to keep the inputs of the comparator or operational amplifier 200 to substantially match (e.g., voltage to substantially match, current to substantially match, impedance to substantially match). The inputs to the change the comparator or operational amplifier 200 include the analog outbound data 134 and the signals on the line(s) of the bus 80 (e.g., the analog RX signal 98 and the analog TX signal 96).

When there is no analog RX signal, the only signal on the bus 80 is the analog transmit signal 96. The analog transmit signal is created by adjusting the operation of the regulated current source 206, the comparator or operational amplifier 200 and the feedback path through the ADC 202 and DAC 204 to match the analog outbound data 134. Since the analog transmit signal 96 tracks the analog outbound data 134 within the drive sense circuit 106, when there is no analog RX signal 98, the analog inbound data 124 is a DC value.

When an analog RX signal 98 is being received, the regulated current source 206, the comparator or operational amplifier 200 and the feedback path through the ADC 202 and DAC 204 continue to operate in concert to keep the inputs of the change detection circuit 150 to substantially match. With the presence of the analog RX signal 98, the output of the comparator or operational amplifier 200 will vary based on the analog RX signal 98, which produces the analog inbound data 124. The feedback path through the ADC 202 and DAC 204 converts the analog inbound data 124 into a regulation signal 160. The regulated current source 206 adjusts the generation of its output (e.g., a regulated current) based on the regulation signal 160 to keep the inputs of the change detection circuit 150 substantially matching.

FIGS. 18B, 19, 20, 21 and 22 are schematic block diagrams of other embodiments of a drive sense circuit of an LVDC in accordance with the present invention. In FIG. 18B, another implementation of drive sense circuit 106 is shown along with analog to digital converter 202—but omitting the digital to analog converter 204. In this case, the regulation circuit 152 is implemented via the feedback path directly from the output of the comparator or operational amplifier 200.

In FIG. 19, an example implementation of the drive sense circuit 106 of FIG. 13 is presented along with analog to digital converter 202 and the digital to analog converter 204. The power source circuit 154 is implemented via the regulated I (current) source 206, the change detection circuit 150 is implemented via the comparator or operational amplifier 200. The regulation circuit is implemented via the feedback path through the ADC 202 and DAC 204.

In FIG. 20, another implementation of drive sense circuit 106 of FIG. 13 is shown along with analog to digital converter 202—but omitting the digital to analog converter 204. In this case, the regulation circuit 152 is implemented via the feedback path directly from the output of the comparator or operational amplifier 200.

In FIG. 21, another implementation of drive sense circuit 106 of FIG. 13 is shown along with analog to digital converter 202. In this case, the comparator or operational amplifier 200 is implemented by operational amplifier (op amp) 212. The regulated current source circuit 206 is replaced by transistor T1 and current source 214. The regulation circuit 152 is implemented via the feedback path directly from the output of the operational amplifier 212. The transistor T1 is biased via bias voltage 210 to comport with rail voltages of Vdd and 0 volts (ground). The oscillating signal component of the analog transmit signal 96 and the analog receive signal 98 can be in the range of 10 mv to 100 mv for low power operation.

In operation, the drive sense circuit 106 of FIG. 21 operates by:
a) converting the analog outbound data 134 at a frequency f1 into an analog transmit signal 96 (at f1);
b) driving the analog transmit signal 96 (at f1) onto the bus 80, wherein the analog outbound data 134 is represented within the analog transmit signal 96 as variances in loading of the bus 80 at f1;
c) receiving an analog receive signal 98 at a frequency f2 from the bus 80; and
d) isolating the analog receive signal 98 (at f2) from the analog transmit signal 96 (at f1) to recover the analog inbound data 124 (at f2), wherein the analog inbound data 124 is represented within the analog receive signal 98 as variances in loading of the bus 80 at f2.

It should be noted, that while the analog outbound data 134 and the analog inbound data 124 are discussed above in conjunction with differing, but single frequencies, in various embodiments the analog outbound data 134 and the analog inbound data 124 may each include multiple carriers and/or subcarrier frequencies that each differ from one another.

In FIG. 22, a similar implementation of drive sense circuit 106 of FIG. 21 is shown along with analog to digital converter 202. In this implementation however, the drive sense circuit of FIG. 12 is implemented rather than the drive sense circuit of FIG. 13.

Figure 23:
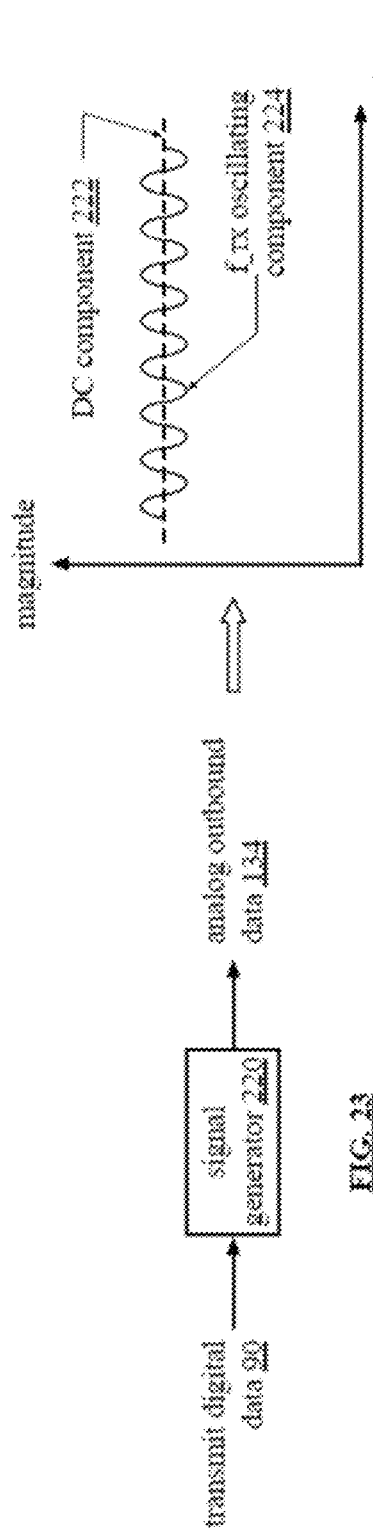
FIG. 23 is a schematic block diagram of an embodiment of a signal generator of an LVDC in accordance with the present invention.

FIG. 23 is a schematic block diagram of an embodiment of a signal generator of an LVDC in accordance with the present invention. In particular, signal generator 220 is presented that, for example, functions as transmit digital to analog circuit 110 previously discussed. In operation, the signal generator 220 converts digital data 90, from a host device 104 for example, into the analog output data 134.

As shown in the accompanying analog time domain graph of a current of voltage signal, the analog outbound data 134 has an oscillating component 224 at the frequency f Tx and a DC component 222, an example of oscillating component 94 previously discussed. Furthermore, while shown as a simple sinusoid at a single frequency for the purposes of illustration, the oscillating component 224 conveys data via amplitude shift keying, phase shift keying, frequency shift keying, quadrature amplitude modulation, quadrature phase shift keying, another modulation technique and/or a combination thereof.

Figure 24:
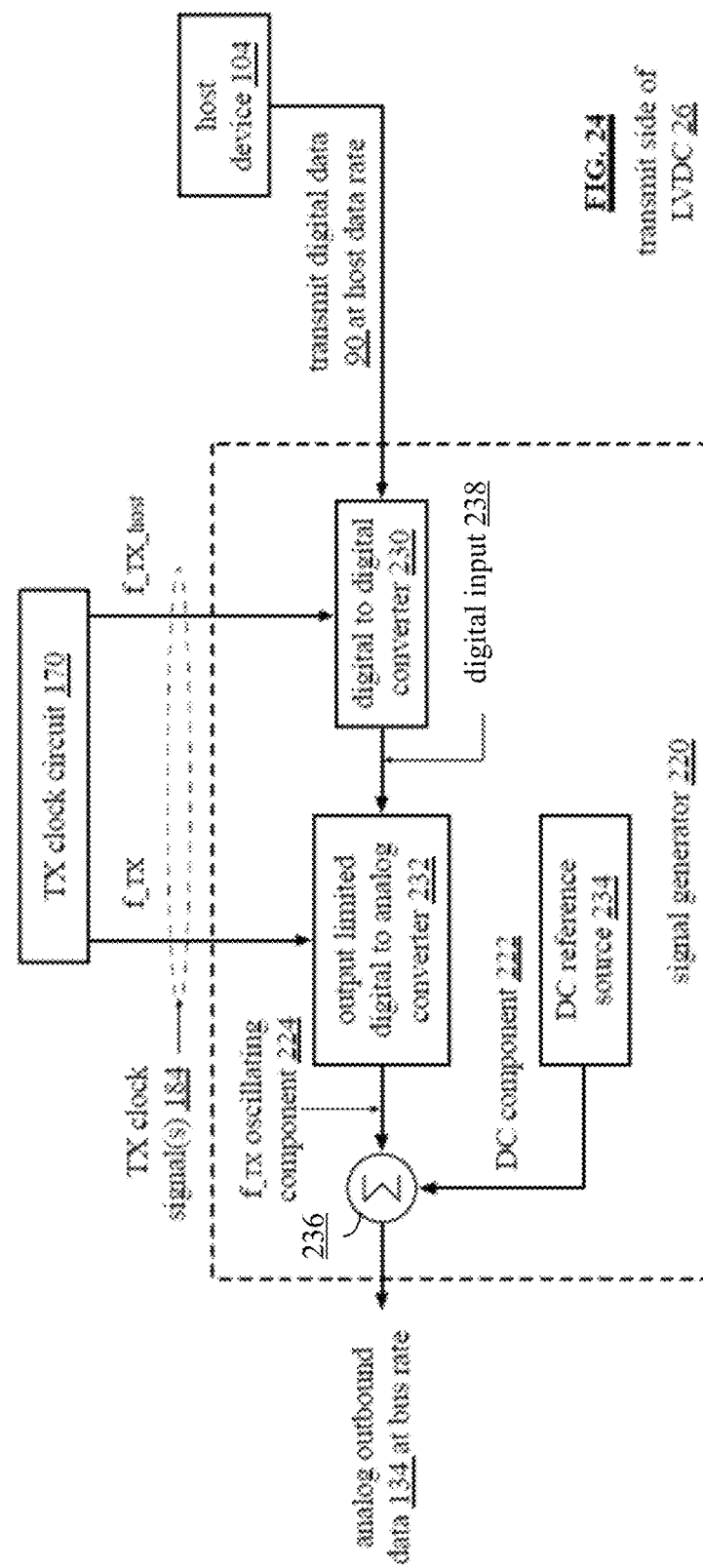
FIG. 24 is a schematic block diagram of an embodiment of a signal generator of an LVDC in accordance with the present invention.

FIG. 24 is a schematic block diagram of an embodiment of a signal generator of an LVDC in accordance with the present invention. In particular, a signal generator 220 is shown that operates in conjunction with transmit clock circuit 170 and host device 104 to generate analog outbound data 134 (at the data rate of the bus 80) in response to the transmit digital data 90 (at the hist data rate). The signal generator 220 includes digital to digital converter 230, output limited digital to analog converter 232, DC (direct current) reference source 234 and summing circuit 236. The transmit clock circuit 170 can be implemented as the transmit portion of clock circuit 138. The transmit clock circuit 170 supplies at least two different clock signals, at least one clock signal to the digital to digital converter 230 and at least one other clock signal to the output limited digital to analog converter 232. In various embodiments, at least one clock signal is sent to the digital to digital converter 230 that has a frequency f_tx host that is at the data rate of the host device 104. Furthermore, at least one other clock signal sent to the output limited digital to analog converter 232 has a frequency f_tx that is at the data rate of the bus 80.

The digital to digital converter 230 is operable to convert transmit digital data 90 into the digital input 238, wherein the transmit digital data 90 is synchronized to the clock rate of the host device 104 and the digital input 238 is synchronized to the clock rate (a different clock rate) of the bus 80 to which the LVDC 26 is coupled. The DC reference source 234 is operable to produce a DC component 222 that has a magnitude between the magnitudes of the power supply rails of the signal generator 220. The output limited digital to analog converter 232 is operable to convert, for example on a n-bit-by-n-bit basis, the digital input 238 into an oscillating component 224 in an analog domain, wherein magnitude of the oscillating component 224 is limited to a range that is less than a difference between the magnitudes of the power supply rails of the signal generator 220. For example, the magnitude of the oscillating component 224 can be in range of 5% to 75% of the difference between magnitudes of power supply rails. The oscillating component 224 and the DC component 222 are combined by the summing circuit 236 to produce the analog outbound data 134.

Example implementations of the output limited digital to analog converter 232, including several optional functions and features are presented in conjunction with the discussion of FIGS. 26-33 that follow. Example implementations of the digital to digital converter 230 including several optional functions and features are presented in conjunction with the discussion of FIGS. 25, 27 and 31 that follow.

Figure 25:
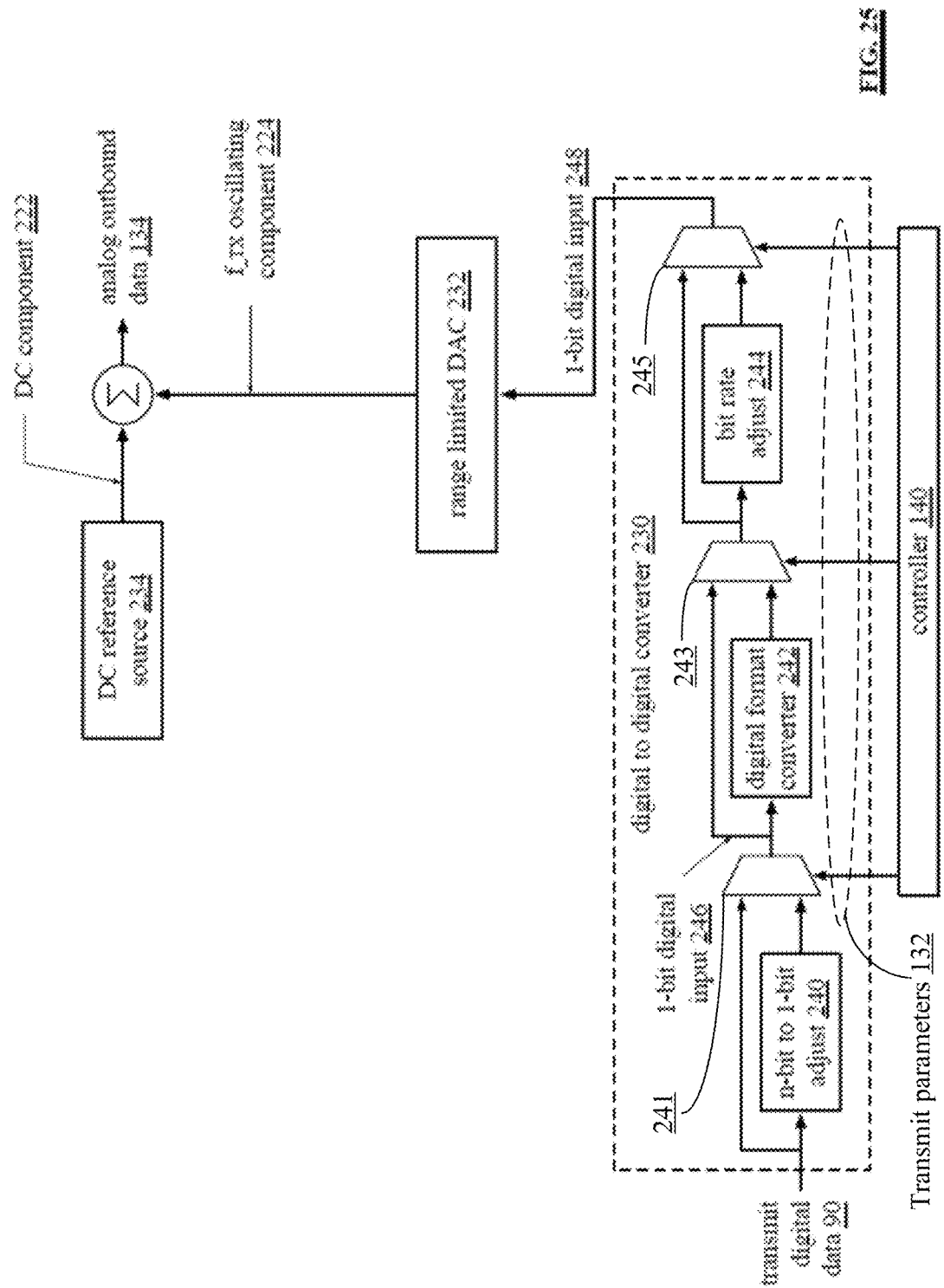
FIG. 25 is a schematic block diagram of an embodiment of a digital-to-digital converter of an LVDC in accordance with the present invention.

FIG. 25 is a schematic block diagram of an embodiment of a digital-to-digital converter of an LVDC in accordance with the present invention. In particular, an implementation of a digital to digital converter 230 is presented. As previously discussed, the digital to digital converter 230 is operable to convert transmit digital data 90 into the digital input 238, wherein the transmit digital data 90 is synchronized to the clock rate of the host device 104 and the digital input 238 is synchronized to the clock rate (e.g. a different clock rate) of the bus 80 to which the LVDC 26 is coupled.

In operation, one or more transmit parameters 132 from the controller 140 are used by the digital to digital converter 230 to synchronize the transmit digital data 90 with a bus data rate (e.g., the data rate at which data is transmitted via a line of the bus 80) to produce a digital input 238 of m-bits per interval of the bus data rate, where "m" is an integer greater than or equal to one. In general, the digital to digital converter 230 includes a n-bit to m-bit adjust circuit that converters n-bits of the transmit digital data 90 received per interval of a data rate of the host into a series of m-bits for processing by the signal generator 220 during the interval, wherein n is equal to or greater than m. Furthermore, one or more transmit parameters 132 from the controller 140 are used by the digital to digital converter 230 to convert the format of the transmit digital data 90 to conform with the digital formatting of the bus 80.

In the example shown, m=1 and the digital input 238 corresponds to a 1-bit digital input 248. The n-bits transmit digital data 90 are input to a n-bit to 1-bit adjust circuit 240 which operates to serialize the n-bit parallel input stream. The n-bits of transmit digital data 90 are also input to a multiplexer (MUX) or other selector circuit 241. The MUX or other selector circuit 241 operates under control of one or more transmit parameters 132 to produce 1-bit digital input stream 246 either from the output of the n-bit to 1-bit adjust 240 or directly from the n-bits of transmit digital data 90, when for example, n=1 (or more generally, n=m).

The 1-bit digital input 246 is input to the digital format converter 242 and the MUX or other selector circuit 243. The MUX or other selector circuit 243 operates under control of one or more transmit parameters 132 to optionally convert the digital format of the 1-bit digital input 246 via the digital format converter 242 or to leave the digital format as-is by simply passing along the 1-bit digital input 246 without digital format conversion. In this fashion, the digital data format can optionally be converted, for example, from any one to any other of the digital data formats presented in conjunction with FIG. 9.

The output of the MUX or other selector circuit 243 is input to the rate adjust circuit 244 and to the MUX or other selector circuit 245. When selected by the MUX or other selector circuit 243 in response to one or more transmit parameters 132, the bit rate adjust circuit 244 operates to adjust the bit rate to produce 1-bit digital input 248. In this fashion, the bit rate of the 1-bit digital input 248 can be adjusted to correspond to the clock rate/bit rate of the bus 80.

In various embodiments, the digital format converter 242 and bit rate adjust circuit 244 can be implemented via look-up tables or other circuits. The 1-bit adjust circuit 240 can be implemented via parallel to serial converter or other circuit. The frequency of the oscillating component 224 can be greater than or equal to the data rate of the 1-bit digital input.

Figure 26:
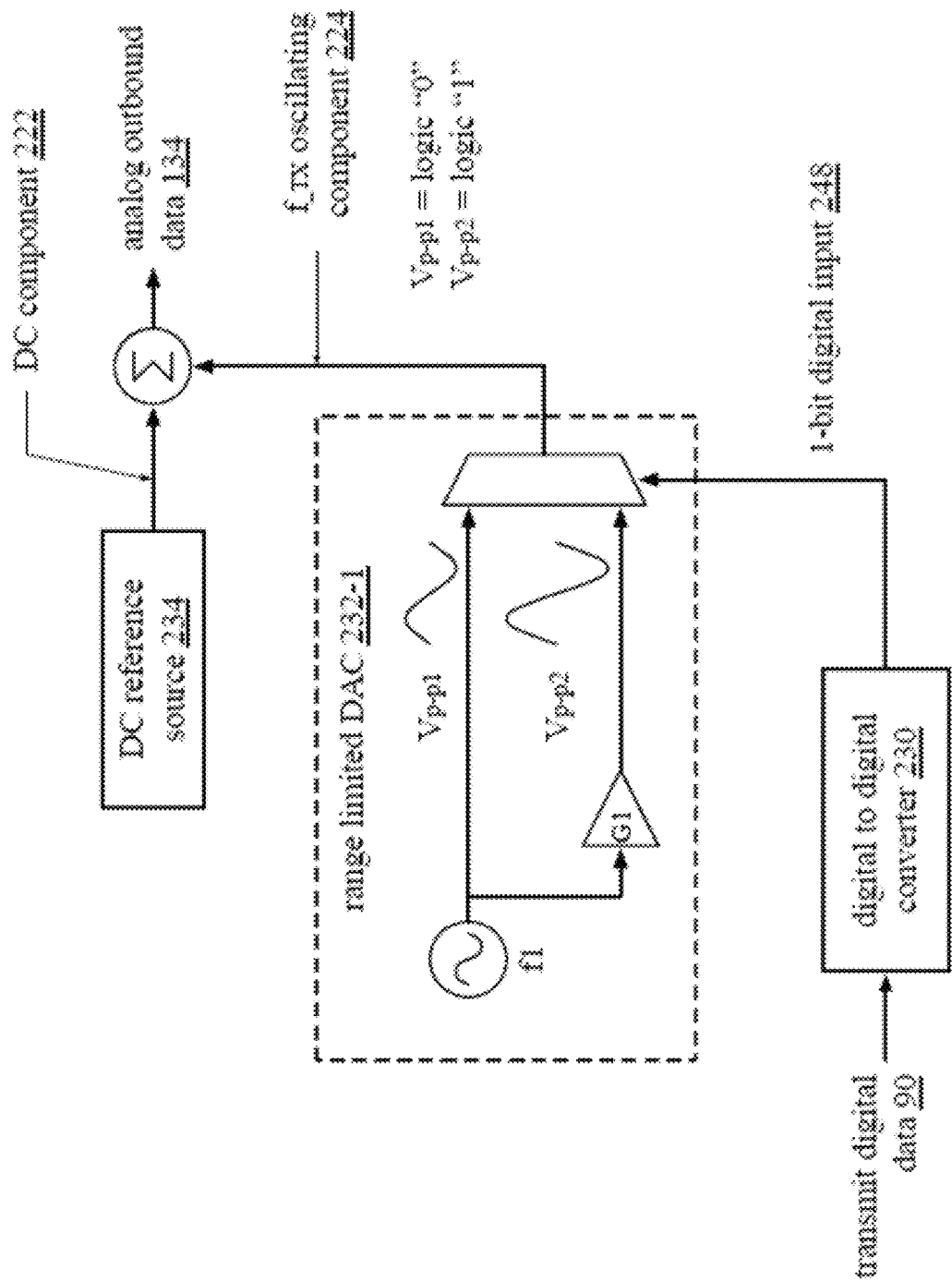
FIG. 26 is a schematic block diagram of an embodiment of a range limited digital-to-analog converter of an LVDC in accordance with the present invention.

FIG. 26 is a schematic block diagram of an embodiment of a range limited digital-to-analog converter of an LVDC in accordance with the present invention. In particular, the range limited DAC 232-1 is an example of output limited digital to analog converter 232 that, along with other components of a transmit digital to analog circuit 110, operates to convert, transmit digital data 90 into analog outbound data 134.

The range limited DAC 232-1 is a 1-bit digital to analog converter that operates by: generating a first oscillation via a signal generator at a frequency f1 having first oscillation characteristics, such as the peak-to-peak voltage $V_{p\text{-}p1}$. A second oscillation having second oscillation characteristics, such as the peak-to-peak voltage $V_{p\text{-}p2}$, is generated by an amplifier with gain G1. The range limited DAC 232-1 outputs either the first oscillation or the second oscillation on a bit-by-bit basis under control of a MUX or selector circuit in accordance with the 1-bit digital input 248 that conveys the transmit digital data 90 to produce the oscillating component 224. In the example shown, $V_{p\text{-}p1}$ represents a logic "0" of the transmit digital data 90 and $V_{p\text{-}p}2$ represents a logic "1" of the transmit digital data 90. The magnitude of the first and second oscillations and/or $V_{p\text{-}p1}$ 1 and $V_{p\text{-}p2}$ are limited to a range, either when generated or via an attenuator or other range limiter to be less than a difference between the magnitudes of power supply rails.

Figure 27:
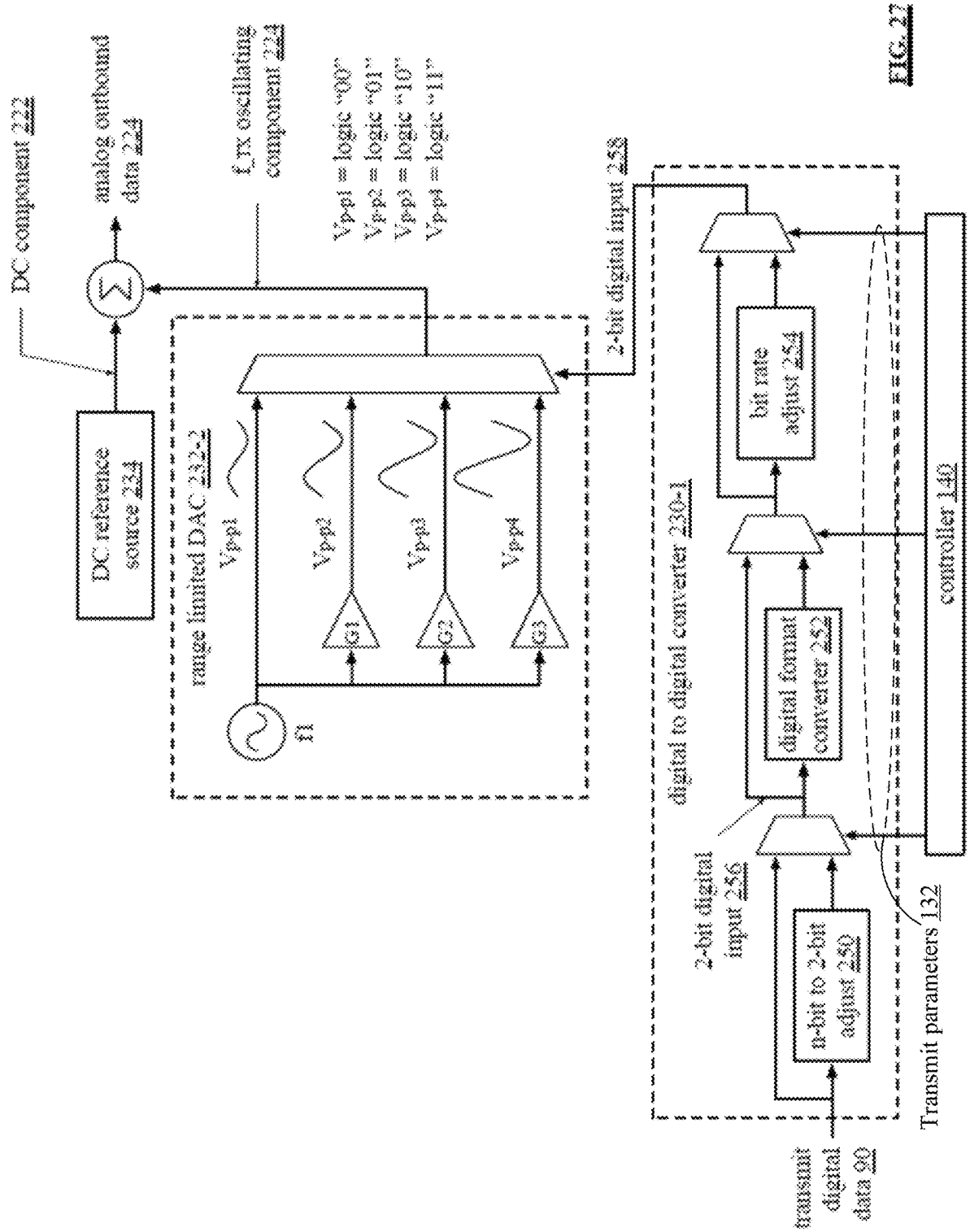
FIG. 27 is a schematic block diagram of an embodiment of a range limited digital-to-analog converter and a digital-to-digital converter of an LVDC in accordance with the present invention.

FIG. 27 is a schematic block diagram of an embodiment of a range limited digital-to-analog converter and a digital-to-digital converter of an LVDC in accordance with the present invention. In particular, the digital to digital converter 230-1 is an example of digital to digital converter 230 that produces a 2-bit digital input 258. In the example shown, m=2 and the digital input 238 corresponds to a 2-bit digital input 258. The n-bits transmit digital data 90 are input to a n-bit to 2-bit adjust circuit 250 which operates to serialize the n-bit parallel input stream. The n-bits of transmit digital data 90 are also input to a first multiplexer (MUX) or other selector circuit. The first MUX or other selector circuit operates under control of one or more transmit parameters 132 to produce 2-bit digital input stream 256 either from the output of the n-bit to 2-bit adjust circuit 250 or directly from the n-bits of transmit digital data 90, when for example, n=2.

The 2-bit digital input 256 is input to the digital format converter 252 and the second MUX or other selector circuit. The second MUX or other selector circuit operates under control of one or more transmit parameters 132 to optionally convert the digital format of the 2-bit digital input 256 via the digital format converter 252 or to leave the digital format as-is by simply passing along the 2-bit digital input 256 without digital format conversion. In this fashion, the digital data format can optionally be converted, for example, from any one to any other of the digital data formats presented in conjunction with FIG. 9.

The output of second the MUX or other selector circuit is input to the rate adjust circuit 254 and to the third MUX or other selector circuit. When selected by the third MUX or other selector circuit in response to one or more transmit parameters 132, the bit rate adjust circuit 254 operates to adjust the bit rate to produce 2-bit digital input 258. In this fashion, the bit rate of the 2-bit digital input 258 can be adjusted to correspond to the clock rate/bit rate of the bus 80.

In various embodiments, the digital format converter 252 and bit rate adjust circuit 254 can be implemented via look-up tables or other circuits. The 2-bit adjust circuit 250 can be implemented via parallel to serial converter and two-bit buffer or other circuit. The frequency of the oscillating component 224 can be greater than or equal to the data rate of the 2-bit digital input.

The range limited DAC 232-2 is an example of output limited digital to analog converter 232 that, along with other components of a transmit digital to analog circuit 110, operates to convert, transmit digital data 90 into analog outbound data 134. The range limited DAC 232-2 is a 2-bit digital to analog converter (m=2) that operates by: generating a first oscillation via a signal generator at a frequency f1 having first oscillation characteristics, such as the peak-to-peak voltage $V_{p\text{-}p1}$. A second oscillation having second oscillation characteristics, such as the peak-to-peak voltage $V_{p\text{-}p2}$, is generated by an amplifier with gain G1. A third oscillation having third oscillation characteristics, such as the peak-to-peak voltage $V_{p\text{-}p3}$, is generated by an amplifier with gain G2. A fourth oscillation having fourth oscillation characteristics, such as the peak-to-peak voltage $V_{p\text{-}p4}$, is generated by an amplifier with gain G3. The range limited DAC 232-2 outputs either the first oscillation, the second oscillation, the third oscillation or the fourth oscillation on a 2-bit by 2-bit basis under control of the MUX or selector circuit in accordance with the 2-bit digital input 258 that conveys the transmit digital data 90 to produce the oscillating component 224. In the example shown, $V_{p\text{-}p1}$ represents a logic "00" of the transmit digital data 90, $V_{p\text{-}p2}$ represents a logic "01" of the transmit digital data 90, $V_{p\text{-}p3}$ represents a logic "10" of the transmit digital data 90 and $V_{p\text{-}p4}$ represents a logic "11" of the transmit digital data 90. The magnitude of the first, second, third and fourth oscillations and/or $V_{p\text{-}p1}$, $V_{p\text{-}p2}$, $V_{p\text{-}p3}$ and $V_{p\text{-}p4}$ are limited to a range, either when generated or via an attenuator or other range limiter to be less than a difference between the magnitudes of power supply rails.

Figure 28:
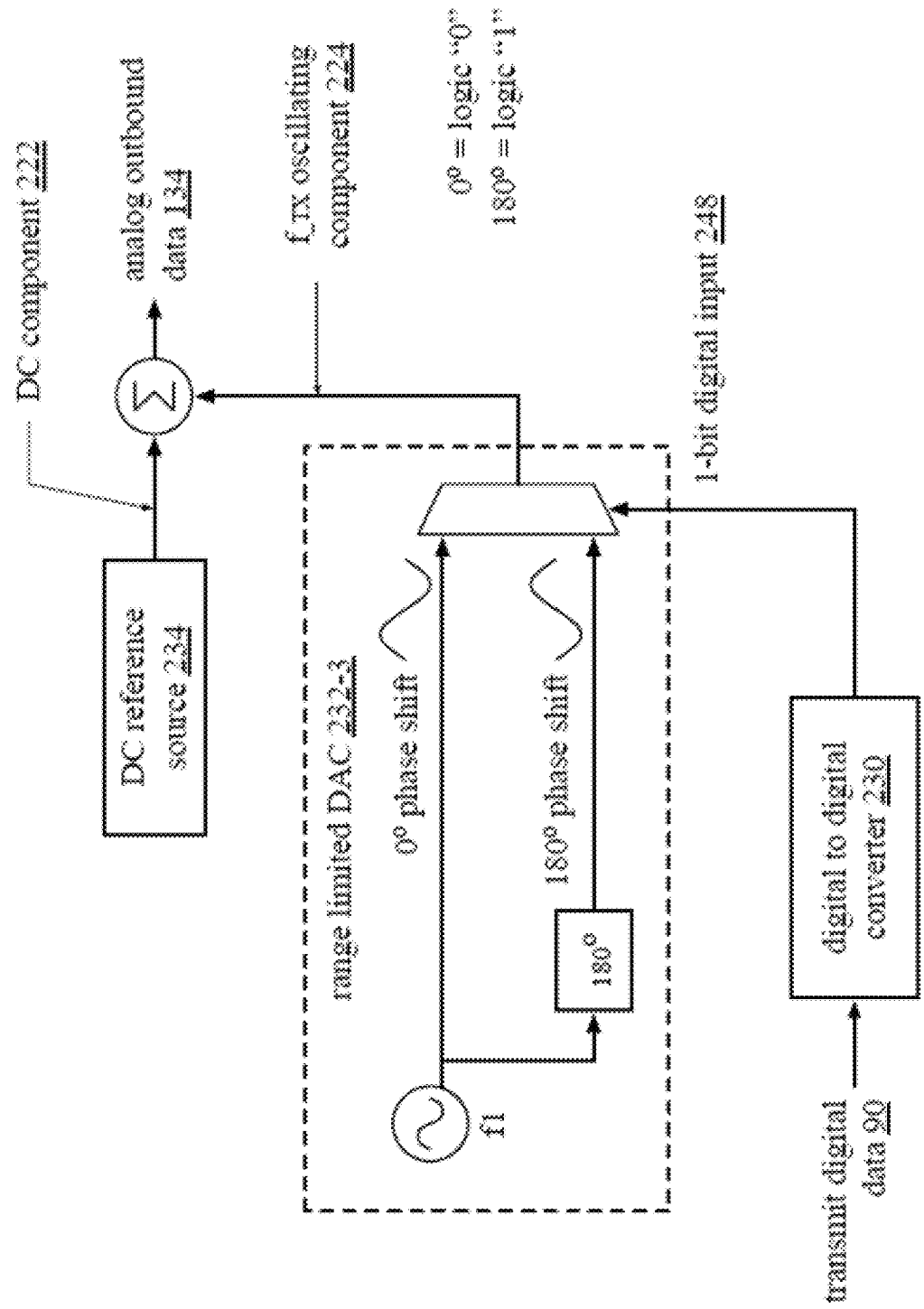
FIG. 28 is a schematic block diagram of an embodiment of a range limited digital-to-analog converter and a digital-to-digital converter of an LVDC in accordance with the present invention.

FIG. 28 is a schematic block diagram of an embodiment of a range limited digital-to-analog converter and a digital-to-digital converter of an LVDC in accordance with the present invention. In particular, the range limited DAC 232-3 is an example of output limited digital to analog converter 232 that, along with other components of a transmit digital to analog circuit 110, operates to convert, transmit digital data 90 into analog outbound data 134.

The range limited DAC 232-3 is a 1-bit digital to analog converter that operates by: generating a first oscillation via a signal generator at a frequency f1 having first oscillation characteristics, such as a 0° phase shift. A second oscillation having second oscillation characteristics, such as a 180° phase shift, is generated by a 180° phase shifter. The range limited DAC 232-3 outputs either the first oscillation or the second oscillation on a bit-by-bit basis under control of a MUX or selector circuit in accordance with the 1-bit digital input 248 that conveys the transmit digital data 90 to produce the oscillating component 224. In the example shown, a 0° phase shift represents a logic "0" of the transmit digital data 90 and a 180° phase shift represents a logic "1" of the transmit digital data 90. The magnitude of the first and second oscillations are limited to a range, either when generated or via an attenuator or other range limiter to be less than a difference between the magnitudes of power supply rails.

Figure 29:
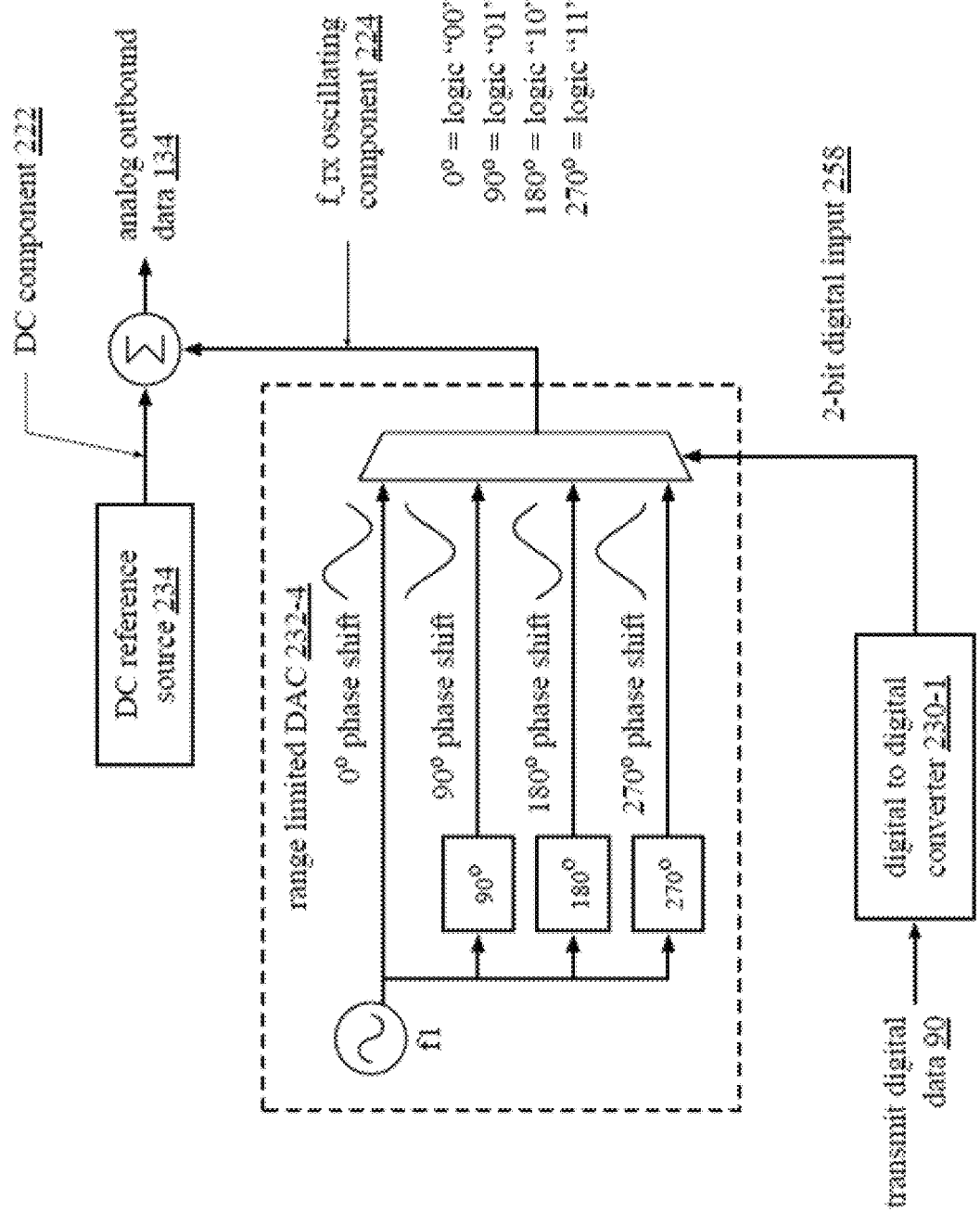
FIG. 29 is a schematic block diagram of an embodiment of a range limited digital-to-analog converter and a digital-to-digital converter of an LVDC in accordance with the present invention.

FIG. 29 is a schematic block diagram of an embodiment of a range limited digital-to-analog converter and a digital-to-digital converter of an LVDC in accordance with the present invention. The range limited DAC 232-4 is an example of output limited digital to analog converter 232 that, along with other components of a transmit digital to analog circuit 110, operates to convert, transmit digital data 90 into analog outbound data 134.

The range limited DAC 232-4 is a 2-bit digital to analog converter (m=2) that operates by: generating a first oscillation via a signal generator at a frequency f1 having first oscillation characteristics, such as a 0° phase shift. A second oscillation having second oscillation characteristics, such as a 90° phase shift, is generated by a 90° phase shifter. A third oscillation having third oscillation characteristics, such as a 180° phase shift, is generated by a 180° phase shifter. A fourth oscillation having fourth oscillation characteristics, such as a 270° phase shift, is generated by a 270° phase shifter. The range limited DAC 232-4 outputs either the first oscillation, the second oscillation, the third oscillation or the fourth oscillation on a 2-bit by 2-bit basis (two bits at a time) under control of the MUX or selector circuit in accordance with the 2-bit digital input 258 that conveys the transmit digital data 90 to produce the oscillating component 224. In the example shown, a 0° phase shift represents a logic "00" of the transmit digital data 90, a 90° phase shift represents a logic "01" of the transmit digital data 90, a 180° phase shift represents a logic "10" of the transmit digital data 90 and a 270° phase shift represents a logic "11" of the transmit digital data 90. The magnitude of the first, second, third and fourth oscillations are limited to a range, either when generated or via an attenuator or other range limiter to be less than a difference between the magnitudes of power supply rails.

Figure 30:
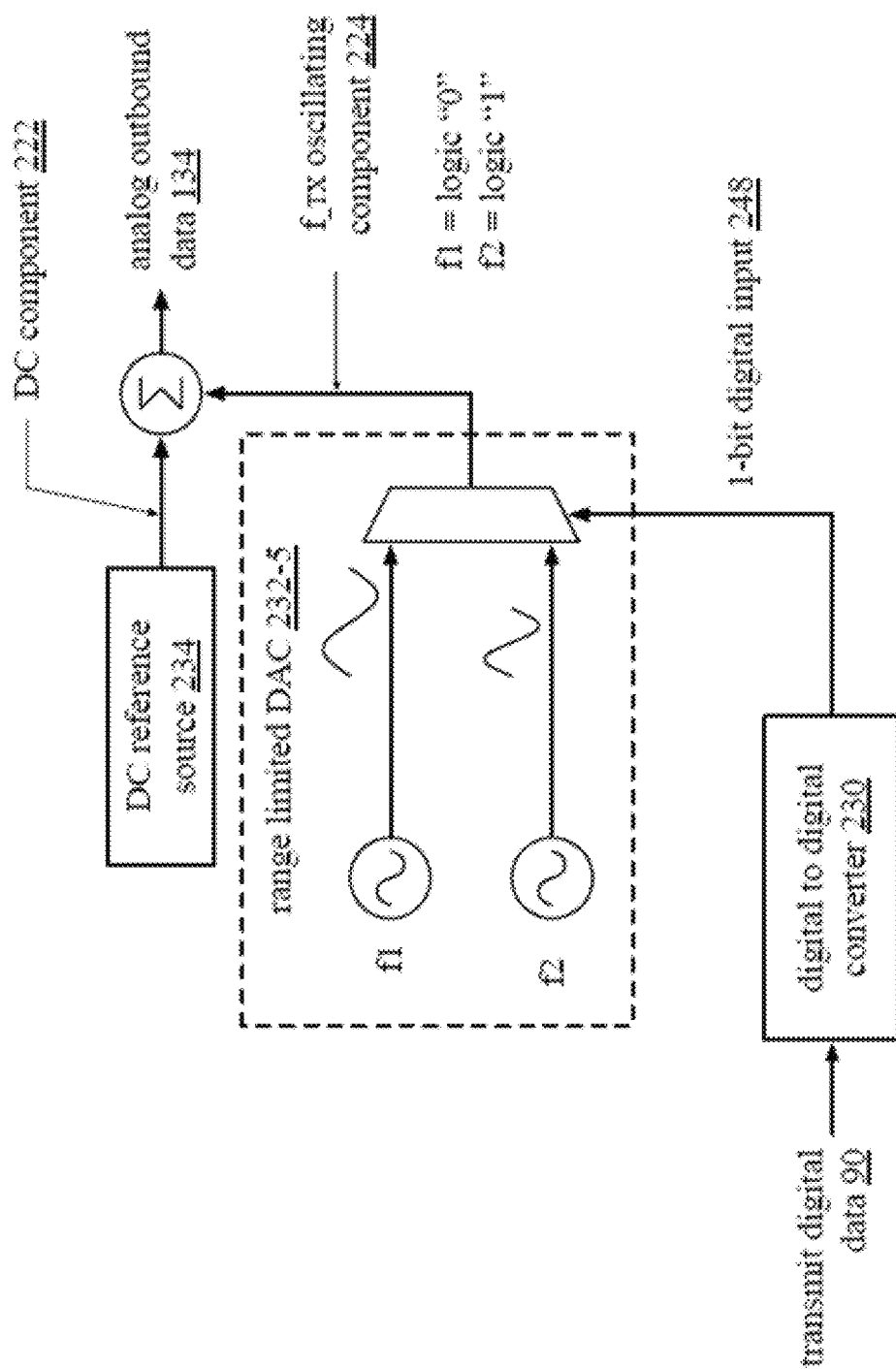
FIG. 30 is a schematic block diagram of an embodiment of a range limited digital-to-analog converter and a digital-to-digital converter of an LVDC in accordance with the present invention.

FIG. 30 is a schematic block diagram of an embodiment of a range limited digital-to-analog converter and a digital-to-digital converter of an LVDC in accordance with the present invention. In particular, the range limited DAC 232-5 is an example of output limited digital to analog converter 232 that, along with other components of a transmit digital to analog circuit 110, operates to convert, transmit digital data 90 into analog outbound data 134.

The range limited DAC 232-5 is a 1-bit digital to analog converter that operates by: generating a first oscillation via a signal generator having first oscillation characteristics, such as frequency f1. A second oscillation having second oscillation characteristics, such as frequency f2 is generated by another signal generator. The range limited DAC 232-5 outputs either the first oscillation or the second oscillation on a bit-by-bit basis under control of a MUX or selector circuit in accordance with the 1-bit digital input 248 that conveys the transmit digital data 90 to produce the oscillating component 224. In the example shown, f1 represents a logic "0" of the transmit digital data 90 and f2 represents a logic "1" of the transmit digital data 90. The magnitude of the first and second oscillations are limited to a range, either when generated or via an attenuator or other range limiter to be less than a difference between the magnitudes of power supply rails.

Figure 31:
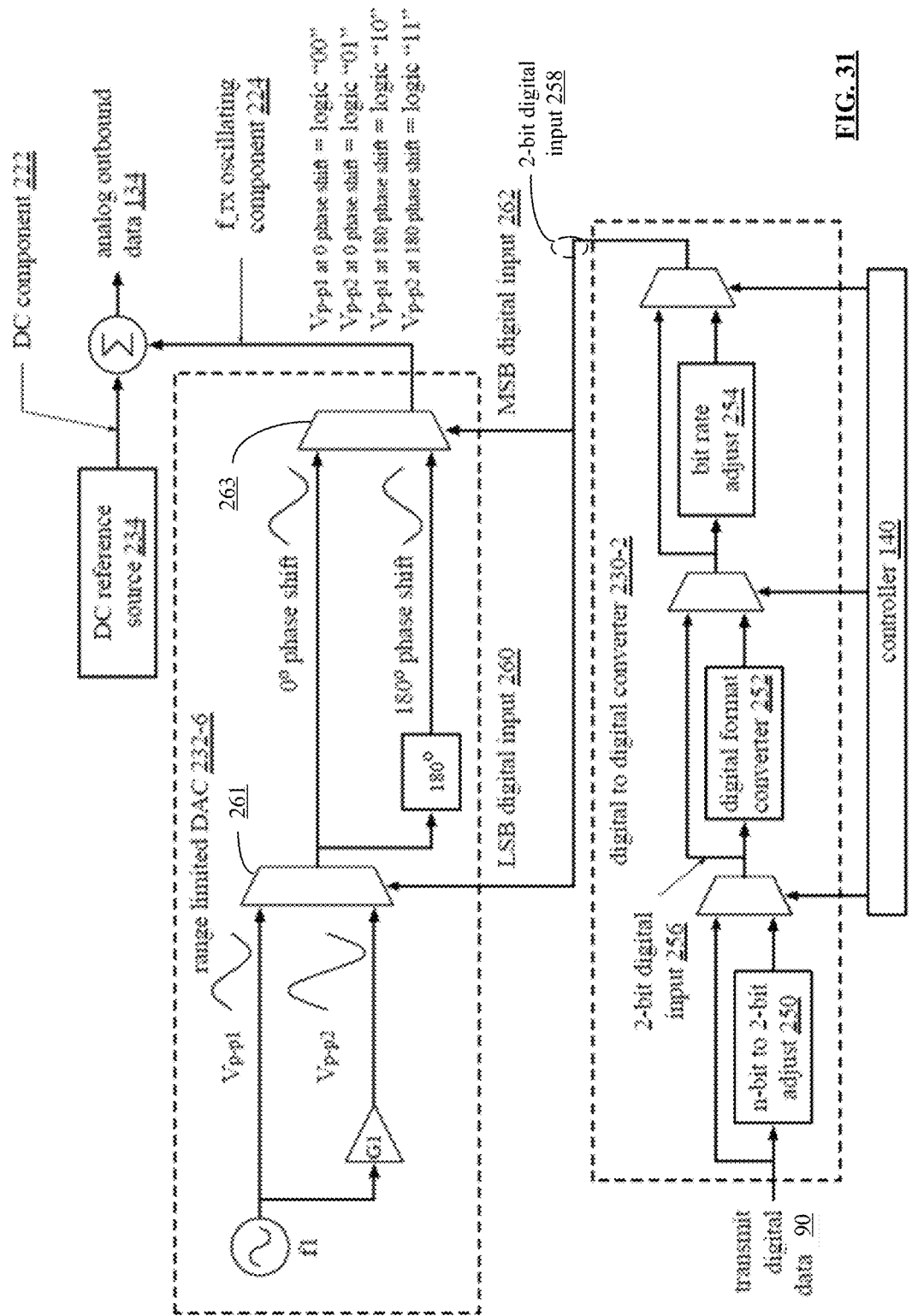
FIG. 31 is a schematic block diagram of an embodiment of a range limited digital-to-analog converter and a digital-to-digital converter of an LVDC in accordance with the present invention.

FIG. 31 is a schematic block diagram of an embodiment of a range limited digital-to-analog converter and a digital-to-digital converter of an LVDC in accordance with the present invention. In particular, the digital to digital converter 230-2 is a further example of digital to digital converter 230 that produces a 2-bit digital input 258. In the example shown, m=2 and the digital input 238 corresponds to a 2-bit digital input 258 that can be separated into least significant bit (LSB) 260 and most significant bit (MSB) 262.

The range limited DAC 232-6 is a 2-bit digital to analog converter and further example of DAC 232 that operates by: generating a first oscillation via a signal generator at a frequency f1 having first oscillation characteristics, such as the peak-to-peak voltage $V_{p\text{-}p1}$. A second oscillation having second oscillation characteristics, such as the peak-to-peak voltage $V_{p\text{-}p2}$, is generated by an amplifier with gain G1. The MUX or other selection circuit 261 outputs, either the first oscillation or the second oscillation under control of a MUX or selector circuit in accordance with the LSB digital input 260.

The range limited DAC 232-6 further operates based on the selection of either the first oscillation or the second oscillation by: passing the selection of either the first oscillation or the second oscillation to the MUX or other selection circuit 263 without a phase shift; and the selection of either the first oscillation or the second oscillation is further modified, such as a via 180° phase shift generated by a 180° phase shifter, and input to the MUX or other selection circuit 263. The range limited DAC 232-6 outputs the selection of either the first oscillation or the second oscillation with either a 0° or 180° phase shift under control of the MUX or selector circuit 263 and in accordance with the MSB digital input 262 to produce the oscillating component 224. In the example shown, a $V_{p\text{-}p1}$ with 0° phase shift represents a logic "00" of the transmit digital data 90, a $V_{p\text{-}p2}$ with 0° phase shift represents a logic "01" of the transmit digital data 90, a $V_{p\text{-}p1}$ with 180° phase shift represents a logic "10" of the transmit digital data 90 and a $V_{p\text{-}p2}$ with 180° phase shift represents a logic "11" of the transmit digital data 90. The magnitude of the any of these oscillating components are limited to a range, either when generated or via an attenuator or other range limiter to be less than a difference between the magnitudes of power supply rails.

Figure 32:
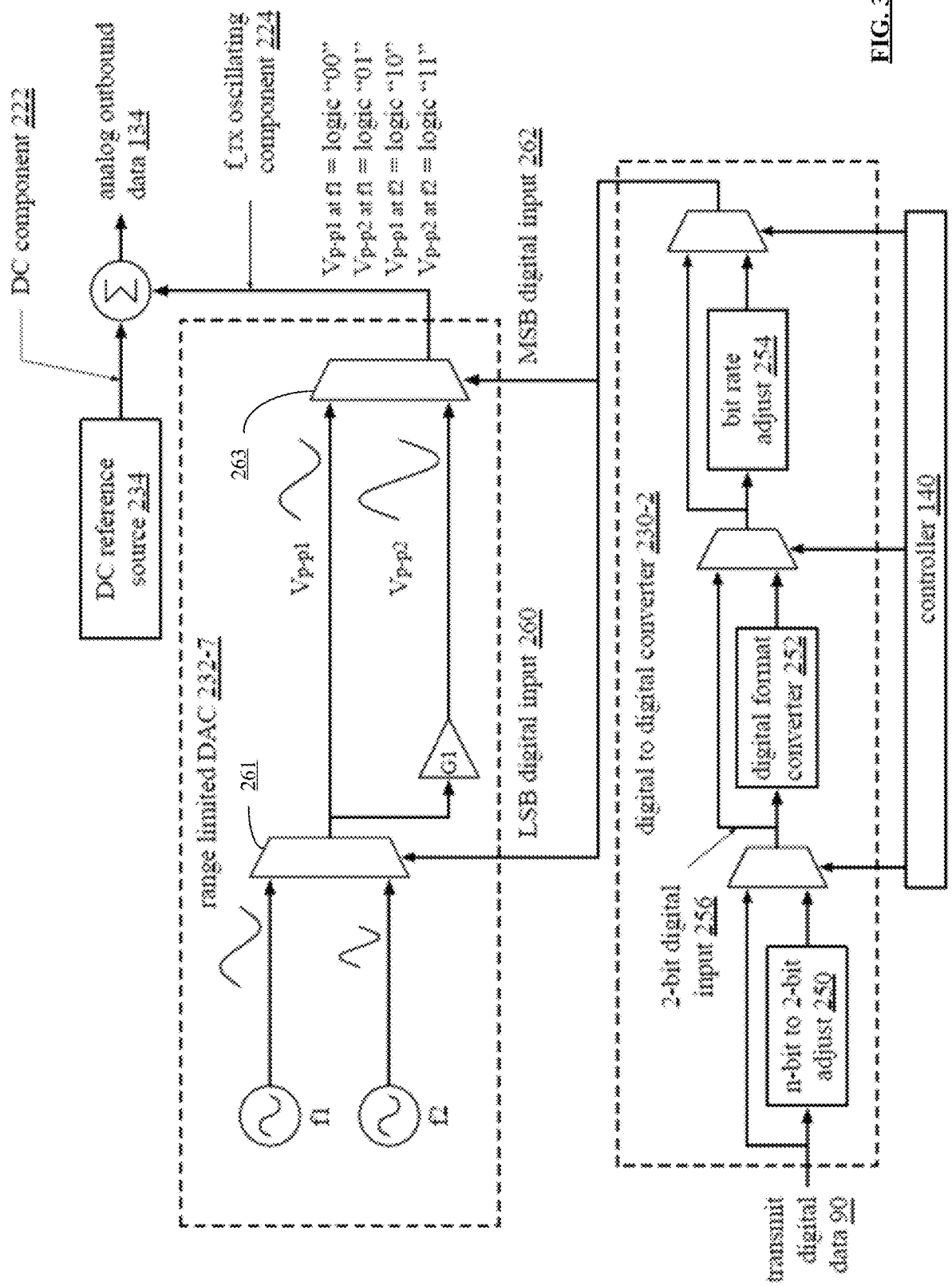
FIG. 32 is a schematic block diagram of an embodiment of a range limited digital-to-analog converter and a digital-to-digital converter of an LVDC in accordance with the present invention.

FIG. 32 is a schematic block diagram of an embodiment of a range limited digital-to-analog converter and a digital-to-digital converter of an LVDC in accordance with the present invention. The range limited DAC 232-7 is a 2-bit digital to analog converter and further example of DAC 232 that operates by generating a first oscillation at a frequency f1 having first oscillation characteristics, such as frequency f1 and the peak-to-peak voltage $V_{p\text{-}p1}$ via a signal generator. A second oscillation having second oscillation characteristics, such as frequency f2 and the peak-to-peak voltage $V_{p\text{-}p1}$, is generated by a second signal generator. The MUX or other selection circuit 261 outputs, either the first oscillation or the second oscillation on under control of a MUX or selector circuit in accordance with the LSB digital input 260.

The range limited DAC 232-7 further operates based on the selection of either the first oscillation or the second oscillation by: passing the selection of either the first oscillation or the second oscillation to the MUX or other selection circuit 263; and the selection of either the first oscillation or the second oscillation is further modified via an amplifier with gain G1 to modify the peak-to-peak voltage to $V_{p\text{-}p2}$ and is input to the MUX or other selection circuit 263. The range limited DAC 232-7 outputs the selection of either the first oscillation or the second oscillation with a peak-to-peak voltage of either $V_{p\text{-}p21}$ or $V_{p\text{-}p2}$ under control of the MUX or selector circuit 263 and in accordance with the MSB digital input 262 to produce the oscillating component 224. In the example shown, a $V_{p\text{-}p1}$ with frequency f1 represents a logic "00" of the transmit digital data 90, a $V_{p\text{-}p2}$ with frequency f1 represents a logic "01" of the transmit digital data 90, a $V_{p\text{-}p1}$ with frequency f2 represents a logic "10" of the transmit digital data 90 and a $V_{p\text{-}p2}$ with frequency f2 represents a logic "11" of the transmit digital data 90. The magnitude of the any of these oscillating components are limited to a range, either when generated or via an attenuator or other range limiter to be less than a difference between the magnitudes of power supply rails.

Figure 33:
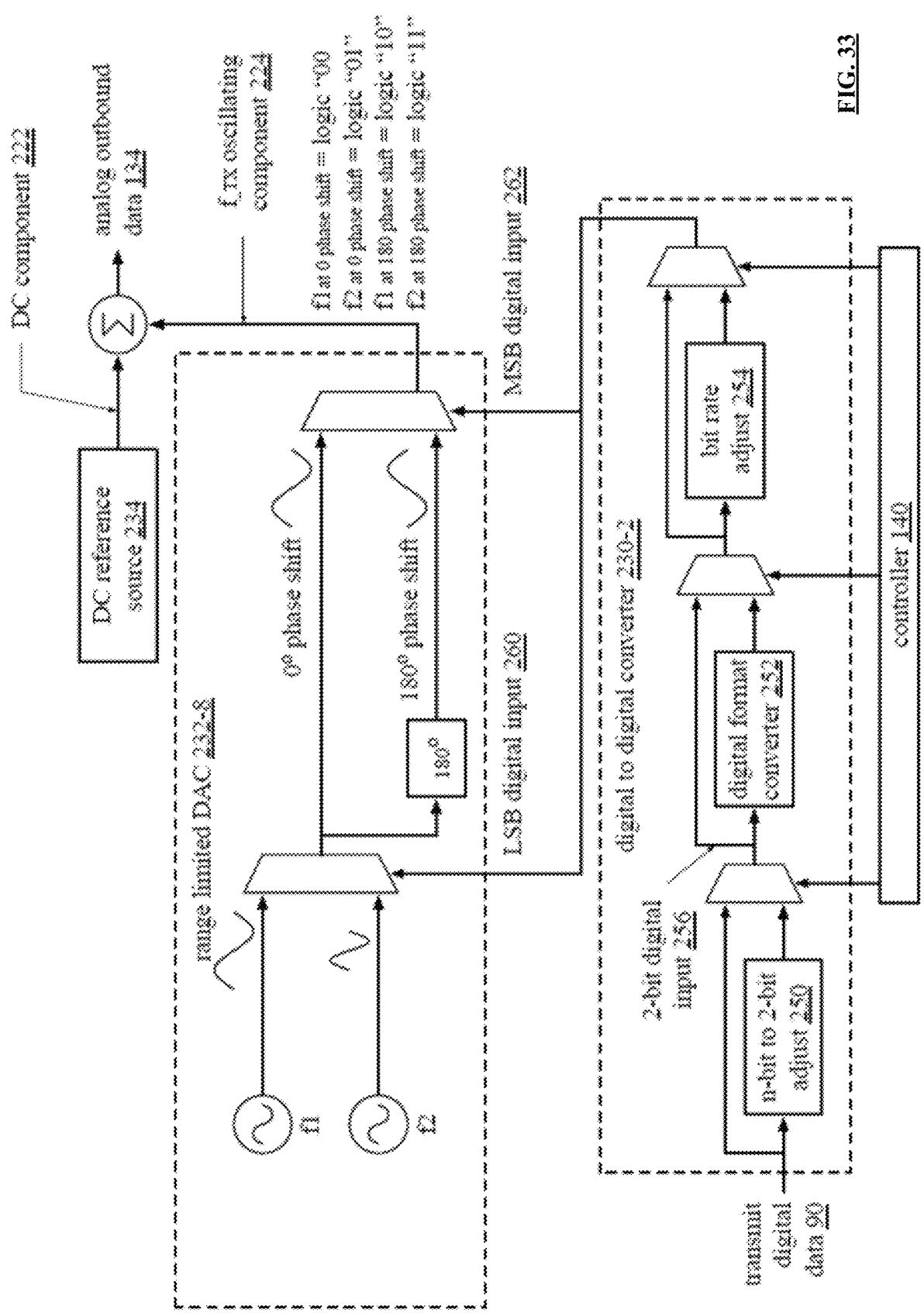
FIG. 33 is a schematic block diagram of an embodiment of a range limited digital-to-analog converter and a digital-to-digital converter of an LVDC in accordance with the present invention.

FIG. 33 is a schematic block diagram of an embodiment of a range limited digital-to-analog converter and a digital-to-digital converter of an LVDC in accordance with the present invention. The range limited DAC 232-8 is a 2-bit digital to analog converter and further example of DAC 232 that operates by generating a first oscillation at a frequency f1 having first oscillation characteristics, such as frequency f1 and the peak-to-peak voltage $V_{p\text{-}p1}$ via a signal generator. A second oscillation having second oscillation characteristics, such as frequency f2 and the peak-to-peak voltage $V_{p\text{-}p1}$, is generated by a second signal generator. The MUX or other selection circuit 261 outputs, either the first oscillation or the second oscillation on under control of a MUX or selector circuit in accordance with the LSB digital input 260.

The range limited DAC 232-8 further operates based on the selection of either the first oscillation or the second oscillation by: passing the selection of either the first oscillation or the second oscillation to the MUX or other selection circuit 263; and the selection of either the first oscillation or the second oscillation, is further modified via a 180° phase shifter and is input to the MUX or other selection circuit 263. The range limited DAC 232-8 outputs the selection of either the first oscillation or the second oscillation with either a 0° phase shift or a 180° phase shift under control of the MUX or selector circuit 263 and in accordance with the MSB digital input 262 to produce the oscillating component 224. In the example shown, a 0° phase shift with frequency f1 represents a logic "00" of the transmit digital data 90, a 0° phase shift with frequency f12 represents a logic "01" of the transmit digital data 90, a 180° phase shift with frequency f1 represents a logic "10" of the transmit digital data 90 and a 180° phase shift with frequency f2 represents a logic "11" of the transmit digital data 90. The magnitude of the any of these oscillating components are limited to a range, either when generated or via an attenuator or other range limiter to be less than a difference between the magnitudes of power supply rails.

Figure 34:
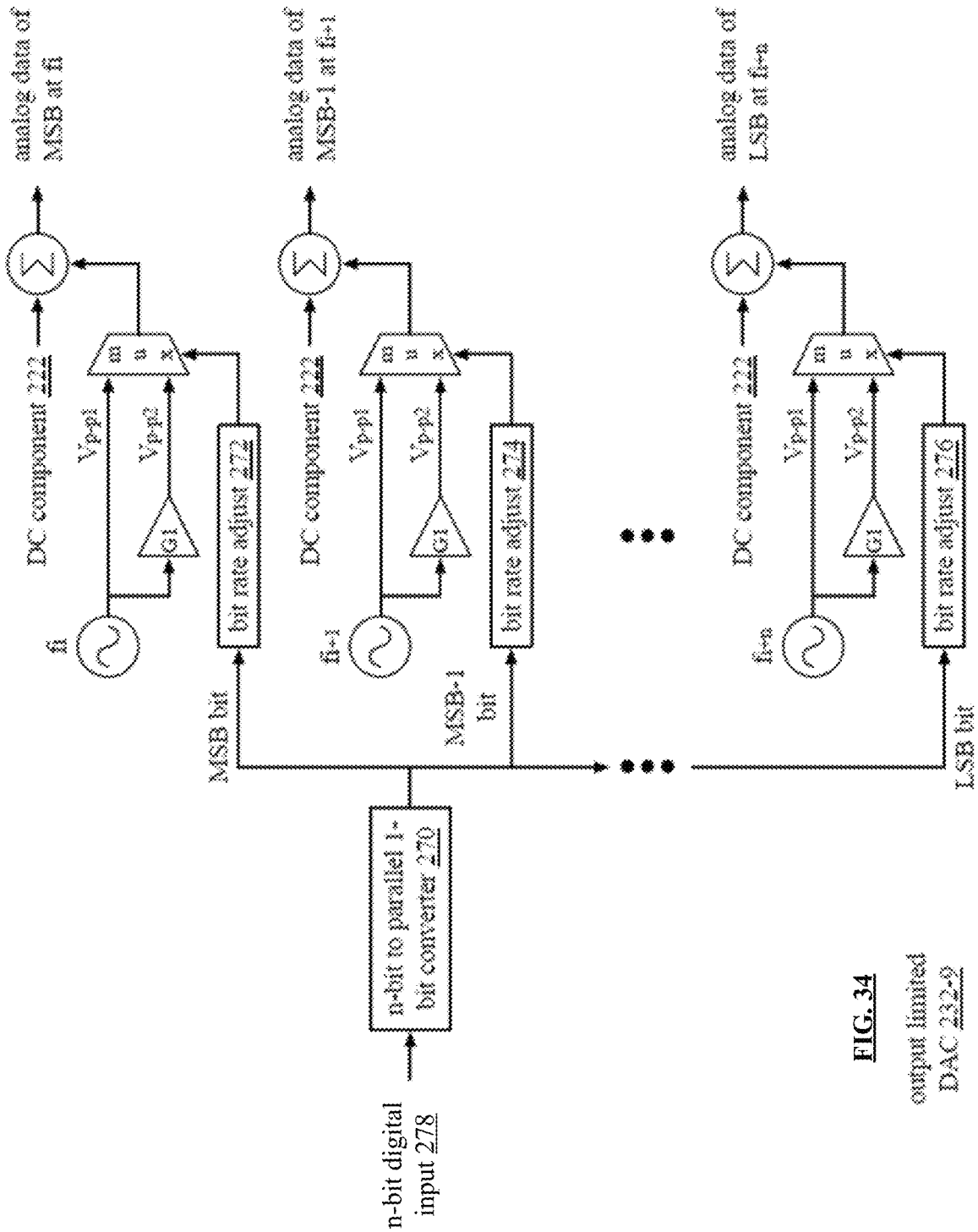
FIG. 34 is a schematic block diagram of an embodiment of a range limited digital-to-analog converter of an LVDC in accordance with the present invention.

FIG. 34 is a schematic block diagram of an embodiment of a range limited digital-to-analog converter of an LVDC in accordance with the present invention. The output limited DAC 232-9 is an n-bit digital to analog converter and further example of DAC 232. The n-bit to parallel 1-bit converter separates a n-bit digital input 278 such as transmit digital data 90 or other n-bit digital input signal into is individual bits from most significant to least significant bits including a MSB bit, a MSB-1 bit, . . . a LSB bit.

The output limited DAC 232-9 operates for the MSB bit by: generating a first oscillation via a signal generator at a frequency fi+1 having first oscillation characteristics, such as the peak-to-peak voltage $V_{p\text{-}p1}$. A second oscillation having second oscillation characteristics, such as the peak-to-peak voltage $V_{p\text{-}p2}$, is generated by an amplifier with gain G1. The range limited DAC 232-9 outputs either the first oscillation or the second oscillation on a bit-by-bit basis under control of a MUX or selector circuit in accordance with the MSB bit of the n-bit digital input 278, at bit rate adjusted by the bit rate adjust circuit 272 to produce a first component of the oscillating component 224. In the example shown, $V_{p\text{-}p1}$ represents a logic "0" of the MSB bit of the n-bit digital input 278 and $V_{p\text{-}p2}$ represents a logic "1" of the MSB bit of the n-bit digital input 278. The magnitude of the first and second oscillations and/or $V_{p\text{-}p1}$ and $V_{p\text{-}p2}$ are limited to a range, either when generated or via an attenuator or other range limiter to be less than a difference between the magnitudes of power supply rails.

The output limited DAC 232-9 operates for the MSB-1 bit by: generating a first oscillation via a signal generator at a frequency fi+1 having first oscillation characteristics, such as the peak-to-peak voltage $V_{p\text{-}p1}$. A second oscillation having second oscillation characteristics, such as the peak-to-peak voltage $V_{p\text{-}p2}$, is generated by an amplifier with gain G1. The range limited DAC 232-9 outputs either the first oscillation or the second oscillation on a bit-by-bit basis under control of a MUX or selector circuit in accordance with the MSB-1 bit of the n-bit digital input 278, at bit rate adjusted by the bit rate adjust circuit 274 to produce a second component of the oscillating component 224. In the example shown, $V_{p\text{-}p1}$ represents a logic "0" of the MSB-1 bit of the n-bit digital input 278 and $V_{p\text{-}p2}$ represents a logic "1" of the MSB-1 bit of the n-bit digital input 278. Again, the magnitude of the first and second oscillations and/or $V_{p\text{-}p1}$ and $V_{p\text{-}p2}$ are limited to a range, either when generated or via an attenuator or other range limiter to be less than a difference between the magnitudes of power supply rails.

And so on for the remaining bits of the n-bit digital input 178. Considering the final bit, the output limited DAC 232-9 operates for the LSB bit by: generating a first oscillation via a signal generator at a frequency fi+n having first oscillation characteristics, such as the peak-to-peak voltage $V_{p\text{-}p1}$. A second oscillation having second oscillation characteristics, such as the peak-to-peak voltage $V_{p\text{-}p2}$, is generated by an amplifier with gain G1. The range limited DAC 232-9 outputs either the first oscillation or the second oscillation on a bit-by-bit basis under control of a MUX or selector circuit in accordance with the LSB bit of the n-bit digital input 278, at bit rate adjusted by the bit rate adjust circuit 276 to produce the nth component of the oscillating component 224. In the example shown, $V_{p-p1}$ represents a logic "0" of the LSB bit of the n-bit digital input 278 and $V_{p-p2}$ represents a logic "1" of the LSB bit of the n-bit digital input 278. Again, the magnitude of the first and second oscillations and/or $V_{p-p1}$ and $V_{p-p2}$ are limited to a range, either when generated or via an attenuator or other range limiter to be less than a difference between the magnitudes of power supply rails. In various embodiments, the bit rate adjust circuits 272, 274 and 276 can be implemented via a look-up table or other circuit.

While the descriptions above have provided several combinations of ASK, PSK and FSK for conversion of transmit digital data 90 into various combinations of m-bit analog outbound data 134 as merely examples, the LVDC 26 can operate via other combinations within the broad scope of the present invention. Furthermore, other modulation techniques and multiple access techniques including QPSK, QAM, orthogonal frequency divisional multiplexing, and time divisional multiplexing can likewise be employed.

While many of the foregoing examples have included an amplifier having a gain such as G1, G2, etc. It should be noted that one or more of these circuit components could be implemented via an attenuation circuit via passive components. In this case, these circuits would have a gain G1 that is less than one.

Figure 35:
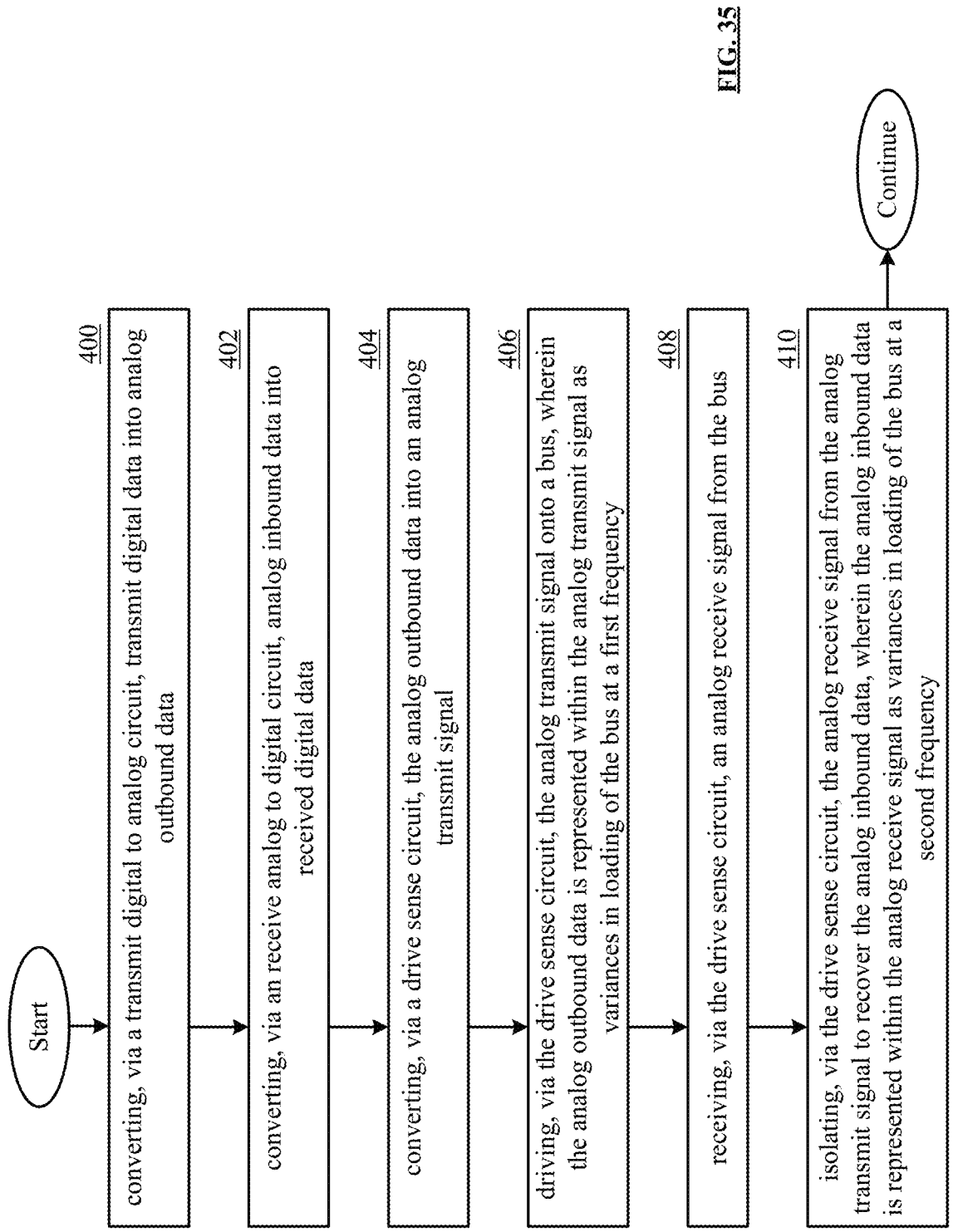
FIG. 35 is a flow diagram of an embodiment of a method in accordance with the present invention.

FIG. 35 is a flow diagram of an embodiment of a method in accordance with the present invention. In particular, a method is presented for use with one or more functions and features described in conjunction with FIGS. 1-34. Step 400 includes converting, via a transmit digital to analog circuit, transmit digital data into analog outbound data. Step 402 includes converting, via an receive analog to digital circuit, analog inbound data into received digital data. Step 404 includes converting, via a drive sense circuit, the analog outbound data into an analog transmit signal. Step 406 includes driving, via the drive sense circuit, the analog transmit signal onto a bus, wherein the analog outbound data is represented within the analog transmit signal as variances in loading of the bus at a first frequency. Step 408 includes receiving, via the drive sense circuit, an analog receive signal from the bus. Step 410 includes isolating, via the drive sense circuit, the analog receive signal from the analog transmit signal to recover the analog inbound data, wherein the analog inbound data is represented within the analog receive signal as variances in loading of the bus at a second frequency.

In various embodiments, the method further includes setting transmit parameters of the transmit digital to analog circuit, wherein the transmit digital to analog circuit converts the transmit digital data into the analog outbound data in accordance with the transmit parameters and/or setting receive parameters of the receive analog to digital circuit, wherein the receive analog to digital circuit converts the analog inbound data into the received digital data in accordance with the receive parameters. The method can also include generating, via a clock circuit, a receive clock signal and a transmit clock signal, wherein the transmit digital to analog circuit converts the transmit digital data into the analog outbound data in accordance with the transmit clock signal and wherein the receive analog to digital circuit converts the analog inbound data into the received digital data in accordance with the receive clock signal and generating a clock control signal, wherein the clock circuit generates the receive clock signal and the transmit clock signal in accordance with the clock control signal.

In various embodiments, the drive sense circuit comprises: a change detection circuit configured to generate the analog inbound data in response to the analog receive signal and the analog outbound data; a regulation circuit configured to generate a regulation signal in response to the analog inbound data; and a power source circuit configured to generate the analog transmit signal in response to the regulation signal. The change detection circuit can include an operational amplifier or a comparator. The power source circuit can include a regulated current source configured to generate the analog transmit signal in response to the regulation signal. The drive sense circuit can include: a change detection circuit configured to generate the analog inbound data in response to the analog receive signal, an analog reference signal and the analog outbound data; a regulation circuit configured to generate a regulation signal in response to the analog inbound data; and a power source circuit configured to generate the analog transmit signal in response to the regulation signal.

Figure 36:
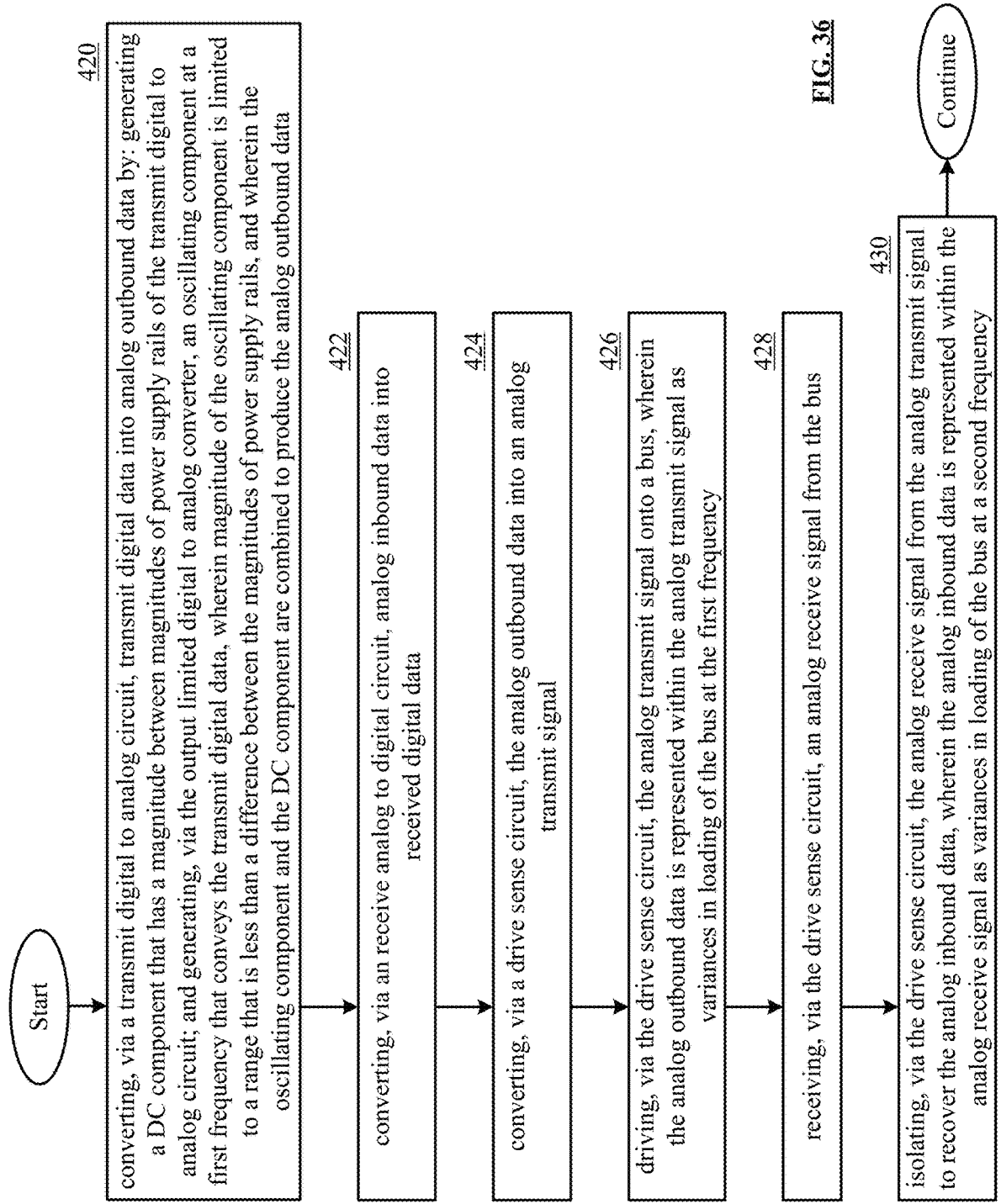
FIG. 36 is a flow diagram of an embodiment of a method in accordance with the present invention.

FIG. 36 is a flow diagram of an embodiment of a method in accordance with the present invention. In particular, a method is presented for use with one or more functions and features described in conjunction with FIGS. 1-35. Step 420 includes converting, via a transmit digital to analog circuit that includes an output limited digital to analog converter, transmit digital data into analog outbound data by: generating a DC component that has a magnitude between magnitudes of power supply rails of the transmit digital to analog circuit; and generating, via the output limited digital to analog converter, an oscillating component at a first frequency that conveys the transmit digital data, wherein magnitude of the oscillating component is limited to a range that is less than a difference between the magnitudes of power supply rails, and wherein the oscillating component and the DC component are combined to produce the analog outbound data. Step 422 includes converting, via an receive analog to digital circuit, analog inbound data into received digital data. Step 424 includes converting, via a drive sense circuit, the analog outbound data into an analog transmit signal. Step 426 includes driving, via the drive sense circuit, the analog transmit signal onto a bus, wherein the analog outbound data is represented within the analog transmit signal as variances in loading of the bus at the first frequency. Step 428 includes receiving, via the drive sense circuit, an analog receive signal from the bus. Step 430 includes isolating, via the drive sense circuit, the analog receive signal from the analog transmit signal to recover the analog inbound data, wherein the analog inbound data is represented within the analog receive signal as variances in loading of the bus at a second frequency.

In various embodiments, the method can further include: setting transmit parameters of the transmit digital to analog circuit, wherein the transmit digital to analog circuit converts the transmit digital data into the analog outbound data in accordance with the transmit parameters; setting receive parameters of the receive analog to digital circuit, wherein the receive analog to digital circuit converts the analog inbound data into the received digital data in accordance with the receive parameters; generating, via a clock circuit, a receive clock signal and a transmit clock signal, wherein the transmit digital to analog circuit converts the transmit digital data into the analog outbound data in accordance with the transmit clock signal and wherein the receive analog to digital circuit converts the analog inbound data into the received digital data in accordance with the receive clock signal; generating a clock control signal, wherein the clock circuit generates the receive clock signal and the transmit clock signal in accordance with the clock control signal.

In various embodiments, the drive sense circuit comprises: a change detection circuit configured to generate the analog inbound data in response to the analog receive signal and the analog outbound data; a regulation circuit configured to generate a regulation signal in response to the analog inbound data; and a power source circuit configured to generate the analog transmit signal in response to the regulation signal. The change detection circuit can include an operational amplifier or a comparator. The power source circuit can include a regulated current source configured to generate the analog transmit signal in response to the regulation signal.

In various embodiments, the oscillating component at the first frequency conveys the transmit digital data via an amplitude shift keying or a phase shift keying.

Figure 37:
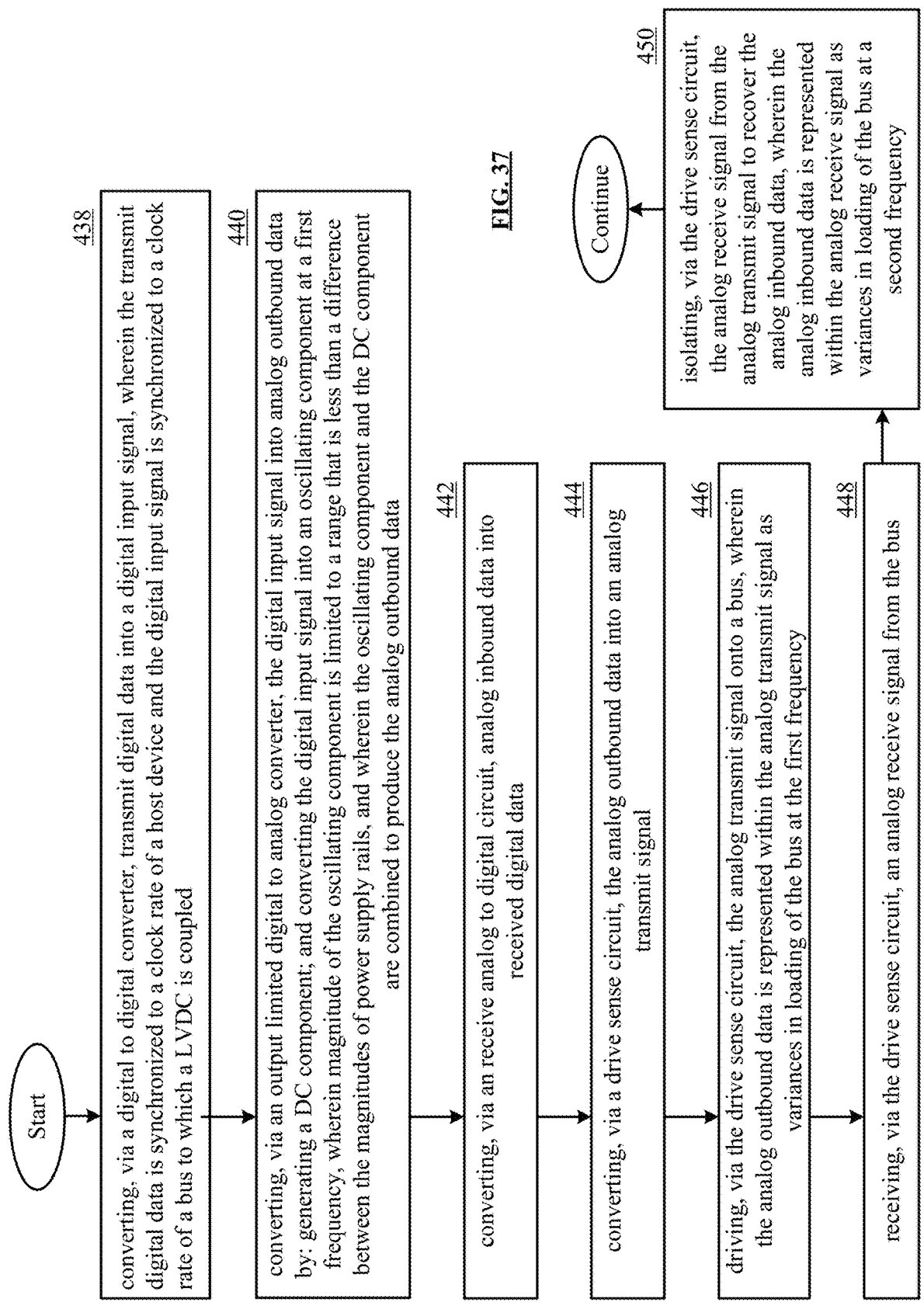
FIG. 37 is a flow diagram of an embodiment of a method in accordance with the present invention.

FIG. 37 is a flow diagram of an embodiment of a method in accordance with the present invention. In particular, a method is presented for use with one or more functions and features described in conjunction with FIGS. 1-36. Step 438 includes converting, via a digital to digital converter, transmit digital data into a digital input signal, wherein the transmit digital data is synchronized to a clock rate of a host device and the digital input signal is synchronized to a clock rate of a bus to which a LVDC is coupled. Step 440 includes converting, via an output limited digital to analog converter, the digital input signal into analog outbound data by: generating a DC component; and converting the digital input signal into an oscillating component at a first frequency, wherein magnitude of the oscillating component is limited to a range that is less than a difference between the magnitudes of power supply rails, and wherein the oscillating component and the DC component are combined to produce the analog outbound data.

Step 442 includes converting, via an receive analog to digital circuit, analog inbound data into received digital data. Step 444 includes converting, via a drive sense circuit, the analog outbound data into an analog transmit signal. Step 446 includes driving, via the drive sense circuit, the analog transmit signal onto a bus, wherein the analog outbound data is represented within the analog transmit signal as variances in loading of the bus at the first frequency. Step 448 includes receiving, via the drive sense circuit, an analog receive signal from the bus. Step 450 includes isolating, via the drive sense circuit, the analog receive signal from the analog transmit signal to recover the analog inbound data, wherein the analog inbound data is represented within the analog receive signal as variances in loading of the bus at a second frequency.

Figure 38:
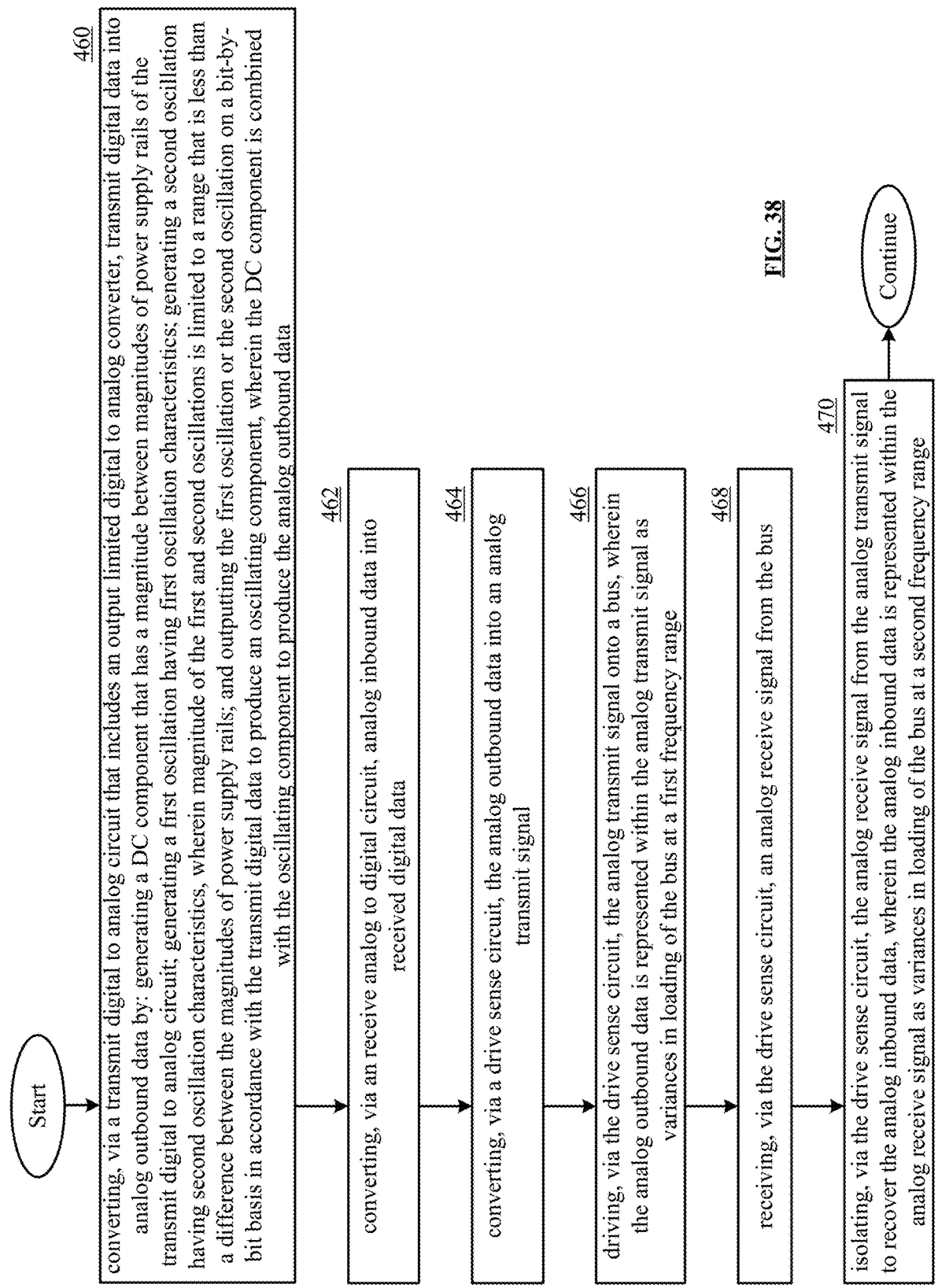
FIG. 38 is a flow diagram of an embodiment of a method in accordance with the present invention.

FIG. 38 is a flow diagram of an embodiment of a method in accordance with the present invention. In particular, a method is presented for use with one or more functions and features described in conjunction with FIGS. 1-37. Step 460 includes converting, via a transmit digital to analog circuit that includes an output limited digital to analog converter, transmit digital data into analog outbound data by: generating a DC component that has a magnitude between magnitudes of power supply rails of the transmit digital to analog circuit; generating a first oscillation having first oscillation characteristics; generating a second oscillation having second oscillation characteristics, wherein magnitude of the first and second oscillations is limited to a range that is less than a difference between the magnitudes of power supply rails; and outputting the first oscillation or the second oscillation on a bit-by-bit basis in accordance with the transmit digital data to produce an oscillating component, wherein the DC component is combined with the oscillating component to produce the analog outbound data.

Step 462 includes converting, via an receive analog to digital circuit, analog inbound data into received digital data. Step 464 includes converting, via a drive sense circuit, the analog outbound data into an analog transmit signal. Step 466 includes driving, via the drive sense circuit, the analog transmit signal onto a bus, wherein the analog outbound data is represented within the analog transmit signal as variances in loading of the bus in a first frequency range. Step 468 includes receiving, via the drive sense circuit, an analog receive signal from the bus. Step 470 includes isolating, via the drive sense circuit, the analog receive signal from the analog transmit signal to recover the analog inbound data, wherein the analog inbound data is represented within the analog receive signal as variances in loading of the bus in a second frequency range.

Figure 39:
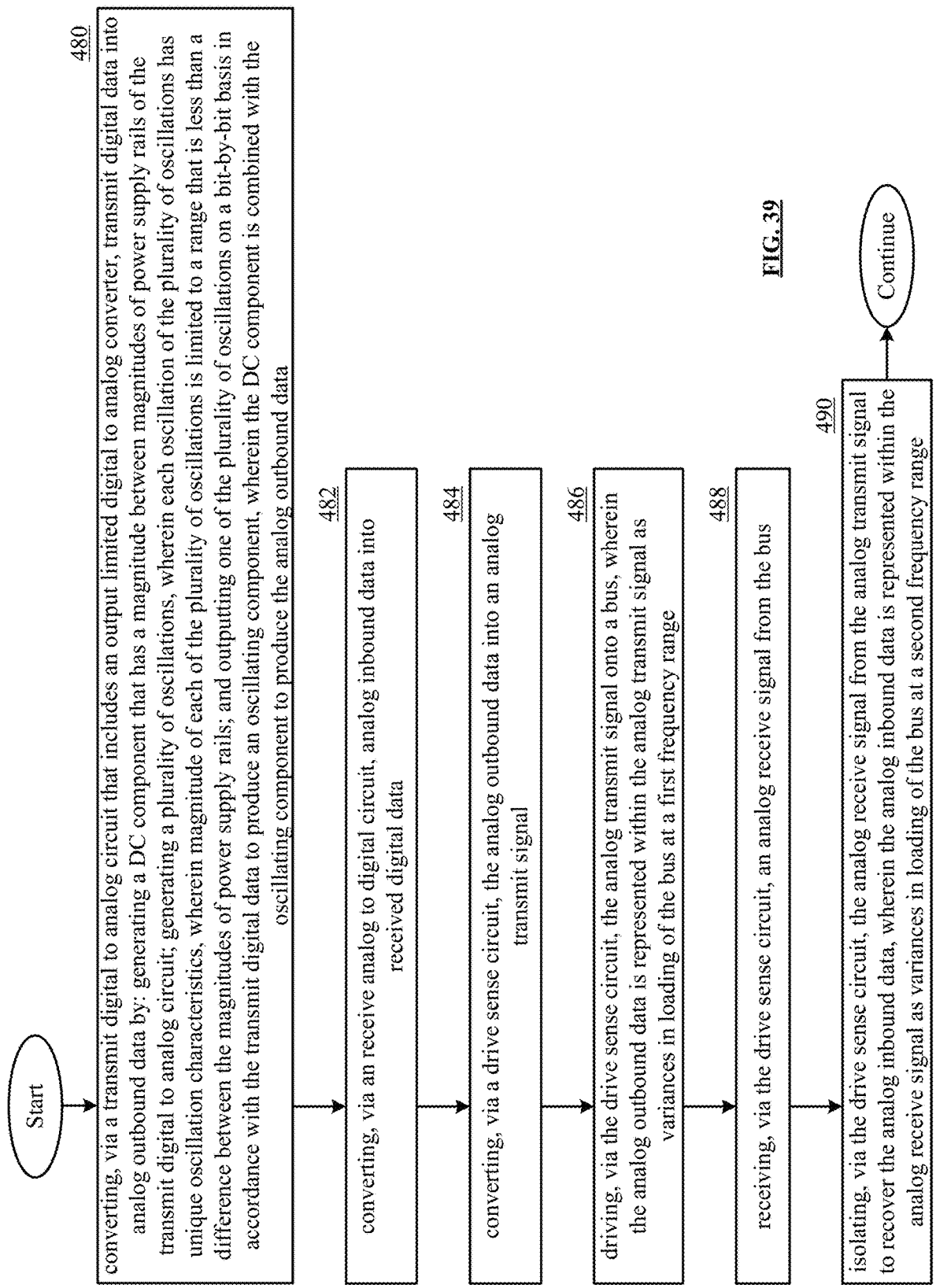
FIG. 39 is a flow diagram of an embodiment of a method in accordance with the present invention.

FIG. 39 is a flow diagram of an embodiment of a method in accordance with the present invention. In particular, a method is presented for use with one or more functions and features described in conjunction with FIGS. 1-38. Step 480 includes converting, via a transmit digital to analog circuit that includes an output limited digital to analog converter, transmit digital data into analog outbound data by: generating a DC component that has a magnitude between magnitudes of power supply rails of the transmit digital to analog circuit; generating a plurality of oscillations, wherein each oscillation of the plurality of oscillations has unique oscillation characteristics, wherein magnitude of each of the plurality of oscillations is limited to a range that is less than a difference between the magnitudes of power supply rails; and outputting one of the plurality of oscillations on a bit-by-bit basis in accordance with the transmit digital data to produce an oscillating component, wherein the DC component is combined with the oscillating component to produce the analog outbound data.

Step 482 includes converting, via an receive analog to digital circuit, analog inbound data into received digital data. Step 484 includes converting, via a drive sense circuit, the analog outbound data into an analog transmit signal. Step 486 includes driving, via the drive sense circuit, the analog transmit signal onto a bus, wherein the analog outbound data is represented within the analog transmit signal as variances in loading of the bus in a first frequency range. Step 488 includes receiving, via the drive sense circuit, an analog receive signal from the bus. Step 490 includes isolating, via the drive sense circuit, the analog receive signal from the analog transmit signal to recover the analog inbound data, wherein the analog inbound data is represented within the analog receive signal as variances in loading of the bus in a second frequency range.

Figure 40:
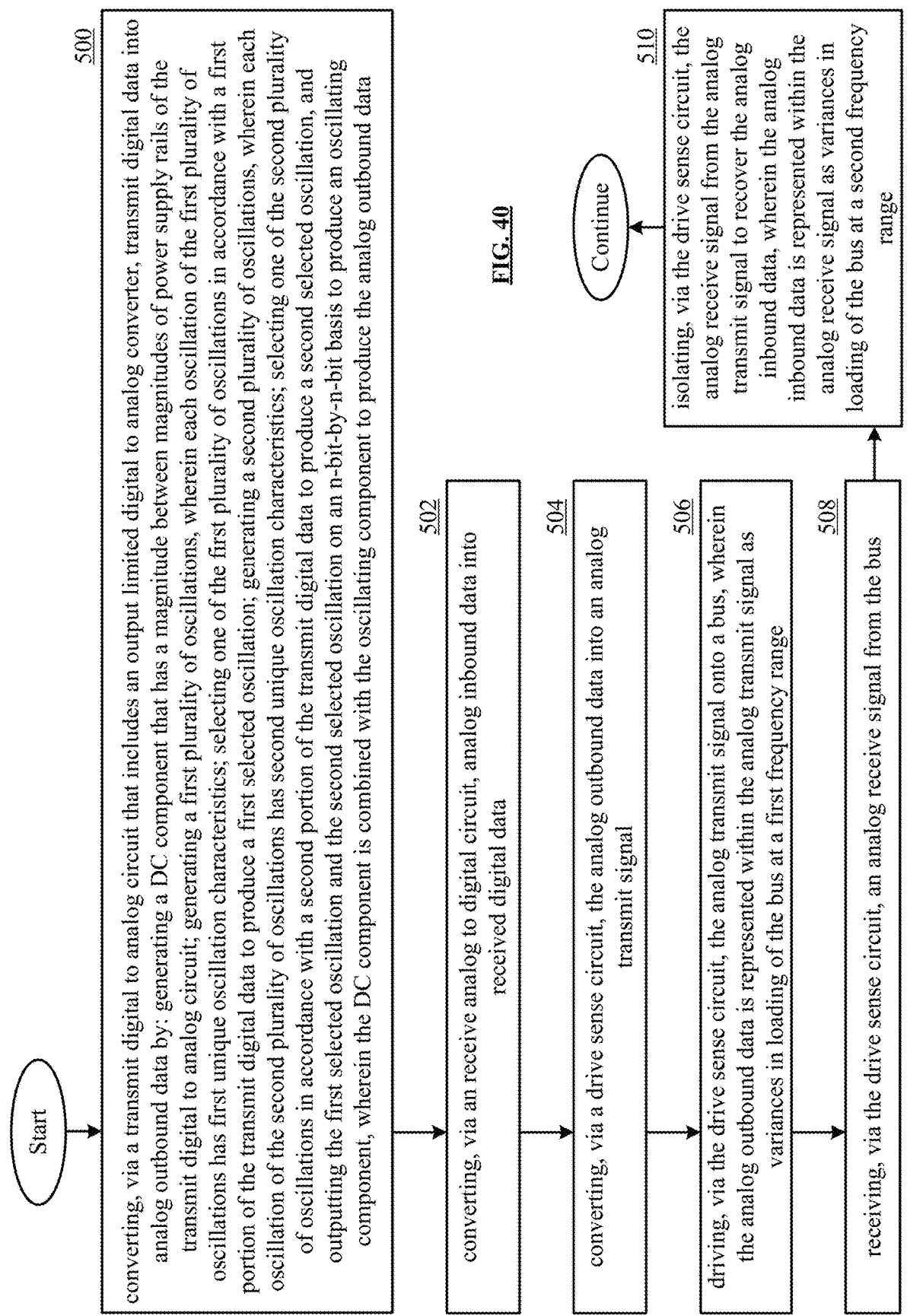
FIG. 40 is a flow diagram of an embodiment of a method in accordance with the present invention.

FIG. 40 is a flow diagram of an embodiment of a method in accordance with the present invention. In particular, a method is presented for use with one or more functions and features described in conjunction with FIGS. 1-39. Step 500 includes converting, via a transmit digital to analog circuit that includes an output limited digital to analog converter, transmit digital data into analog outbound data by: generating a DC component that has a magnitude between magnitudes of power supply rails of the transmit digital to analog circuit; a first plurality of oscillations, wherein each oscillation of the first plurality of oscillations has first unique oscillation characteristics; selecting one of the first plurality of oscillations in accordance with a first portion of the transmit digital data to produce a first selected oscillation; generating a second plurality of oscillations, wherein each oscillation of the second plurality of oscillations has second unique oscillation characteristics; selecting one of the second plurality of oscillations in accordance with a second portion of the transmit digital data to produce a second selected oscillation, and outputting the first selected oscillation and the second selected oscillation on an n-bit-by-n-bit basis to produce an oscillating component, wherein the DC component is combined with the oscillating component to produce the analog outbound data.

Step 502 includes converting, via an receive analog to digital circuit, analog inbound data into received digital data. Step 504 includes converting, via a drive sense circuit, the analog outbound data into an analog transmit signal. Step 506 includes driving, via the drive sense circuit, the analog transmit signal onto a bus, wherein the analog outbound data is represented within the analog transmit signal as variances in loading of the bus in a first frequency range. Step 508 includes receiving, via the drive sense circuit, an analog receive signal from the bus. Step 510 includes isolating, via the drive sense circuit, the analog receive signal from the analog transmit signal to recover the analog inbound data, wherein the analog inbound data is represented within the analog receive signal as variances in loading of the bus in a second frequency range.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A low voltage drive circuit (LVDC) comprises:
   a transmit digital to analog circuit configured to convert transmit digital data into analog outbound data by:
   generating a DC component that has a magnitude between magnitudes of power supply rails of the transmit digital to analog circuit; and
   generating, via an output limited digital to analog converter, a first plurality of oscillations, wherein each oscillation of the first plurality of oscillations has first unique oscillation characteristics; selecting one of the first plurality of oscillations in accordance with a first portion of the transmit digital data to produce a first selected oscillation; generating a second plurality of oscillations, wherein each oscillation of the second plurality of oscillations has second unique oscillation characteristics; selecting one of the second plurality of oscillations in accordance with a second portion of the transmit digital data to produce a second selected oscillation, and outputting the first selected oscillation and the second selected oscillation on an n-bit-by-n-bit basis to produce an oscillating component, wherein the DC component is combined with the oscillating component to produce the analog outbound data;

a receive analog to digital circuit configured to convert analog inbound data into received digital data; and
a drive sense circuit configured to:
convert the analog outbound data into an analog transmit signal;
drive the analog transmit signal onto a bus, wherein the analog outbound data is represented within the analog transmit signal as variances in loading of the bus in a first frequency range;
receive an analog receive signal from the bus; and
isolate the analog receive signal from the analog transmit signal to recover the analog inbound data, wherein the analog inbound data is represented within the analog receive signal as variances in loading of the bus in a second frequency range.

2. The LVDC of claim 1 further comprises:
a controller configured to set transmit parameters of the transmit digital to analog circuit, wherein the transmit digital to analog circuit converts the transmit digital data into the analog outbound data in accordance with the transmit parameters.

3. The LVDC of claim 2, wherein the controller is further configured to set receive parameters of the receive analog to digital circuit, wherein the receive analog to digital circuit converts the analog inbound data into the received digital data in accordance with the receive parameters.

4. The LVDC of claim 1 further comprises:
a clock circuit configured to generate a receive clock signal and a transmit clock signal, wherein the transmit digital to analog circuit converts the transmit digital data into the analog outbound data in accordance with the transmit clock signal and wherein the receive analog to digital circuit converts the analog inbound data into the received digital data in accordance with the receive clock signal.

5. The LVDC of claim 4 further comprises:
a controller configured to generate a clock control signal;
wherein the clock circuit generates the receive clock signal and the transmit clock signal in accordance with the clock control signal.

6. The LVDC of claim 1, wherein the drive sense circuit comprises:
a change detection circuit configured to generate the analog inbound data in response to the analog receive signal and the analog outbound data;
a regulation circuit configured to generate a regulation signal in response to the analog inbound data; and
a power source circuit configured to generate the analog transmit signal in response to the regulation signal.

7. The LVDC of claim 6, wherein the change detection circuit includes an operational amplifier or a comparator.

8. The LVDC of claim 6, wherein the power source circuit includes a regulated current source configured to generate the analog transmit signal in response to the regulation signal.

9. The LVDC of claim 1, wherein the first unique oscillation characteristics include unique amplitudes, phases or frequencies.

10. The LVDC of claim 9, wherein the second unique oscillation characteristics include unique amplitudes, phases or frequencies.

11. A method comprises:
converting, via a transmit digital to analog circuit, transmit digital data into analog outbound data by:
generating a DC component that has a magnitude between magnitudes of power supply rails of the transmit digital to analog circuit; and
generating, via an output limited digital to analog converter, a first plurality of oscillations, wherein each oscillation of the first plurality of oscillations has first unique oscillation characteristics; selecting one of the first plurality of oscillations in accordance with a first portion of the transmit digital data to produce a first selected oscillation; generating a second plurality of oscillations, wherein each oscillation of the second plurality of oscillations has second unique oscillation characteristics; selecting one of the second plurality of oscillations in accordance with a second portion of the transmit digital data to produce a second selected oscillation, and outputting the first selected oscillation and the second selected oscillation on an n-bit-by-n-bit basis to produce an oscillating component, wherein the DC component is combined with the oscillating component to produce the analog outbound data;
converting, via an receive analog to digital circuit, analog inbound data into received digital data; and
converting, via a drive sense circuit, the analog outbound data into an analog transmit signal;
driving, via the drive sense circuit, the analog transmit signal onto a bus, wherein the analog outbound data is represented within the analog transmit signal as variances in loading of the bus in a first frequency range;
receiving, via the drive sense circuit, an analog receive signal from the bus; and
isolating, via the drive sense circuit, the analog receive signal from the analog transmit signal to recover the analog inbound data, wherein the analog inbound data is represented within the analog receive signal as variances in loading of the bus in a second frequency range.

12. The method of claim 11 further comprises:
setting transmit parameters of the transmit digital to analog circuit, wherein the transmit digital to analog circuit converts the transmit digital data into the analog outbound data in accordance with the transmit parameters.

13. The method of claim 11 further comprises:
setting receive parameters of the receive analog to digital circuit, wherein the receive analog to digital circuit converts the analog inbound data into the received digital data in accordance with the receive parameters.

14. The method of claim 11 further comprises:
generating, via a clock circuit, a receive clock signal and a transmit clock signal, wherein the transmit digital to analog circuit converts the transmit digital data into the analog outbound data in accordance with the transmit clock signal and wherein the receive analog to digital circuit converts the analog inbound data into the received digital data in accordance with the receive clock signal.

15. The method of claim 14 further comprises:
generating a clock control signal;
wherein the clock circuit generates the receive clock signal and the transmit clock signal in accordance with the clock control signal.

16. The method of claim 11, wherein the drive sense circuit comprises:
a change detection circuit configured to generate the analog inbound data in response to the analog receive signal and the analog outbound data;
a regulation circuit configured to generate a regulation signal in response to the analog inbound data; and a power source circuit configured to generate the analog transmit signal in response to the regulation signal.

17. The method of claim 16, wherein the change detection circuit includes an operational amplifier or a comparator.

18. The method of claim 16, wherein the power source circuit includes a regulated current source configured to generate the analog transmit signal in response to the regulation signal.

19. The method of claim 11, wherein the first unique oscillation characteristics include unique amplitudes, phases or frequencies.

20. The method of claim 11, wherein the second unique oscillation characteristics include unique amplitudes, phases or frequencies.

* * * * *